(12) United States Patent
Ishii et al.

(10) Patent No.: US 7,369,075 B2
(45) Date of Patent: May 6, 2008

(54) OUTPUT CIRCUIT, DIGITAL/ANALOG CIRCUIT AND DISPLAY APPARATUS

(75) Inventors: Junichirou Ishii, Tokyo (JP); Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/300,387

(22) Filed: Dec. 15, 2005

(65) Prior Publication Data

US 2006/0132344 A1 Jun. 22, 2006

(30) Foreign Application Priority Data

Dec. 16, 2004 (JP) ............................. 2004-364953
Mar. 28, 2005 (JP) ............................. 2005-092651

(51) Int. Cl.
*H03M 1/66* (2006.01)

(52) U.S. Cl. ...................... 341/144; 341/145; 341/153; 341/154; 348/89; 348/90; 348/98; 348/100

(58) Field of Classification Search ........ 341/144–145, 341/153–154
See application file for complete search history.

(56) References Cited

U.S. PATENT DOCUMENTS

| | | | |
|---|---|---|---|
| 5,396,245 A | 3/1995 | Rempfer | |
| 5,859,606 A * | 1/1999 | Schrader et al. ............ | 341/144 |
| 5,877,717 A * | 3/1999 | Tu et al. ..................... | 341/150 |
| 5,945,935 A | 8/1999 | Kusumoto et al. | |
| 6,118,421 A * | 9/2000 | Kawaguchi et al. .......... | 345/89 |
| 6,225,931 B1 * | 5/2001 | Rao et al. .................... | 341/144 |
| 6,246,351 B1 | 6/2001 | Yilmaz | |
| 6,326,913 B1 * | 12/2001 | Chao et al. ................. | 341/144 |
| 6,441,763 B1 * | 8/2002 | Nakao ......................... | 341/154 |
| 6,535,189 B1 | 3/2003 | Akiyama et al. | |
| 6,697,005 B2 * | 2/2004 | Mulder ....................... | 341/154 |
| 6,707,404 B1 * | 3/2004 | Yilmaz ....................... | 341/120 |
| 6,822,599 B2 | 11/2004 | Yoshioka et al. | |
| 6,937,178 B1 * | 8/2005 | Rempfer et al. ............. | 341/154 |
| 6,956,554 B2 * | 10/2005 | Chen et al. .................. | 345/98 |
| 6,963,325 B2 * | 11/2005 | Yano et al. .................. | 345/94 |
| 6,970,122 B1 * | 11/2005 | Yilmaz et al. .............. | 341/145 |
| 2006/0214900 A1 * | 9/2006 | Tsuchi et al. ................ | 345/98 |

FOREIGN PATENT DOCUMENTS

| | | |
|---|---|---|
| JP | 61-248619 | 11/1986 |
| JP | 62-236211 | 10/1987 |

(Continued)

*Primary Examiner*—Khai M. Nguyen
(74) *Attorney, Agent, or Firm*—Foley & Lardner LLP

(57) ABSTRACT

An output circuit, a digital/analog conversion circuit and a display apparatus can reduce the number of required input voltages and the number of transistors to save the necessary area. The output circuit and the digital/analog conversion circuit comprise a selection circuit for receiving as input a plurality of (m) reference voltages having mutually different respective voltage values, selecting two of the voltages according to a selection signal and outputting them and an amplifier circuit for receiving as input the voltages output from the selection circuit at two input terminals T1, T2 and outputting the voltage obtained by interpolating the voltage difference of the two input terminal voltages V(T1), V(T2) to a predetermined ratio. It may alternatively be so arranged that the selection circuit sequentially outputs the selected two voltages and the amplifier circuit sequentially receives as two input the two voltages and outputs the output voltage obtained by interpolation.

66 Claims, 33 Drawing Sheets

FOREIGN PATENT DOCUMENTS

| | | |
|---|---|---|
| JP | 05-307368 | 11/1993 |
| JP | 10-209869 | 8/1998 |
| JP | 2001-034234 A | 2/2001 |
| JP | 2003-045181 A | 2/2003 |
| JP | 2004-194201 A | 7/2004 |

\* cited by examiner

AMPLIFIER CIRCUIT 13: INTERPOLATION OF VOLTAGES T1, T2 TO RATIO OF 1 : 2

AMPLIFIER CIRCUIT 13: INTERPOLATION OF VOLTAGES T1, T2 TO RATIO OF 2 : 1

| LEVEL | INPUT VOLTAGE | V(T1) | V(T2) | D1 | D0 |
|---|---|---|---|---|---|
| 1 | A | A | A | 0 | 0 |
| 2 |   | A | B | 0 | 1 |
| 3 |   | B | A | 1 | 0 |
| 4 | B | B | B | 1 | 1 |

FIG.10

| | | | | (T1, T2) |
|---|---|---|---|---|
| | <INPUT> | <OUTPUT> | | |
| D | ———— ------ | ———— | Vo16 | (D, D) |
| | | ———— | Vo15 | (D, C) |
| | | ———— | Vo14 | (C, D) |
| C | ———— ------ | ———— | Vo13 | (C, C) |
| | | ———— | Vo12 | (C, B) |
| | | ———— | Vo11 | (C, A) |
| | | ———— | Vo10 | (C, B) |
| | | ———— | Vo9 | (C, A) |
| | | ———— | Vo8 | (B, D) |
| | | ———— | Vo7 | (B, C) |
| | | ———— | Vo6 | (A, D) |
| | | ———— | Vo5 | (A, C) |
| B | ———— ------ | ———— | Vo4 | (B, B) |
| | | ———— | Vo3 | (B, A) |
| | | ———— | Vo2 | (A, B) |
| A | ———— ------ | ———— | Vo1 | (A, A) |

FIG.11

| LEVEL | INPUT VOLTAGE | V(T1) | V(T2) | D3 | D2 | D1 | D0 |
|---|---|---|---|---|---|---|---|
| 1 | A | A | A | 0 | 0 | 0 | 0 |
| 2 |  | A | B | 0 | 0 | 0 | 1 |
| 3 |  | B | A | 0 | 0 | 1 | 0 |
| 4 | B | B | B | 0 | 0 | 1 | 1 |
| 5 |  | A | C | 0 | 1 | 0 | 0 |
| 6 |  | A | D | 0 | 1 | 0 | 1 |
| 7 |  | B | C | 0 | 1 | 1 | 0 |
| 8 |  | B | D | 0 | 1 | 1 | 1 |
| 9 |  | C | A | 1 | 0 | 0 | 0 |
| 10 |  | C | B | 1 | 0 | 0 | 1 |
| 11 |  | D | A | 1 | 0 | 1 | 0 |
| 12 |  | D | B | 1 | 0 | 1 | 1 |
| 13 | C | C | C | 1 | 1 | 0 | 0 |
| 14 |  | C | D | 1 | 1 | 0 | 1 |
| 15 |  | D | C | 1 | 1 | 1 | 0 |
| 16 | D | D | D | 1 | 1 | 1 | 1 |

FIG. 15

| LEVEL | | INPUT VOLTAGE | | D5 | D4 | D3 | D2 | D1 | D0 |
|---|---|---|---|---|---|---|---|---|---|
| | | V(T1) | V(T2) | | | | | | |
| 1 | A | A | A | 0 | 0 | 0 | 0 | 0 | 0 |
| 2 | | A | B | 0 | 0 | 0 | 0 | 0 | 1 |
| 3 | | B | A | 0 | 0 | 0 | 0 | 1 | 0 |
| 4 | B | B | B | 0 | 0 | 0 | 0 | 1 | 1 |
| 5 | | A | C | 0 | 0 | 0 | 1 | 0 | 0 |
| 6 | | A | D | 0 | 0 | 0 | 1 | 0 | 1 |
| 7 | | B | C | 0 | 0 | 0 | 1 | 1 | 0 |
| 8 | | B | D | 0 | 0 | 0 | 1 | 1 | 1 |
| 9 | C | C | A | 0 | 0 | 1 | 0 | 0 | 0 |
| 10 | | C | B | 0 | 0 | 1 | 0 | 0 | 1 |
| 11 | | D | A | 0 | 0 | 1 | 0 | 1 | 0 |
| 12 | | D | B | 0 | 0 | 1 | 0 | 1 | 1 |
| 13 | | C | C | 0 | 0 | 1 | 1 | 0 | 0 |
| 14 | | C | D | 0 | 0 | 1 | 1 | 0 | 1 |
| 15 | | D | C | 0 | 0 | 1 | 1 | 1 | 0 |
| 16 | D | D | D | 0 | 0 | 1 | 1 | 1 | 1 |
| 17 | | A | E | 0 | 1 | 0 | 0 | 0 | 0 |
| 18 | | A | F | 0 | 1 | 0 | 0 | 0 | 1 |
| 19 | | B | E | 0 | 1 | 0 | 0 | 1 | 0 |
| 20 | | B | F | 0 | 1 | 0 | 0 | 1 | 1 |
| 21 | | A | G | 0 | 1 | 0 | 1 | 0 | 0 |
| 22 | | A | H | 0 | 1 | 0 | 1 | 0 | 1 |
| 23 | | B | G | 0 | 1 | 0 | 1 | 1 | 0 |
| 24 | | B | H | 0 | 1 | 0 | 1 | 1 | 1 |
| 25 | | C | E | 0 | 1 | 1 | 0 | 0 | 0 |
| 26 | | C | F | 0 | 1 | 1 | 0 | 0 | 1 |
| 27 | | D | E | 0 | 1 | 1 | 0 | 1 | 0 |
| 28 | | D | F | 0 | 1 | 1 | 0 | 1 | 1 |
| 29 | | C | G | 0 | 1 | 1 | 1 | 0 | 0 |
| 30 | | C | H | 0 | 1 | 1 | 1 | 0 | 1 |
| 31 | | D | G | 0 | 1 | 1 | 1 | 1 | 0 |
| 32 | | D | H | 0 | 1 | 1 | 1 | 1 | 1 |
| 33 | | E | A | 1 | 0 | 0 | 0 | 0 | 0 |
| 34 | | E | B | 1 | 0 | 0 | 0 | 0 | 1 |
| 35 | | F | A | 1 | 0 | 0 | 0 | 1 | 0 |
| 36 | | F | B | 1 | 0 | 0 | 0 | 1 | 1 |
| 37 | | E | C | 1 | 0 | 0 | 1 | 0 | 0 |
| 38 | | E | D | 1 | 0 | 0 | 1 | 0 | 1 |
| 39 | | F | C | 1 | 0 | 0 | 1 | 1 | 0 |
| 40 | | F | D | 1 | 0 | 0 | 1 | 1 | 1 |
| 41 | | G | A | 1 | 0 | 1 | 0 | 0 | 0 |
| 42 | | G | B | 1 | 0 | 1 | 0 | 0 | 1 |
| 43 | | H | A | 1 | 0 | 1 | 0 | 1 | 0 |
| 44 | | H | B | 1 | 0 | 1 | 0 | 1 | 1 |
| 45 | | G | C | 1 | 0 | 1 | 1 | 0 | 0 |
| 46 | | G | D | 1 | 0 | 1 | 1 | 0 | 1 |
| 47 | | H | C | 1 | 0 | 1 | 1 | 1 | 0 |
| 48 | | H | D | 1 | 0 | 1 | 1 | 1 | 1 |
| 49 | E | E | E | 1 | 1 | 0 | 0 | 0 | 0 |
| 50 | | E | F | 1 | 1 | 0 | 0 | 0 | 1 |
| 51 | | F | E | 1 | 1 | 0 | 0 | 1 | 0 |
| 52 | | F | F | 1 | 1 | 0 | 0 | 1 | 1 |
| 53 | | E | G | 1 | 1 | 0 | 1 | 0 | 0 |
| 54 | | E | H | 1 | 1 | 0 | 1 | 0 | 1 |
| 55 | | F | G | 1 | 1 | 0 | 1 | 1 | 0 |
| 56 | | F | H | 1 | 1 | 0 | 1 | 1 | 1 |
| 57 | | G | E | 1 | 1 | 1 | 0 | 0 | 0 |
| 58 | | G | F | 1 | 1 | 1 | 0 | 0 | 1 |
| 59 | | H | E | 1 | 1 | 1 | 0 | 1 | 0 |
| 60 | | H | F | 1 | 1 | 1 | 0 | 1 | 1 |
| 61 | G | G | G | 1 | 1 | 1 | 1 | 0 | 0 |
| 62 | | G | H | 1 | 1 | 1 | 1 | 0 | 1 |
| 63 | | H | G | 1 | 1 | 1 | 1 | 1 | 0 |
| 64 | H | H | H | 1 | 1 | 1 | 1 | 1 | 1 |

NUMBER OF INPUT VOLTAGES: 16
NUMBER OF TRANSISTORS: 30

Prior Art

NUMBER OF INPUT VOLTAGES: 4
NUMBER OF TRANSISTORS: 16

FIG.39

| LEVEL | REFERENCE VOLTAGE | V(T1) | V(T2) | B4.B3.B2.B1 |
|---|---|---|---|---|
| 1 | V01 | V01 | V01 | 0.0.0.0 |
| 2 |  | V01 | V04 | 0.0.0.1 |
| 3 |  | V04 | V01 | 0.0.1.0 |
| 4 | V04 | V04 | V04 | 0.0.1.1 |
| 5 |  | V01 | V13 | 0.1.0.0 |
| 6 |  | V01 | V16 | 0.1.0.1 |
| 7 |  | V04 | V13 | 0.1.1.0 |
| 8 |  | V04 | V16 | 0.1.1.1 |
| 9 |  | V13 | V01 | 1.0.0.0 |
| 10 |  | V13 | V04 | 1.0.0.1 |
| 11 |  | V16 | V01 | 1.0.1.0 |
| 12 |  | V16 | V04 | 1.0.1.1 |
| 13 | V13 | V13 | V13 | 1.1.0.0 |
| 14 |  | V13 | V16 | 1.1.0.1 |
| 15 |  | V16 | V13 | 1.1.1.0 |
| 16 | V16 | V16 | V16 | 1.1.1.1 |

FIG.40

| V(T1) | V(T2) | BIT DATA (BX) | | | |
|---|---|---|---|---|---|
|  |  | 4 | 3 | 2 | 1 |
| V01 |  | 0 |  | 0 |  |
|  | V01 |  | 0 |  | 0 |
| V04 |  | 0 |  | 1 |  |
|  | V04 |  | 0 |  | 1 |
| V013 |  | 1 |  | 0 |  |
|  | V013 |  | 1 |  | 0 |
| V016 |  | 1 |  | 1 |  |
|  | V016 |  | 1 |  | 1 |

# OUTPUT CIRCUIT, DIGITAL/ANALOG CIRCUIT AND DISPLAY APPARATUS

BACKGROUND OF THE INVENTION

1. Field of the Invention

This invention relates to an output circuit, a digital/analog circuit and a display apparatus realized by using the same.

2. Description of the Related Art

Liquid crystal displays (LCDs) provides advantages of being thin and lightweight and operating at a low power consumption rate. Hence, they have recently been finding a variety of applications including display sections of portable telephone sets (mobile phones, cellular phones), PDA (personal digital assistants), notebook-sized personal computers and other mobile electronic appliances. Additionally, as a result of the technological advancement in the field of displaying moving scenes on large display screens of liquid crystal display apparatus in most recent years, stand type large screen liquid crystal display apparatus and large screen liquid crystal television sets have become available to say nothing of mobile applications. Many liquid crystal display apparatus are active matrix drive type apparatus that can operate as high definition display apparatus. Now, a typical configuration of active matrix drive type liquid crystal display apparatus will be briefly described by referring to FIG. 20 of the accompanying drawings. FIG. 20 schematically illustrates an equivalent circuit for certain principal components connected to a pixel of a liquid crystal display 1.

Generally, the display section 960 of an active matrix drive type comprises a semiconductor substrate formed by arranging transparent pixel electrodes 964 and thin film transistors (TFTs) 963 in the form of a matrix (having 1,280×3 pixel columns×1,024 pixel rows in the case of a color SXGA panel), an opposed substrate 966 on which a single transparent electrode 966 is formed and liquid crystal filled between the two oppositely disposed substrates.

The operation of turning on and off each of the TFTs 963 that function as switches is controlled by a scanning signal. More specifically, as a tone voltage that corresponds to a video signal is applied to one of the pixel electrodes 964 to turn on the corresponding TFT 963, the transmittance of the liquid crystal there is changed due to the potential difference produced between the pixel electrode 964 and the opposed substrate electrode 966 and the potential difference is maintained by a corresponding liquid crystal capacity 965 for a predetermined period of time to display an image there.

A plurality of data lines 962 for transmitting a plurality of level voltages (tone voltages) to be applied to the pixel electrodes 964 and a plurality of scanning lines 961 for transmitting scanning signals are arranged on the semiconductor substrate to form a lattice (1,280×3 data lines and 1,024 scanning lines in the case of a color SXGA panel). Thus, the scanning lines 961 and the data lines 962 operate as large capacitive load due to the capacity that arises at each of intersections of two lines, the liquid crystal capacity sandwiched between the semiconductor substrate and the opposed substrate electrode and other factors.

Scanning signals are supplied to the scanning lines 961 by means of a gate driver 970, while a tone voltage is supplied to each of the pixel electrodes 964 by means of a data driver 980 by way of the data lines 962.

The operation of rewriting the data of a scene is performed in each frame period (1/60 seconds), during which the pixel rows (lines) are sequentially selected as scanning lines and tone voltages are supplied to the respective pixel electrodes by way of the data lines.

While the gate driver 970 is required only to supply at least binary scanning signals, the data driver 980 is required to drive the data lines by drive voltages of multi-valued level, the multi-value being a function of the number of data lines. Therefore, a differential amplifier that can highly precisely output voltages is used for the buffer section of the data driver 980.

High image quality liquid crystal display apparatus (with an increased number of colors) have been developed in recent years. Currently, there is an increasing demand for liquid crystal display apparatus that can display at least 260,000 colors (6-bit video data for each of RGB) and preferably 26,800,000 colors (8-bit video data for each of RGB).

Therefore, the data driver that outputs tone voltages that corresponds to such multi-bit video data required to highly precisely output voltages. Furthermore, as the number of elements of the circuit section for processing video data rises, the chip area of the data driver LSI increases to push up the manufacturing cost. Now, this problem will be discussed in detail below.

FIG. 21 of the accompanying drawings illustrates the configuration of the data driver 980 of FIG. 20. Some of the principal components of the data driver 980 are shown in blocks in FIG. 21. Referring to FIG. 21, the data driver 980 comprises a latch address selector 981, a latch 982, a tone voltage generating circuit 983, decoders 984 and buffer circuits 985.

The latch address selector 981 determines the timing of data latch according to clock signal CLK. The latch 982 latches video digital data at the timing determined by the latch address selector 981 and outputs the data simultaneously to the decoders 984 according to STB signal (strobe signal). The tone voltage generating circuit 983 generates tone voltages for a number of different tones that correspond to the video data. The decoders 984 select one of the tone voltages corresponding to the input data and output it. The buffer circuits 985 receive the tone voltages output respectively from the corresponding decoders 984 and amplify the electric currents thereof, which are then output from them as output voltages Vout.

For example, when 6-bit video data are input, the number of tones is 64 and the tone voltage generating circuit 983 generates tone voltages of 64 different levels. Then, the decoder 984 is designed to select one of the tone voltages of 64 levels.

When, on the other hand, 8-bit video data are input, the number of tones is 256 and the tone voltage generating circuit 983 generates tone voltages of 256 different levels. Then, the decoder 984 is designed to select one of the tone voltages of 256 levels.

Thus, as the number of bits increases for video data, the circuit size of the tone voltage generating circuit 983 and that of the decoders 984 increase. When the number of bits of each video data is raised from 6 to 8, the circuit size is expanded by four times. Therefore, the chip area of the data driver LSI increases remarkably as the number of bits of each video data rises to consequently push up the manufacturing cost.

To cope with this problem, techniques have been proposed to suppress the increase of the chip area of the data driver LSI if the number of bits rises. For example, U.S. Pat. No. 6,246,351 (Patent Document 1) describes such a technique. FIG. 22 of the accompanying drawings schematically illustrates the circuit arrangement proposed in above-cited Patent Document 1 (and corresponds to FIG. 2 of Patent Document 1). Referring now to FIG. 22, it comprises a string DAC section (decoder section) 4001 that includes a string of a set of resistors R000 through R255 and a set of voltage selection switches S000 through S255 for selecting a voltage that are arranged at respective positions located between adjacent resistors and an interpolation amp section 4100 that includes switches 4004 for selectively receiving as input the voltages supplied to a differential amplifier having a plurality of homo-polar differential pairs and two input terminals 4002, 4003 to the non-inverting inputs of the differential amplifier.

The string DAC section 4001 selects the two voltages between the opposite ends of a resistor selected out of the resistors R000 through R255 of the resistor string by the switches S000 through S255 that are controlled by the upper M bits of a digital data and the selected voltages are supplied respectively to the input terminals 4002, 4003 of the interpolation amp section 4100. The two voltages selected by the switches are limited to the voltages at the opposite ends of one of the resistors R000 through R255 of the string of resistors and hence the voltages at the opposite ends of a plurality of serially connected resistors or same voltages would never be selected.

In the interpolation amp section 4100, the voltages V1, V2 supplied respectively to the input terminals 4002, 4003 are selectively input to non-inverting inputs 4111, 4121, 4131, 4141 by means of the switches 4004 that are controlled by the lower N bits of the digital data so that it is possible to output the voltages that can internally divide the difference voltage between the voltages V1 and V2 to appropriate ratios that correspond to the ratios of the numbers of different inputs of V1 and V2. Since four differential pairs are provided in FIG. 22, it is possible to output four voltages including three voltages that internally divides the difference voltage between the two voltages V1, V2 of the terminals 4002, 4003 to ratios 1:3, 1:1 and 3:1 and V1, using the LSB (least significant bit). Thus, it is possible to reduce the number of levels of the voltage to be input relative to the number of levels of the voltage to be output to 1/(number of differential pairs). Therefore, it is possible to reduce the number of power supply lines and the area of the string DAC section.

U.S. Pat. No. 5,396,245 (Patent Document 2) describes another technique. FIG. 23 of the accompanying drawings schematically illustrates the circuit arrangement proposed in above-cited Patent Document 2 (and corresponds to FIG. 5 of Patent Document 2). Referring now to FIG. 23, the interpolation amp section 4100b slightly differs from the interpolation amp section 4100 of Patent Document 1 in terms of configuration. For example, while the four differential pairs are driven by so many different electric current sources in the arrangement of FIG. 22, the four differential pairs are driven by a single common electric current source 4200b in the arrangement of FIG. 23.

The arrangement of FIG. 23 is identical with that of FIG. 22 in that two voltages are selected from a string of resistors R000b through R255b by means of switches S000b through S255b and the input to the differential amplifier 4100b is controlled by means of switches 4004b to internally divide the difference voltage between V1 and V2 to output corresponding voltages. Thus, the arrangement of FIG. 23 also provides the advantage of reducing the number of input power supply lines. The fact that the two voltages selected by the switches are limited to the voltages at the opposite ends of one of the resistors R000b through R255b of the string of resistors is also common to the arrangement of FIG. 22 and that of FIG. 23.

ECL multi-valued logic circuits comprising two differential pairs respectively having bases adapted to receive input signals, collectors connected to a common load resistance and emitters commonly connected to each other so as to be driven by electric current sources having different electric current values and an output transistor for driving the output terminals, using one of the terminals of the load circuit as input (see, inter alia, JP-A-61-248619).

When applying any of the above known arrangements to a multi-output driver such as the data driver of a display apparatus, it is important to minimize the area of the differential amplifier. When any of the known arrangement described above by referring to FIGS. 22 and 23 is used for the data driver, while it is possible to reduce the size of the part of decoders, the number of differential pairs has to be increased to two, four, eight, . . . on in order to reduce the number of tone power source lines by ½, ¼, ⅛, . . . . Then, the area occupied by the differential amplifier is increased to a very large extent to lose the area-saving effect.

SUMMARY OF THE INVENTION

In view of the above-identified circumstances, it is therefore an object of the present invention to provide an output circuit and a digital/analog conversion circuit that can reduce the number of required input voltages and, at the same time, the number of transistors by using an amplifier adapted, for example, to output three or more than three output voltage levels as multi-valued level for two input voltages.

Another object of the present invention is to provide an area-saving low cost data driver and a display apparatus comprising such a data driver by using an output circuit as described above.

In an aspect of the present invention, the above first object is achieved by providing an output circuit comprising:

a selection circuit for receiving as input a plurality of (m) reference voltages having mutually different respective voltage values, selecting same or different two reference voltages from the m reference voltages according to an input selection signal and supplying them respectively to first and second terminals and an amplifier circuit for receiving as input the voltages supplied to the first and second terminals and outputting the voltage obtained by internally dividing the difference of the voltages of the first and second terminals to a predetermined internal ratio from an output terminal, wherein the output circuit is adapted to output square of m mutually different voltage levels at maximum and the voltages selected from the square of m voltage levels according to the selection signal.

In another aspect of the present invention, there is provided a digital/analog conversion circuit comprising:

a selection circuit for receiving as input a plurality of (m) reference voltages having mutually different respective voltage values, selecting same or different two reference voltages from the m reference voltages according to the digital data signal input from a data input terminal, using it as selection signal, and supplying them respectively to first and second terminals and an amplifier circuit for receiving as input the voltages supplied to the first and second terminals and outputting the voltage obtained by internally dividing the difference of the voltages of the first and second terminals to a predetermined internal ratio from an output terminal, wherein the output circuit is adapted to output voltages of square of m mutually different voltage levels at maximum according to the value of the digital data signal.

In an output circuit or a digital/analog conversion circuit according to the invention, it may be so arranged that the selection circuit receives as input a first reference voltage (A) and a second reference voltage (B) and supplies one of the pairs of the first, first reference voltages (A, A),
the first, second reference voltages (A, B),
the second, first reference voltages (B, A) and
the second, second reference voltages (B, B)

selected according to the selection signal to the first and second terminals so that voltages of square of two mutually different voltage levels can be output at maximum.

In an output circuit or a digital/analog conversion circuit according to the invention, it may be so arranged that the internal ratio is 1:2 or 2:1 and the sum of double of the input voltage of either the first terminal or the second terminal and the input voltage of the other terminal of the first and second terminals shows a relationship of being equal to three times of the output voltage and the first and second reference voltages are respectively at the first and fourth levels out of the first through fourth voltage levels arranged at regular intervals so that voltages of four levels including the output voltage of the first level due to the selection of the pair of the first, first reference voltages (A, A) through the output voltage of the fourth level due to the selection of the pair of the second, second reference voltages (B, B) are output at the selection circuit.

In an output circuit or a digital/analog conversion circuit according to the invention, it may be so arranged that the selection circuit receives as input first through fourth reference voltages (A, B, C, D) having mutually different voltage values and supplies one of the pairs of the first, first reference voltages (A, A),
the first, second reference voltages (A, B),
the second, first reference voltages (B, A),
the second, second reference voltages (B, B),
the first, third reference voltages (A, C),
the first, fourth reference voltages (A, D),
the second, third reference voltages (B, C),
the second, fourth reference voltages (B, D),
the third, first reference voltages (C, A),
the third, second reference voltages (C, B),
the fourth, first reference voltages (D, A),
the fourth, second reference voltages (D, B),
the third, third reference voltages (C, C),
the third, fourth reference voltages (C, D),
the fourth, third reference voltages (D, C) and
the fourth, fourth reference voltages (D, D)

selected according to the selection signal to the first and second terminals so that voltages of square of four mutually different voltage levels can be output at maximum.

In an output circuit or a digital/analog conversion circuit according to the invention, it may be so arranged that the internal ratio is 1:2 or 2:1 and the sum of double of the input voltage of either the first terminal or the second terminal and the input voltage of the other terminal of the first and second terminals shows a relationship of being equal to three times of the output voltage and the first through fourth reference voltages are respectively at the first, fourth, thirteenth and sixteenth levels out of the first through sixteenth voltage levels arranged at regular intervals so that voltages of sixteen levels including the output voltage of the first level due to the selection of the pair of the first, first reference voltages (A, A) through the output voltage of the sixteenth level due to the selection of the pair of the fourth, fourth reference voltages (D, D) are output.

In an output circuit or a digital/analog conversion circuit according to the invention, it may be so arranged that the output voltage range defined by the lower limit and the upper limit of output voltage that can be output is divided into a plurality of sections that do not overlap and at least two reference voltages of different levels are provided for each section so that voltages of square of n voltage levels can be output at maximum in each of the sections by means of the plurality of (n) reference voltages.

In an output circuit or a digital/analog conversion circuit according to the invention, it may be so arranged that the intervals of at least a set of adjacently located output voltage levels are different from those of another set of adjacently located output voltage levels. Alternatively, it may be so arranged that the intervals of the voltage levels of a section are different from those of the voltage levels of another section among the plurality of sections. With such an arrangement, it is possible to increase the number of reference voltages input to the selection circuit and realize a desired non-linear input/output characteristic such as gamma characteristic interpolation.

In an output circuit or a digital/analog conversion circuit according to the invention, it may be so arranged that the amplifier circuit includes:

first and second input terminals,
an output terminal,
first and second differential pairs, each having one of the input pair connected to the first input terminal and the other of the input pair connected the output terminal,
a third differential pair having one of the input pair connected to the second input terminal and the other of the input pair connected to the output terminal,
a first electric current source for supplying an electric current to the first differential pair,
a second electric current source for supplying an electric current to the second differential pair,
a third electric current source for supplying an electric current to the third differential pair,
a load circuit commonly connected to the output pairs of the first through third differential pairs and
an amplifier circuit connected between a common output pair for the first through third differential pairs and the output terminal.

In an output circuit or a digital/analog conversion circuit according to the invention, it may be so arranged that the amplifier circuit includes:

first and second input terminals,
an output terminal,
first and second differential pairs, each having one of the input pair connected to the first input terminal and the other of the input pair connected the output terminal,
a third differential pair having one of the input pair connected to the second input terminal and the other of the input pair connected to the output terminal,
a first electric current source commonly connected to the first through third differential pairs for supplying an electric current to the first through third differential pairs,
a load circuit commonly connected to the output pairs of the first through third differential pairs and an amplifier circuit connected between a common output pair for the first through third differential pairs and the output terminal.

In an output circuit or a digital/analog conversion circuit according to the invention, it may be so arranged that the selection circuit receives as input first through m-th (=$2^K$, where K is a predetermined positive integer) reference voltages having mutually different respective voltage values and selects one of the voltage pairs of a total of $4^K$ combinations of the first through $2^K$ reference voltages to supply it to the first and second terminals according to the selection signal of at least 2K bits so that voltages of $4^K$ different voltage levels can be output from the output terminal at maximum.

In an output circuit or a digital/analog conversion circuit according to the invention, it may be so arranged that the internal ratio is 1:2 or 2:1 and the sum of double of the input voltage of either the first terminal or the second terminal and the input voltage of the other terminal of the first and second terminals shows a relationship of being equal to three times of the output voltage and the selection circuit receives as input first through m-th (=$2^K$, where K is a predetermined positive integer) reference voltages having mutually different respective voltage values, the first through $2^K$ reference voltages showing respective levels of $$\{1+a\_1 \times 4^{(K-1)} + a\_2 \times 4^{(K-2)} + a\_3 \times 4^{(K-3)} + \ldots + a\_K \times 4^{(K-K)}\},$$

(where a_1, a_2, a_3, . . . , a_K equal 0 or 3), out of the first through $4^K$-th levels arranged at regular intervals so that voltages of $4^K$ different voltage levels from the first level to the $4^K$-th level are output according to the input selection signal (or the input digital data signal) of at least 2K bits.

In still another aspect of the present invention, there is provided a display apparatus comprising the output circuit as driver for driving the data lines it has.

In still another aspect of the present invention, there is provided an output circuit or a digital/analog conversion circuit comprising:

a circuit for generating (m×S) reference voltages (where m and S being respectively predetermined positive integers) having mutually different voltage values, an output terminal, at least a decoder block for receiving as input the (m×S) reference voltages and outputting the voltage selected from the (m×S) reference voltages according to the values of the first, second and third bit groups of a digital data signal having a plurality of bits, the bit groups forming respective predetermined bit fields, to the first and second terminals and an amplifier circuit for receiving the voltage supplied to the first and second terminals from the decoder block and outputting the voltage obtained by internally dividing the voltage of the first and second terminals to a predetermined internal ratio to the output terminal, the decoder block having circuit blocks arranged at three stages;

the first stage circuit blocks including S circuit blocks, each being adapted to receive as input m reference voltages out of the (m×S) input reference voltages and select and output two voltages from the m reference voltages, allowing duplication, the second stage circuit blocks including a circuit block adapted to receive as input either of the two voltages selected by each of the S first stage circuit blocks and select and output one of the S input voltages according to the value of the second bit group and a circuit block adapted to receive as input the other of the two voltages selected by each of the S first stage circuit blocks and select and output one of the S input voltages according to the value of the second bit group and the third stage circuit blocks including a circuit block adapted to receive as input the voltages selected and output by the two second stage circuit blocks and controls the input two voltages so as to supply them to the first and second terminals or block the supply thereof, a voltage of any of the (m²×S) mutually different voltage levels being output from the output terminal according to the signal values of the first through third bit groups.

For the purpose of the present invention, the third stage circuit block may be omitted and the outputs of the two second stage circuit blocks may be supplied to the first and second terminals when each and every bit of the third bit group is contained in the first bit group and/or the second bit group.

In still another aspect of the present invention, there is provided an output circuit or a digital/analog conversion circuit comprising:

a circuit for generating (m×S) reference voltages (where m and S being respectively predetermined positive integers) having mutually different voltage values, an output terminal, at least a decoder block for receiving as input the (m×S) reference voltages and outputting the voltage selected from the (m×S) reference voltages according to the values of the first, second and third bit groups of a digital data signal having a plurality of bits, the bit groups forming respective predetermined bit fields, to the first and second terminals and an amplifier circuit for receiving the voltage supplied to the first and second terminals from the decoder block and outputting the voltage obtained by internally dividing the voltage of the first and second terminals to a predetermined internal ratio to the output terminal, the decoder block having circuit blocks arranged at three stages;

the first stage circuit blocks including m circuit blocks, each being adapted to receive as input S reference voltages out of the (m×S) input reference voltages and select and output a voltage from the S reference voltages, the second stage circuit blocks including a circuit block adapted to receive as input the m voltages selected by the m first stage circuit blocks and select and output two of the m input voltages according to the value of the second bit group and circuit blocks and the third stage circuit blocks including a circuit block adapted to receive as input the two voltages selected and output by the two second stage circuit blocks and controls the input two voltages so as to supply them to the first and second terminals or block the supply thereof, a voltage of any of the (m²×S) mutually different voltage levels being output from the output terminal according to the signal values of the first through third bit groups.

A digital/analog conversion circuit according to the invention may further comprise decoder blocks with the value of the m common to them all or different from each other, the third stage circuit blocks being omitted so as to supply the output of the second stage circuit blocks to the first and second terminals when each of the bits of the third bit group is contained in the first bit group and/or the second bit group so that the all the bits of the third bit group are contained in the first bit group and the second bit group in the decoder block where the value of the m is maximal.

In an output circuit or a digital/analog conversion circuit according to the invention, it may be so arranged that the m is equal to $2^K$ (where K is a predetermined positive integer) and the selection circuit is adapted to select voltages from the first through $2^K$ reference voltages according to the total of 2K bit signals of the first through 2K-th signals of the selection signal and output the selected voltages to the first and second terminals, the output circuit or the digital/analog conversion circuit further comprising:

groups of circuit blocks including a group of the first row circuit blocks through a group of the K-th row circuit blocks, each of the circuit blocks having four input terminals and two output terminals and adapted to receive voltage signals from the four input terminals and output the voltage signals selected according to a 2-bit signal to the two output terminals, the first column having $2^{(K-1)}$ circuit blocks, each of the $2^{(K-1)}$ circuit blocks having two input ends, each being formed by commonly connecting two of the four input terminals of the circuit block and adapted to receive as input two of the first through $2^K$ reference voltages and select and output two voltage signals according to the first and second signals, the F-th column (where F being a positive integer from 2 to K) having $2^{(K-1)}$ ((K-1)-th power of 2) circuit blocks, each of the $2^{(K-1)}$ circuit blocks being adapted to receive as input the output voltage signals of two circuit blocks of the (F-1)-th column at its four input terminals and select and output two voltage signals according to the (2F-1)-th and 2F-th signals, the two output voltages of the circuit block group of the K-th column being output to the first and second terminals.

In still another aspect of the present invention, there is provided an output circuit or a digital/analog conversion circuit comprising:

a decoder circuit for receiving as input a plurality of (m) reference voltages having mutually different respective voltage values, selecting two same or different reference voltages from the m reference voltages, using the digital data signal input to it from a data input terminal as selection signal and sequentially outputting them; and an amplifier circuit for sequentially receiving as input the two voltages selected by the decoder circuit and outputting the voltage obtained by internally dividing the difference between the two voltages to a predetermined internal ratio from an output terminal.

Thus, the present invention provides an advantage that a DAC comprising a differential amplifier that can output voltages of four different levels including two input voltages and two voltages by dividing the difference of the two input voltages to internal ratios of 1:2 and 2:1 can output voltages of $m^2$ (square of two) voltage levels at maximum for m input voltages.

Additionally, the present invention provides an advantage that the decoder for outputting two input voltages that are selectively input to the two input terminals of the differential amplifier can remarkably reduce the number of input voltages (tone voltages) and also the number of transistors to save the necessary area.

Still additionally, the present invention provides an advantage of realizing an area-saving low cost data driver LSI by using a differential amplifier and a decoder as described above and also a low cost and slim display apparatus comprising such a data driver.

BRIEF DESCRIPTION OF THE DRAWINGS

FIG. 10 is a schematic illustration of the correspondence of input and output levels of an embodiment of DAC according to the invention when the number of input voltages that can be input to the amplifier circuit 13 of FIG. 1 is four (m=4);

FIG. 11 is a schematic illustration of the correspondence of input and output levels of the 4-bit DAC of FIG. 10;

FIG. 15 is a schematic illustration of the correspondence of input and output levels of still another embodiment of DAC according to the invention, which is a 6-bit DAC;

FIG. 39 is a schematic illustration of the correspondence of input and output levels of another embodiment of DAC according to the invention, which is a 4-bit DAC, formed by modifying FIG. 11; and FIG. 40 is a schematic illustration of the condition of selection of each reference voltage of FIG. 39.

DETAILED DESCRIPTION OF THE PREFERRED EMBODIMENTS

Figure 1:
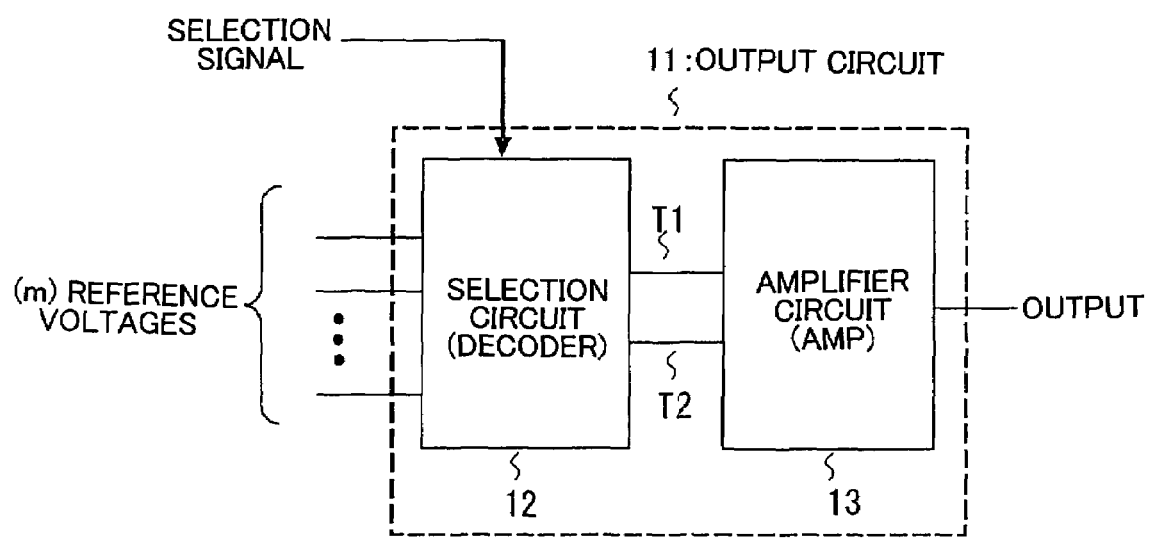
FIG. 1 is a schematic block diagram of an embodiment of output circuit according to the invention.

Now, the present invention will be described in greater detail by way of the best modes of carrying out the invention. Referring firstly to FIG. 1 that illustrates an embodiment of output circuit (11) according to the invention, the output circuit comprises a selection circuit (12) for receiving a plurality of (m) reference voltages having mutually different voltage values and selecting two voltages according to a selection signal and an amplifier circuit (13) for receiving as input the two reference voltages output from the selection circuit at two input terminals thereof and outputting the voltages obtained by interpolating the voltage difference between the two input terminals to 1:2 or 2:1. The output circuit is adapted to be used as digital/analog conversion circuit that uses a digital data signal as selection signal and outputs voltages with voltage levels that correspond to the digital data signal.

Alternatively, for the purpose of the present invention, it may be so arranged that the two voltages selected by the selection circuit are sequentially output and the amplifier circuit (13) receives as input the two voltages selected by the selection circuit at a single input terminal and outputs the voltages obtained by interpolating the voltage difference between the two input voltages to 1:2 or 2:1.

Figure 4:
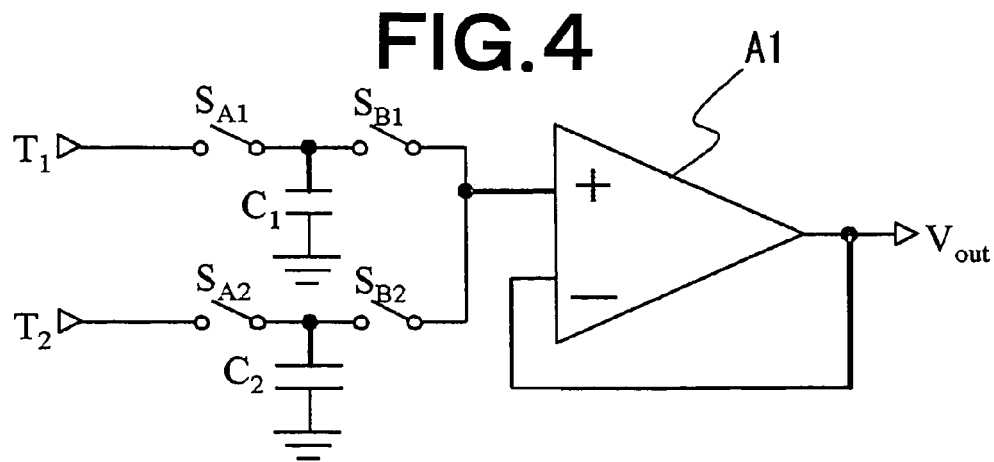
FIG. 4 is a schematic circuit diagram of the amplifier of the embodiment of FIG. 1, showing the configuration thereof.

For the purpose of the present invention, the amplifier circuit (13) of FIG. 1 may have any configuration so long as it is adapted to interpolate the voltage difference between the first and second input terminals to 1:2 or 2:1. FIG. 4 schematically illustrates an example of amplifier circuit of the type under consideration. The amplifier circuit comprises first and second input terminals T1, T2, first and second capacitors C1, C2, each having one of its ends grounded, a voltage follower type amplifier A1, a first switch SA1 connected between the first input terminal T1 and the other end of the capacitor C1, a second switch SB1 connected between the other end of the first capacitor C1 and the non-inverting input (+) of the amplifier A1, a third switch SA2 connected between the second input terminal T2 and the other end of the second capacitor C2 and a fourth switch SB2 connected between the other end of the second capacitor C2 and the non-inverting input (+) of the amplifier A1. Firstly, as the second and fourth switches SB1, SB2 are turned OFF and the first and third switches SA1, SA2 are turned on, the voltages supplied to the input terminals T1, T2 are stored in the first and second capacitors C1, C2 by way of the first and third switches SA1, SA2 respectively. Then, as the first and third switches SA1, SA2 are turned OFF and the second and fourth switches SB1, SB2 are turned on in the next period, the electric charges are recombined between the first and second capacitors C1, C2. If the ratio of the capacitance of the first capacitor C1 to that of the second capacitor C2 is defined to be 2:1, the voltage of the non-inverting input (+) of the amplifier A1 (and hence the output voltage Vout) is equal to $$(2 \times V(T1) + V(T2))/3,$$

which is equal to the voltage obtained by internally dividing the voltage difference between the first input terminal T1 and the second input terminal T2 to 1:2.

Thus, it will be appreciated that the output voltage of the amplifier A1 is also equal to the voltage obtained by internally dividing the voltage difference between the first input terminal T1 and the second input terminal T2 to 1:2.

Conversely, the output voltage Vout will be equal to the voltage that is obtained by internally dividing the voltage difference between the first input terminal T1 and the second input terminal T2 to 2:1 if the ratio of the capacitance of the first capacitor C1 to that of the second capacitor C2 is defined to be 1:2.

Figure 2:
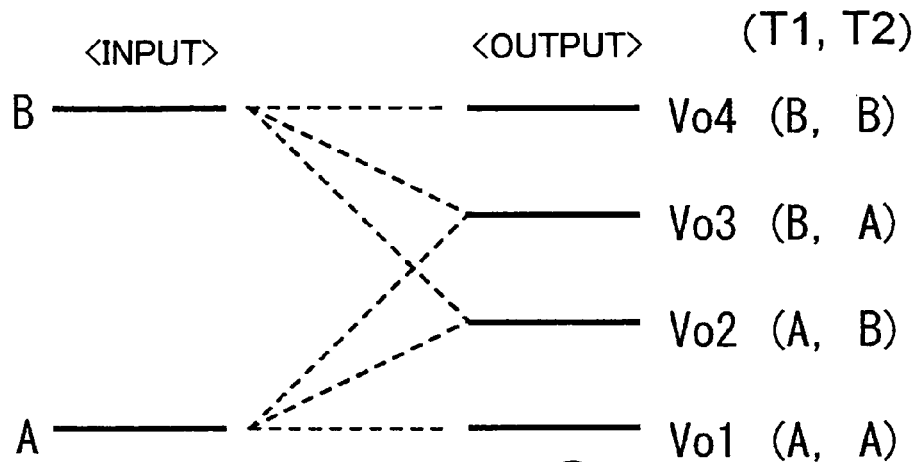
FIG. 2 is a schematic illustration of an operation of 1:2 interpolation of the amplifier of the embodiment of FIG. 1.
Figure 3:
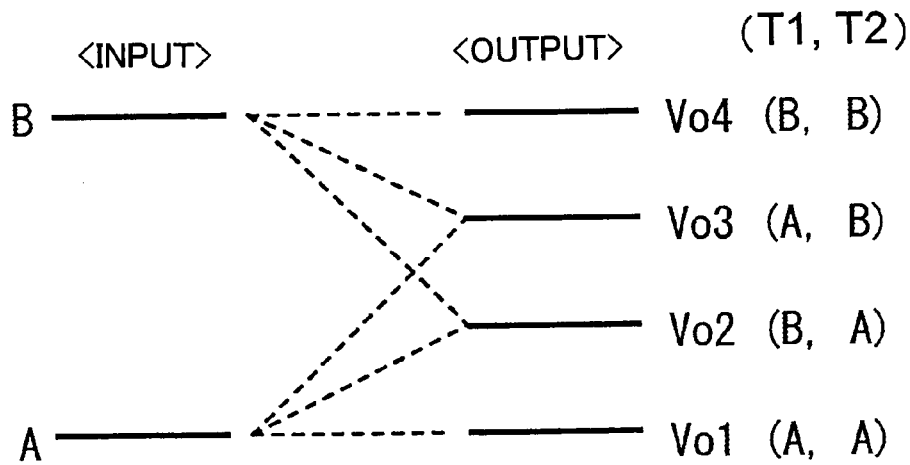
FIG. 3 is a schematic illustration of an operation of 2:1 interpolation of the amplifier of the embodiment of FIG. 1.

In the first embodiment of the present invention, the selection circuit (12) receives a first reference voltage (A) and a second reference voltage (B) having respective voltage values that are different from each other and supplies one of the pairs of first, first reference voltages (A, A), first, second reference voltages (A, B), second, first reference voltages (B, A), second, second reference voltage (B, B) to the first and second terminals T1, T2 so that it can output voltages of four different voltage levels at maximum as shown in FIG. 2. In the instance of FIG. 2, (A, A), (A, B), (B, A) and (B, B) correspond respectively to Vo1, Vo2, Vo3 and Vo4. In the instance of FIG. 3, on the other hand, (A, A), (B, A), (A, B) and (B, B) correspond respectively to Vo1, Vo2, Vo3 and Vo4.

Figures 7, 8:
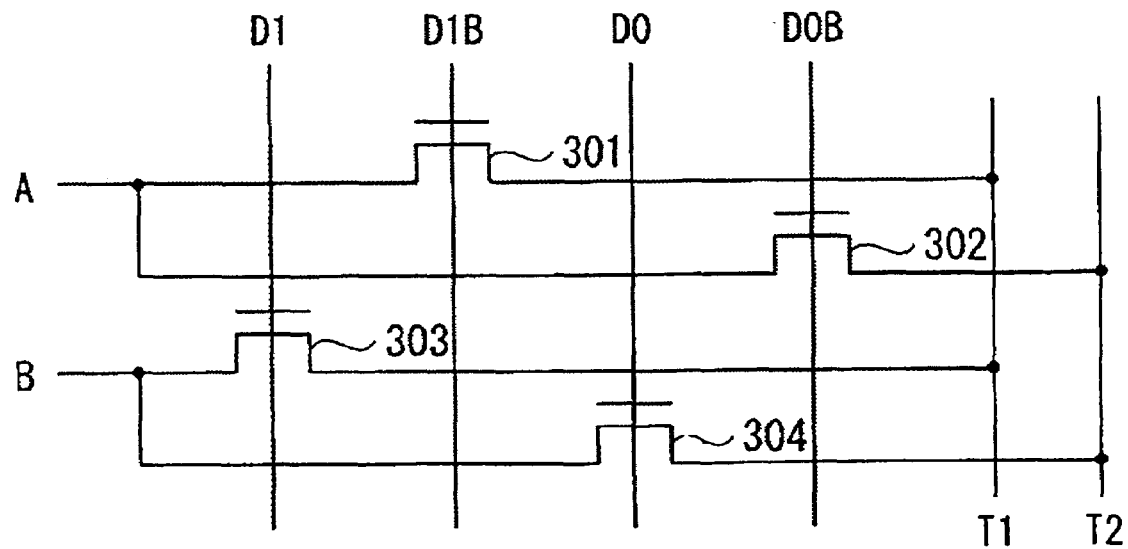
FIG. 7 is a schematic illustration of the correspondence of input and output levels of an embodiment of DAC according to the invention, which is a 2-bit DAC.
FIG. 8 is a schematic circuit diagram of a 2-bit decoder (Nch) for realizing the correspondence relationship of FIG. 7, showing the configuration thereof.

As shown in FIG. 8, the selection circuit (12) may be so arranged as to select the first and second reference voltages according to the total of 2 bits of the first and second signals (D0, D1) that operate as selection signals and output them to the first and second terminals respectively. Then, it comprises:

a first switch (301) connected between the first reference voltage (A) and the first terminal (T) to receive as input the complementary signal (D1B) of the second signal at the control terminal, a second switch (302) connected between the first reference voltage (A) and the second terminal (T2) to receive as input the complementary signal (D0B) of the first signal at the control terminal, a third switch (303) connected between a second reference voltage (B) and the first terminal (T) to receive as input the second signal (D1) at the control terminal, and a fourth switch (304) connected between the second reference voltage (B) and the second terminal (T2) to receive as input the first signal (D0) at the control terminal.

In an embodiment of output circuit according to the invention, it is so arranged that the internal ratio is 1:2 or 2:1 and the sum of double of the input voltage V of the first terminal (T1) and the input voltage V of the second terminal (T2) shows a relationship of being equal to three times of the output voltage (Vout) or the sum of double of the input voltage V of the second terminal (T2) and the input voltage V of the first terminal (T1) shows a relationship of being equal to three times of the output voltage V(out) and the first and second reference voltages A, B are respectively at the first and fourth levels out of the first through fourth voltage levels arranged at regular intervals so that voltages of four levels including the output voltage of the first level due to the selection of the pair of the first, first reference voltages (A, A) through the output voltage of the fourth level due to the selection of the pair of the second, second reference voltages (B, B) are output at the selection circuit (12).

In another embodiment of output circuit according to the invention, it may be so arranged that the selection circuit (12) receives as input first through fourth reference voltages (A, B, C, D) having mutually different voltage values and supplies one of the pairs of

(01) the first, first reference voltages (A, A),
(02) the first, second reference voltages (A, B),
(03) the second, first reference voltages (B, A),
(04) the second, second reference voltages (B, B),
(05) the first, third reference voltages (A, C),
(06) the first, fourth reference voltages (A, D),
(07) the second, third reference voltages (B, C),
(08) the second, fourth reference voltages (B, D),
(09) the third, first reference voltages (C, A),
(10) the third, second reference voltages (C, B),
(11) the fourth, first reference voltages (D, A),
(12) the fourth, second reference voltages (D, B),
(13) the third, third reference voltages (C, C),
(14) the third, fourth reference voltages (C, D),
(15) the fourth, third reference voltages (D, C) and
(16) the fourth, fourth reference voltages (D, D)

selected according to the selection signal to the first and second terminals so that voltages of square of four mutually different voltage levels can be output at maximum.

In this embodiment, the selection circuit may be so arranged as to select the first through fourth reference voltages (A, B, C, D) according to a total of four bits of the first through fourth signals (D0, D1, D2, D3) that operate as selection signal and output them to the first and second terminals (T1, T2). For example, as shown in FIG. 32, it may include:

first and second switches (401, 402) connected between the first terminal (T1) and the first reference voltage (A) supply terminal and adapted to receive as input the complementary signal (D1B) of the second signal and the complementary signal (D3B) of the fourth signal at the respective control terminals, third and fourth switches (403, 404) connected between the second terminal (T2) and the first reference voltage (A) supply terminal and adapted to receive as input the complementary signal (D0B) of the first signal and the complementary signal (D2B) of the third signal at the respective control terminals, fifth and sixth switches (405, 406) connected between the first terminal (T1) and the second reference voltage (B) supply terminal and adapted to receive as input the second signal (D1) and the complementary signal (D3B) of the fourth signal at the respective control terminals, seventh and eighth switches (407, 408) connected between the second terminal (T2) and the second reference voltage (B) supply terminal and adapted to receive as input the first signal (D0) and the complementary signal (D2B) of the third signal at the respective control terminals, ninth and tenth switches (409, 410) connected between the first terminal (T1) and the third reference voltage (C) supply terminal and adapted to receive as input the complementary signal (D1B) of the second signal and the fourth signal (D3) at the respective control terminals, eleventh and twelfth switches (411, 412) connected between the second terminal (T2) and the third reference voltage (C) supply terminal and adapted to receive as input the complementary signal (D0B) of the first signal and the third signal (D2) at the respective control terminals, thirteenth and fourteenth switches (413, 414) connected between the first terminal (T1) and the fourth reference voltage (D) supply terminal and adapted to receive as input the second signal (D1) and the fourth signal (D3) at the respective control terminals and fifteenth and sixteenth switches (415, 416) connected between the second terminal (T2) and the fourth reference voltage (D) supply terminal and adapted to receive as input the first signal (D0) and the third signal (D2) at the respective control terminals;

The third and eleventh switches (403, 411) for commonly inputting the complementary signal (D0B) of the first signal to the control terminals are realized by sharing a single common switch or two switches and the seventh and fifteenth switches (407, 415) for commonly inputting the first signal (D0) to the control terminals are realized by using a single common switch or two switches, while the fifth and thirteenth switches (405, 413) for commonly inputting the second signal (D1) to the control terminals are realized by using a single common switch or two switches and the first and ninth switches (401, 409) for commonly inputting the complementary signal (D1B) of the second signal to the control terminals are realized by using a single common switch or two switches.

Figure 12:
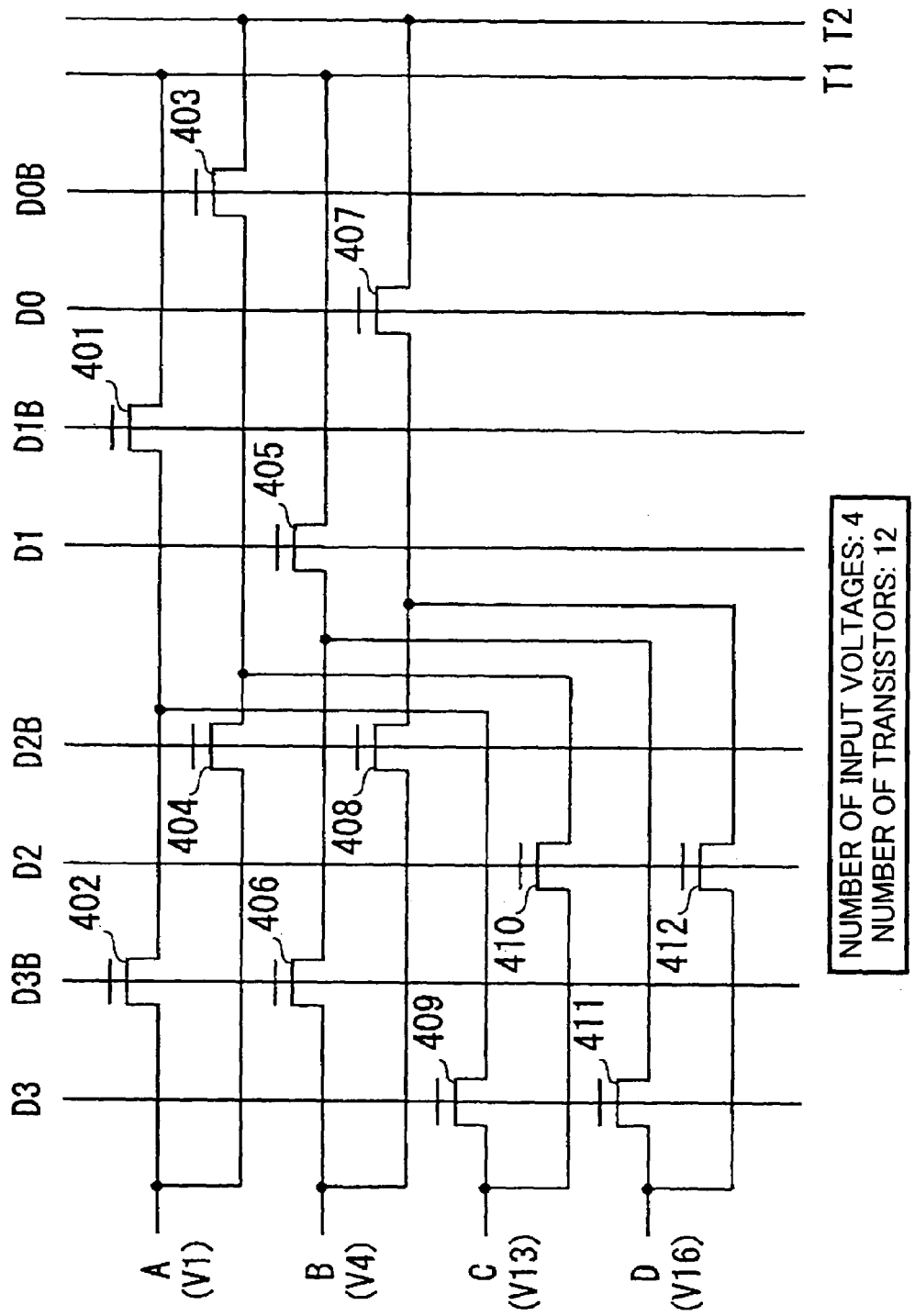
FIG. 12 is a schematic circuit diagram of a 4-bit decoder (Nch) for realizing the correspondence relationship of FIG. 11, showing the configuration thereof.
Figure 32:
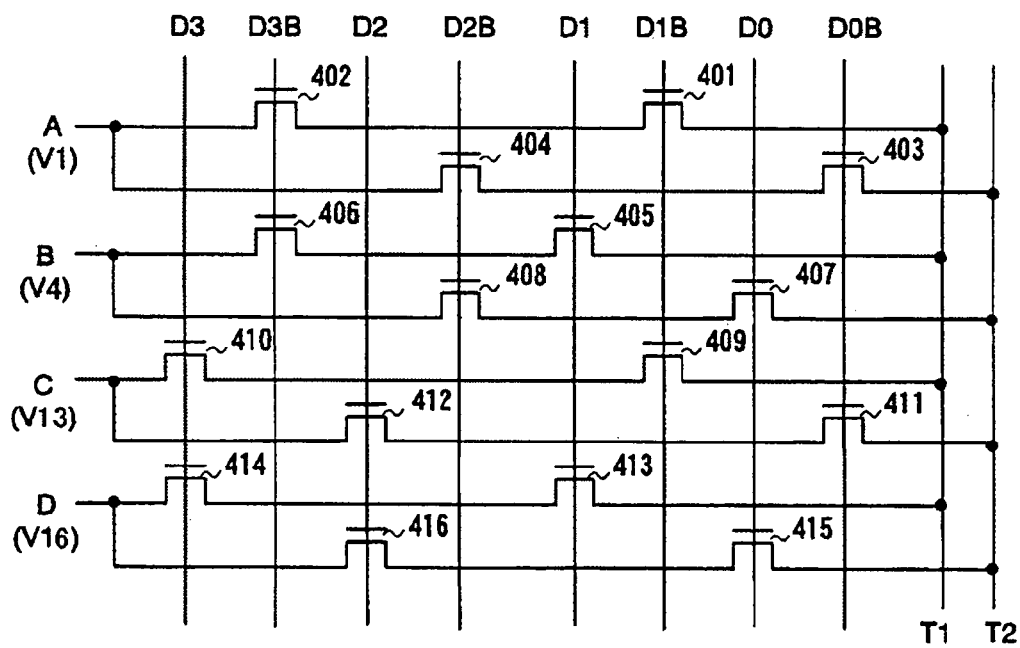
FIG. 32 is a schematic circuit diagram of another 4-bit decoder (Nch) for realizing the correspondence relationship of FIG. 11, showing the configuration thereof.

FIG. 32 illustrates an arrangement where each of the pairs of the third and eleventh switches (403, 411), the seventh and fifteenth switches (407, 415), the fifth and thirteenth switches (405, 413) and the first and ninth switches (401, 409) is realized by using two switches (the number of switching elements is 16). On the other hand, FIG. 12 illustrates an arrangement where each of the pairs is realized by a single common switch (the number of switching elements is 12) to be shared.

In this embodiment, it may be so arranged that the internal ratio is 1:2 or 2:1 and the sum of double of the input voltage of either the first terminal or the second terminal and the input voltage of the other terminal of the first and second terminals shows a relationship of being equal to three times of the output voltage, while the first through fourth reference voltages are respectively at the first, fourth, thirteenth and sixteenth levels out of the first through sixteenth voltage levels arranged at regular intervals so that voltages of a total of sixteen levels including the output voltage of the level due to the selection of the pair of the first, first reference voltages (A, A) through the output voltage of the level due to the selection of the pair of the fourth, fourth reference voltages (D, D) are output at the selection circuit.

In another embodiment of the present invention, it may be so arranged that the intervals of at least a set of adjacently located output voltage levels are different from those of another set of adjacently located output voltage levels for the voltage levels not greater than square of m ($m^2$) that can be output at maximum so that the embodiment may show a non-linear input/output characteristic.

In another embodiment of the present invention, it may be so arranged that the output voltage range defined by the lower limit and the upper limit of output voltage that can be output is divided into a plurality of sections that do not overlap and at least two reference voltages of different levels are provided for each section so that voltages of square of m voltage levels can be output at maximum in each of the sections by means of the plurality of (m) reference voltages.

In an embodiment of display apparatus according to the present invention, the above-described selection circuit (12) operates as decoder circuit and is adapted to receive voltages of a plurality of voltage levels as the plurality of reference voltages from a tone voltage generating circuit (14) for generating a plurality of voltage levels and input digital video data as the selection signal and the above-described amplifier circuit (13) operates as drive circuit for driving the data lines, receiving the output of the decoder circuit.

Embodiments

Now, the present invention will be described by referring to the accompanying drawings that illustrate preferred embodiments of the invention.

FIG. 1 is a schematic block diagram of an embodiment of output circuit according to the invention. Referring to FIG. 1, the output circuit 11 receives m different reference voltages and can output voltages of square of m voltage levels at maximum but actually outputs the voltages selected from them according to a selection signal. The output circuit 11 includes a selection circuit 12 and an amplifier circuit 13 (to be also referred to as "amplifier" or "amp" hereinafter), of which the selection circuit 12 receives m different reference voltages and can output voltages of square of m voltage levels in combination to the two terminals T1, T2 at maximum according to a selection signal. While the amplifier circuit 13 may be so arranged as to be able to output the voltages for interpolating the voltage difference between the voltages of T1 and T2 to an internal ratio of 1:2 or 2:1, an amplifier circuit adapted to output the voltage for interpolating the voltage difference to an internal ratio of 1:2 will be described below for the sake of convenience.

The amplifier circuit 13 outputs the voltage obtained by internally dividing the voltage difference of the two voltages V(T1), V(T2) that are output to the terminals T1, T2 to a ratio of 1:2.

The output circuit 11 of FIG. 1 can be used as DAC (digital/analog converter) when the selection signal is a digital data signal of a plurality of bits. It can be formed with a small number of input voltages relative to the number of voltage levels it can output so as to make itself an area-saving circuit. The supplied plurality of (m) reference voltages are preferably constant voltages that are supplied from the taps of a resistance string (not shown) for dividing a voltage by means of the resistors arranged in series between the first and second voltages (reference voltages) or from the voltage follower adapted to be supplied with voltages divided by the taps.

FIG. 2 is a schematic illustration of the correspondence of the input levels and the output levels, showing the input/output characteristics of the amplifier circuit 13 shown in FIG. 1.

Referring to FIG. 2, the amplifier circuit 13 of FIG. 1 can output voltages of four different voltage levels Vo1, Vo2, Vo3 and Vo4 for two input voltages (A, B). Assume here that the voltages input to the input terminals (T1, T2) are V(T1), V(T2) respectively. Then, if (V(T1), V(T2))=(A, B), the output of the amplifier circuit 13 is obtained by internally dividing the difference of the input voltages (A, B) to 1:2 to make it equal to Vo2. On the other hand, if (V(T1), V(T2)) =(B, A), the output of the amplifier circuit 13 is obtained by internally dividing the difference of the input voltages (B, A) to 1:2 to make it equal to Vo3. If the input voltages V(T1), V(T2) are equal to each other, or (V(T1), V(T2)=(A, A) or (B, B), the output of the amplifier circuit 13 is equal to the input voltage (Vo1 or Vo4). If the input voltages V(T1), V(T2) are equal to each other and the output of the amplifier circuit 13 is equal to the input voltage, the voltage difference of the two input voltages is equal to zero. Then, it is safe to consider that the output voltage that is equal to the input voltage is the 1:2 interpolated voltage for the voltage difference that is equal to zero.

If the amplifier circuit 13 is an amplifier that outputs the voltage obtained by internally dividing the voltage difference of the voltages at T1 and T2 to 2:1, as shown in FIG. 3, it will be appreciated that the input voltages for outputting Vo2 and Vo3 are inverse relative to the input voltages of FIG. 2. Conversely, it is safe to consider that the voltages input to T1 and T2 are inverse relative to the input voltages of FIG. 2. Thus, if the amplifier circuit 13 is an amplifier that outputs the voltage obtained by internally dividing the voltage difference to 2:1, it can be realized by inverting the above-described input voltages at T1 and T2 for 1:2 interpolation. Note that the two extreme voltage levels ((V(T1), V(T2))= (A, A) and (B, B) of the four voltage levels of the voltages output from the amplifier circuit 13 remain unchanged if the internal ratio is switched.

Now, the configuration of the amplifier circuit 13 of FIG. 1 will be specifically described below.

FIG. 4 is a schematic circuit diagram of the amplifier circuit 13 of FIG. 1, showing the configuration thereof. Referring to FIG. 4, amplifier circuit 13 has capacitors C1, C2 that are respectively made hold two input voltages and is adapted to generate internally divided voltages by utilizing the capacity coupling of the capacitors. It comprises a voltage follower A1 that is a differential amplifier having the output end and the inverting input end (−) connected to the output terminal Vout and adapted to output the voltage applied to the non-inverting input end (+) to the output terminal Vout, switches SA1, SB1 connected in series between the input terminal T1 and the non-inverting input end (+) of the voltage follower A1, switches SA2, SB2 connected in series between the input terminal T2 and the non-inverting input end (+) of the voltage follower A1, a capacitor C1 connected between the connection point of the switches SA1, SB1 and the ground GND and a capacitor C2 connected between the connection point of the switches SA2, SB2 and the ground GND. Firstly, as the switches SB1, SB2 are turned OFF and the switches SA1, SA2 are turned ON, the voltages supplied to the input terminals T1, T2 are stored respectively in the capacitors C1, C2 by way of the switches SA1, SA2. Then, as the switches SA1, SA2 are turned OFF and the switches SB1, SB2 are turned ON in the next period, the electric charges are recombined between the capacitors C1, C2. If the capacity ratio of the capacitor C1 to the capacitor C2 is defined as 2:1 in advance, the non-inverting input voltage of the voltage follower A1 is equal to (2×V(T1)+V(T2))/3, or the voltage obtained by internally dividing the voltage difference between the input terminal T1 and the input terminal T2 to 1:2. Thus, the output voltage of the voltage follower A1 is equal to the one obtained by internally dividing the voltage difference between T1 and T2 to 1:2. If, on the other hand, the capacity ratio of the capacitor C1 to the capacitor C2 is defined as 1:2 in advance, the output voltage is equal to the voltage obtained by internally dividing the voltage difference between T1 and T2 to 2:1.

Figure 5:
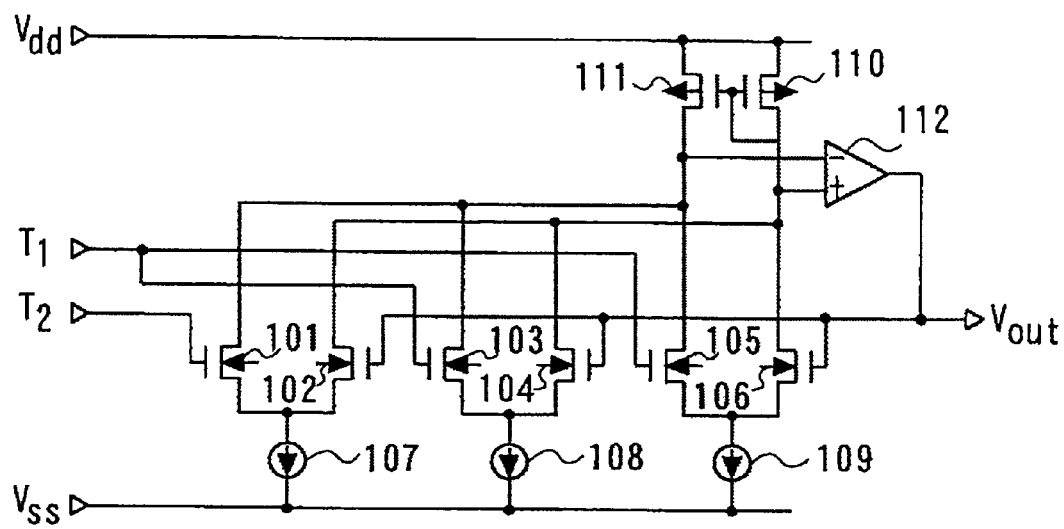
FIG. 5 is a schematic circuit diagram of an alternative amplifier of the embodiment of FIG. 1.
Figure 22:
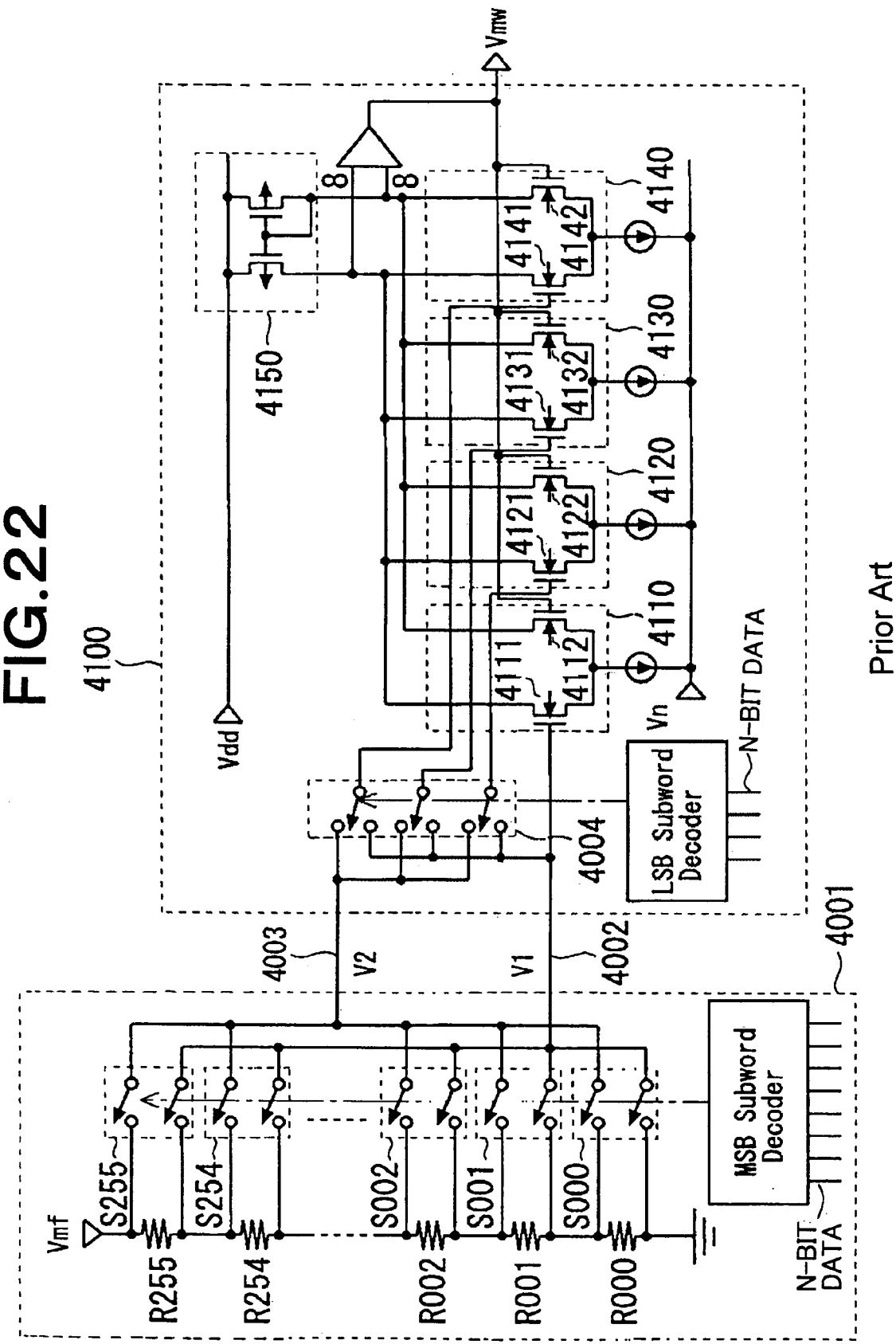
FIG. 22 is a schematic circuit diagram of the DAC of Patent Document 1 (U.S. Pat. No. 6,246,351), showing the configuration thereof.
Figure 23:
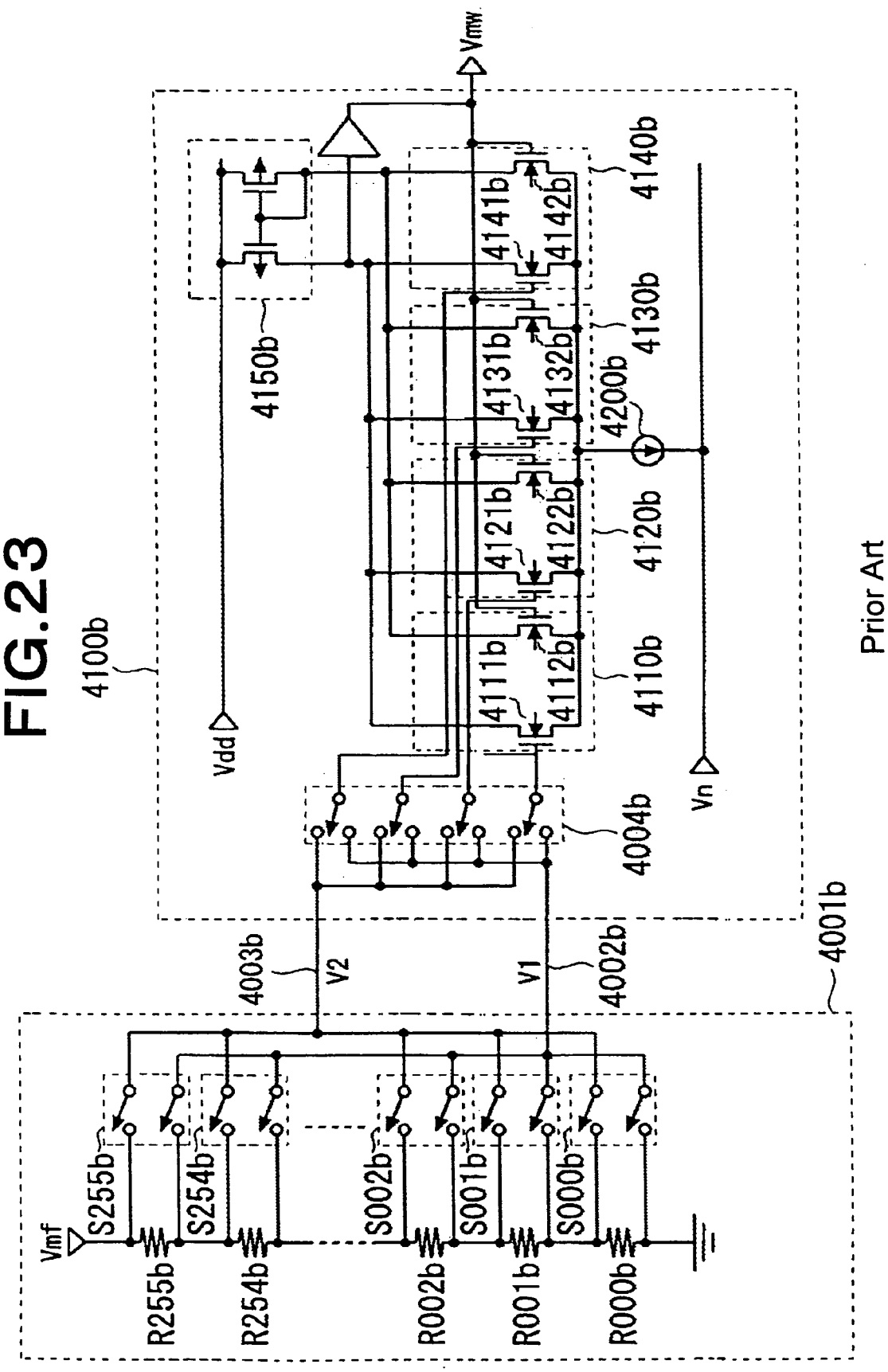
FIG. 23 is a schematic circuit diagram of the DAC of Patent Document 1 (U.S. Pat. No. 5,396,245), showing the configuration thereof.

The amplifier circuit 13 of FIG. 1 may alternatively have a circuit configuration as shown in FIG. 5. This arrangement is comparable to a known interpolation amp section 4100 illustrated in FIG. 22 and can be realized by using three differential pairs and connecting the terminal T1 to the non-inverting inputs of two of the three differential pairs while connecting the terminal T2 to the non-inverting input of the remaining differential pair. With the arrangement of FIG. 22, it is necessary that one of the non-inverting input ends of the three differential pairs is typically fixedly connected to the terminal T1, while the remaining two non-inverting input ends can be connected to either the terminal T1 or the terminal T2 in a switched manner. However, with the arrangement of FIG. 5, each of the non-inverting input ends of the three differential pairs are fixedly connected to the input terminal T1 or the input terminal T2. Referring to FIG. 5, the amplifier circuit 13 comprises the three differential pairs (including one having a pair of transistors 101, 102 and a constant electric current source transistor 107, one having a pair of transistors 103, 104 and a constant electric current source transistor 108 and one having a pair of transistors 105, 106 and a constant electric current source transistor 109) connected commonly to the output pair of a current mirror (including transistors 110, 111) that operates as load circuit and the gates of the transistors 101, 102 that operate as non-inverting input and inverting input of the differential pair (101, 102) are connected to terminal T2 and the output terminal respectively, while the non-inverting input and the inverting input (the gates of the transistors 103, 104) of the differential pair (103, 104) are connected to the terminal T1 and the output terminal respectively and the non-inverting input and the inverting input (the gates of the transistors 105, 106) of the differential pair (105, 106) are also connected to the terminal T1 and the output terminal respectively. The amplifier 112 is adapted to differentially receive as input the voltages at the connection points of the current mirror (110, 111) and the output pairs of the differential pairs and its output end is connected to the output terminal.

Referring to FIG. 5, if the three differential transistor pairs are formed by using transistors of a same size and the electric current sources (107, 108, 109) for driving the respective differential pairs are also of a same type, the voltage obtained by interpolating the voltage difference between V(T1) and V(T2) to 1:2 can be output as output voltage Vout.

In FIG. 5, if the input terminal T1 is connected to one of the non-inverting inputs and the input terminal T2 is connected to the remaining two non-inverting inputs, it is possible to output the voltage obtained by internally dividing the voltage difference between V(T1) and V(, 2) to 2:1.

Figure 6:
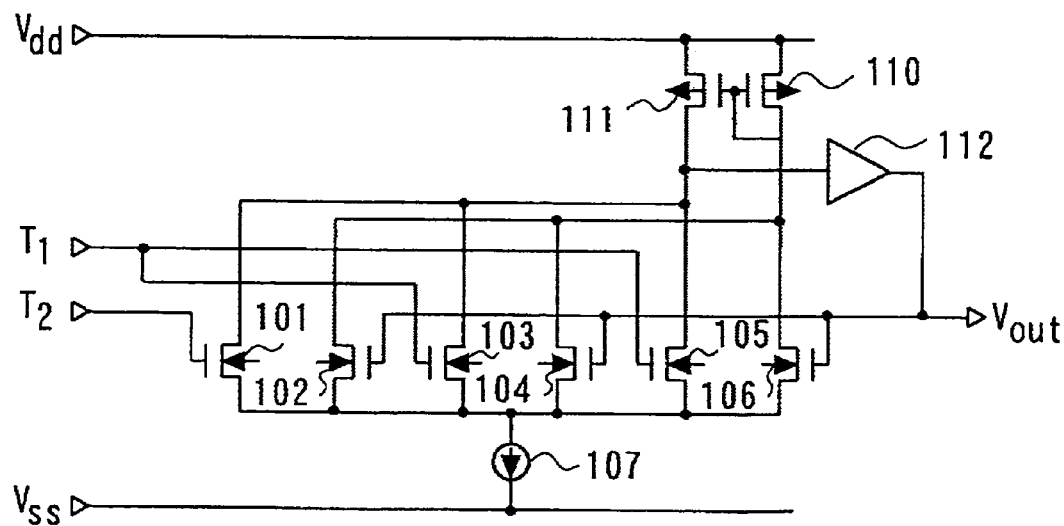
FIG. 6 is a schematic circuit diagram of another alternative amplifier of the embodiment of FIG. 1.

FIG. 6 is a schematic circuit diagram of another alternative amplifier circuit 13 of the embodiment of FIG. 1. Referring to FIG. 6, it will be seen that the amplifier circuit is realized by commonly using a single electric current source for driving the three differential pairs in the configuration shown in FIG. 5. Thus, the three differential pairs are driven by a single common electric current source. With this arrangement, the amplifier circuit of FIG. 6 can output a voltage obtained by internally dividing the difference voltage between V(T1) and V(T2) like the amplifier circuit of FIG. 5 although the accuracy of the output voltage may be degraded slightly. Similarly, if the input terminal T1 is connected to one of the non-inverting inputs and the input terminal T2 is connected to the remaining two non-inverting inputs, it is possible to output the voltage obtained by internally dividing the voltage difference between V(T1) and V(,, 2) to 2:1. In FIG. 6, the input ends of the amplifier 112 are connected to the output ends (drains of the transistors) of the current mirror (110, 111) that operates as a common load circuit for the differential pairs and the output end of the amplifier 112 is connected to the output terminal.

Note that the amplifier circuits illustrated in FIGS. 4 through 6 are only examples and the amplifier circuit of the present invention is by no means limited thereto. In other words, an amplifier circuit having any appropriate circuit configuration may be used for the purpose of the present invention so long as it can output a voltage obtained by interpolating the difference voltage of V(T1) and V(T2).

Now, the DAC (digital/analog converter of FIG. 1) comprising an amplifier circuit 13 that shows an input/output characteristic as illustrated in FIG. 2 will be described below. It will be appreciated that the amplifier circuit 13 is not limited to the circuit configurations of FIGS. 4 through 6 and any amplifier that shows an input/output characteristic as illustrated in FIG. 2 may be applied to the DAC.

Firstly, the decoder that selectively receives as input the two input voltages A, B at the first and second input terminals T1, T2 and outputs voltages of four voltage levels (Vo1 through Vo4) will be explained.

FIG. 7 is a schematic illustration of the input/output correspondence relationship of the 2-bit data input decoder that controls (select) four different combinations of two input voltages (A, B) to the input terminals (T1, T2) as shown in FIG. 2 by means of 2-bit data (D1, D0). The input voltages A, B are defined respectively to be the first and fourth voltage levels of the first through four voltage levels that are arranged at regular intervals. While the input/output correspondence relationship of the 2-bit data input decoder that corresponds to FIG. 3 is not illustrated, it is will be understood by switching V(T1) and V(,, 2) in FIG. 7.

FIG. 8 is a schematic circuit diagram of a 2-bit decoder (Nch) for realizing (controlling) the correspondence relationship of FIG. 7, showing the configuration thereof. Referring to FIG. 8, the decoder circuit comprises transistor switches 301, 302 connected between the voltage A (the supply terminal of the voltage A) and between the terminals T1, T2 and adapted to receive as input data bit signals DIB, D0B at the respective control terminals and transistor switches 303, 304 connected between the voltage B (the supply terminal of the voltage B) and between the terminals T1, T2 and adapted to receive as input data bit signals D1, D0 at the respective control terminals. When, (D1, D0)=(0, 0), (0, 1), (1, 0) or (1, 1), the transistor pair (301, 302), (301, 304), (303, 302) or (303, 304), whichever appropriate, is turned on and the input voltages (A, A), (A, B), (B, A) or (B, B), whichever appropriate, are applied to the terminals T1, T2 respectively, as shown in FIG. 7.

The decoder of FIG. 8 is formed by using only two input voltages and four transistors. Generally, 2-bit decoders (Nch) require four input voltages and at least six transistors. If compared with such decoders, the decoder of FIG. 8 shows a very simple configuration. The bit signals (D1, D0) and their inverted signals may be arranged in any order. While a Pch decoder is not illustrated, such a decoder can be realized easily by arranging it so as to invert the digital data input of the Nch decoder (DX is switched to DXB and DXB is switched to DX (X=0, 1 in FIG. 7).

Figure 9:
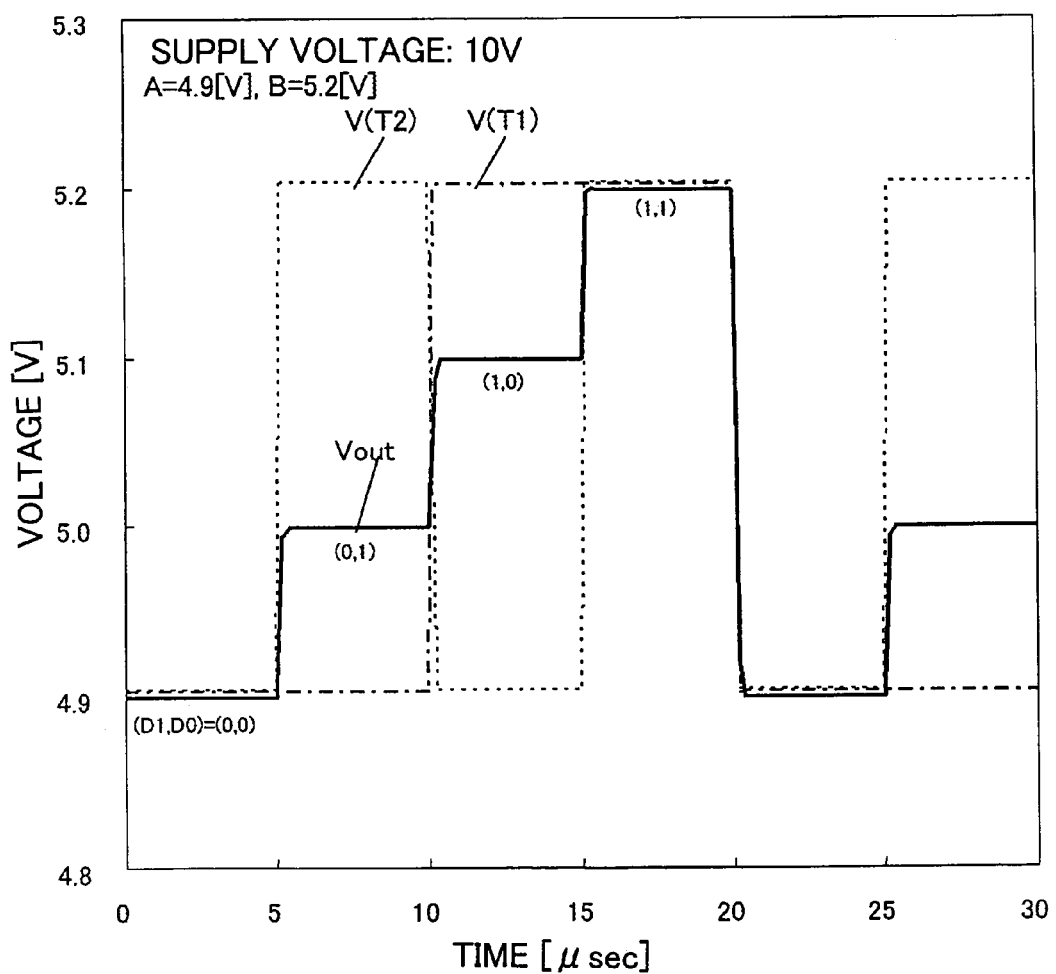
FIG. 9 is a schematic illustration of the output voltage waveform of an embodiment of DAC according to the invention.

FIG. 9 is a schematic illustration of the output voltage waveform of a 2-bit DAC realized by using a decoder circuit in FIG. 8 and a differential amplifier of FIG. 5. FIG. 9 shows the voltages V(T1), V(T2) of the terminals T1, T2 and the output waveform of the output voltage Vout of the differential amplifier that were obtained when the 2-bit data (D1, D0) were shifted so as to be (0, 0)' (0, 1)' (1, 0)' (1, 1) within a predetermined period of time in an experiment. The input voltages (A, B) included A=4.9V and B=5.2V and the levels of the output voltage Vout were differentiated by a voltage difference of 0.1V From FIG. 9, it was confirmed that voltages could be output highly accurately at four levels (4.9V, 5.0V, 5.1V, 5.2V) that were separated at regular intervals of 0.1V.

Now, an embodiment of 4-bit DAC according to the present invention will be described below. If the amplifier circuit 13 can output a voltage highly accurately if the voltage difference between the two input voltages applied to the terminals T1, T2 is large, it is possible to extend the output levels by interpolation not only between the most adjacently located levels of input voltage but also between second and third adjacently located levels of input voltage. By using this idea, it is possible to output voltages at levels equal to square of the number of levels of input voltages. Note that the amplifier circuit 13 preferably can output an interpolation (internally divided) voltage obtained by internally dividing the voltages V(T1), V(T2) input respectively to the terminals T1, T2 to a ratio of 1:2 or 2:1.

FIG. 10 is a schematic illustration of the correspondence of input and output levels when the number of input voltages m that can be input to the amplifier circuit 13 of FIG. 1 is four (m=4). In other words, the embodiment comprises an amplifier circuit 13 adapted to interpolate the voltage difference between the voltages V(T1), V(T2) input to the terminals T1, T2 to a ratio of 1:2 and output the obtained interpolation voltage.

As shown in FIG. 10, the DAC selectively receives as input four input voltages (A, B, C, D) at the input terminals (T1, T2) and can output voltages at voltage levels equal to square of the number of input voltages m=42, or sixteen voltage levels (Vo1 through Vo16). When the amplifier circuit 13 is adapted to output an interpolation (internally divided) voltage obtained by internally dividing the voltage difference between the voltages V(T1) and V(T2) input to the terminals T1, T2 to a ratio of 1:2, it is possible to make the sixteen output voltages separated at regular intervals. Note, however, that the input voltages (A, B, C, D) are so defined as to be at the first (Vo1), the fourth (Vo4), the thirteen (Vo13) and the sixteenth (Vo16) voltage levels for the amplifier circuit 13. Also, note that, T1 and T2 in FIG. 10 are switched when the amplifier circuit 13 is adapted to output an interpolation voltage obtained by internally dividing the voltage difference between the voltages V(T1) and V(T2) input to the terminals T1, T2 to a ratio of 2:1.

FIG. 11 schematically illustrates the correspondence of input and output levels of the 4-bit DAC of FIG. 10 as input/output characteristic. Now, the DAC that selectively receives as input four input voltages (A, B, C, D) at the input terminals (T1, T2) and outputs voltages at voltage levels equal to square of the number of input voltages m=4², or sixteen voltage levels will be described with reference to FIG. 11. The selection of the sixteen combinations of the four input voltages (A, B, C, D) that are selectively input to the input terminals (T1, T2) is controlled by 4-bit data (D3, D2, D1, D0). The level numbers in FIG. 11 can be made to correspond to the voltage levels (Vo1 through Vo16) in FIG. 10. Additionally, the amplifier circuit 13 can output an interpolation (internally divided) voltage obtained by internally dividing the voltage difference between the voltages V(T1) and V(T2) input to the terminals T1, T2 to a ratio of 1:2 and hence make the sixteen output voltages separated at regular intervals.

Then, the first through fourth reference voltages (A, B, C, D) are defined to be at the first, the fourth, the thirteenth and the sixteenth voltage levels. Thus, the selection circuit 12 can select one of the pairs of
(01) the first, first reference voltages (A, A),
(02) the first, second reference voltages (A, B),
(03) the second, first reference voltages (B, A),
(04) the second, second reference voltages (B, B),
(05) the first, third reference voltages (A, C),
(06) the first, fourth reference voltages (A, D),
(07) the second, third reference voltages (B, C),
(08) the second, fourth reference voltages (B, D),
(09) the third, first reference voltages (C, A),
(10) the third, second reference voltages (C, B),
(11) the fourth, first reference voltages (D, A),
(12) the fourth, second reference voltages (D, B),
(13) the third, third reference voltages (C, C),
(14) the third, fourth reference voltages (C, D),
(15) the fourth, third reference voltages (D, C) and
(16) the fourth, fourth reference voltages (D, D)
according to the 4-bit selection signal (D3, D2, D1, D0) and supplies the selected pair to the first and second terminals T1, T2 of the amplifier circuit 13. When the ratio of the internal division of the amplifier circuit 13 is 1:2, the sum of double of the first terminal voltage V(T1) and the second terminal voltage V(T2) is equal to three times of the output voltage Vout and then it is possible to output voltages at the first through sixteenth voltage levels.

If the ratio of internal division of the amplifier circuit 13 is 2:1, it is possible to output voltages exactly at the same voltage levels by inversely defining the input voltages at the terminals T1 and T2. In such a case, the sum of the first terminal voltage V(T1) and double of the second terminal voltage V(T2) is equal to three times of the output voltage Vout and then it is possible to output voltages at the first through sixteenth voltage levels.

FIG. 12 is a schematic circuit diagram of a 4-bit decoder (Nch) for realizing the control arrangement of FIG. 11, showing the configuration thereof. Referring to FIG. 12, the decoder is adapted to divide the four bits into the upper two bits (D3, D2) and the lower two bits (D1, D0) and the lower two bits are commonly shared by the upper two bits so as to reduce the number of transistors. The arrangement of FIG. 12 can be realized by using four input voltages and twelve transistors 401 through 412 (the arrangement of FIG. 32 requires 4 input voltages and sixteen transistors 401 through 416). The bit signals (D3, D2, D1, D0) and their inverted signals may be arranged in any order.

By referring to FIG. 12, it will be seen that the decoder circuit (selection circuit) includes:

first and second switches 401, 402 connected between the first reference voltage (A: level 1) and the first terminal T1 and adapted to receive as input D1B and D3B at the respective control terminals, third and fourth switches 403, 404 connected between the first reference voltage A and the second terminal T2 and adapted to receive as input D0B and D2B at the respective control terminals, fifth and sixth switches 405, 406 connected between the second reference voltage (B: level 4) and the first terminal T1 and adapted to receive as input D1 and D3B at the respective control terminals, seventh and eighth switches 407, 408 connected between the second reference voltage (B) and the second terminal T2 and adapted to receive as input D0 and D2B at the respective control terminals, a ninth switch 409 connected between the third reference voltage (C: level 13) and the connection point of the first and second switches 401, 402 and adapted to receive as input D3 at the control terminal, a tenth switches 410 connected between the third reference voltage (C: level 13) and the connection point of the third and fourth switches 403, 404 and adapted to receive as input D2 at the control terminal, an eleventh switch 411 connected between the fourth reference voltage (D: level 16) and the connection point of the fifth and sixth switches 405, 406 and adapted to receive as input D3 at the control terminal, and a twelfth switch 412 connected between the fourth reference voltage D and the connection point of the seventh and eighth switches 407, 408 and adapted to receive as input D2 at the control terminal.

In other words, the number of transistors is twelve including the transistors 401 through 412.

Figure 13:
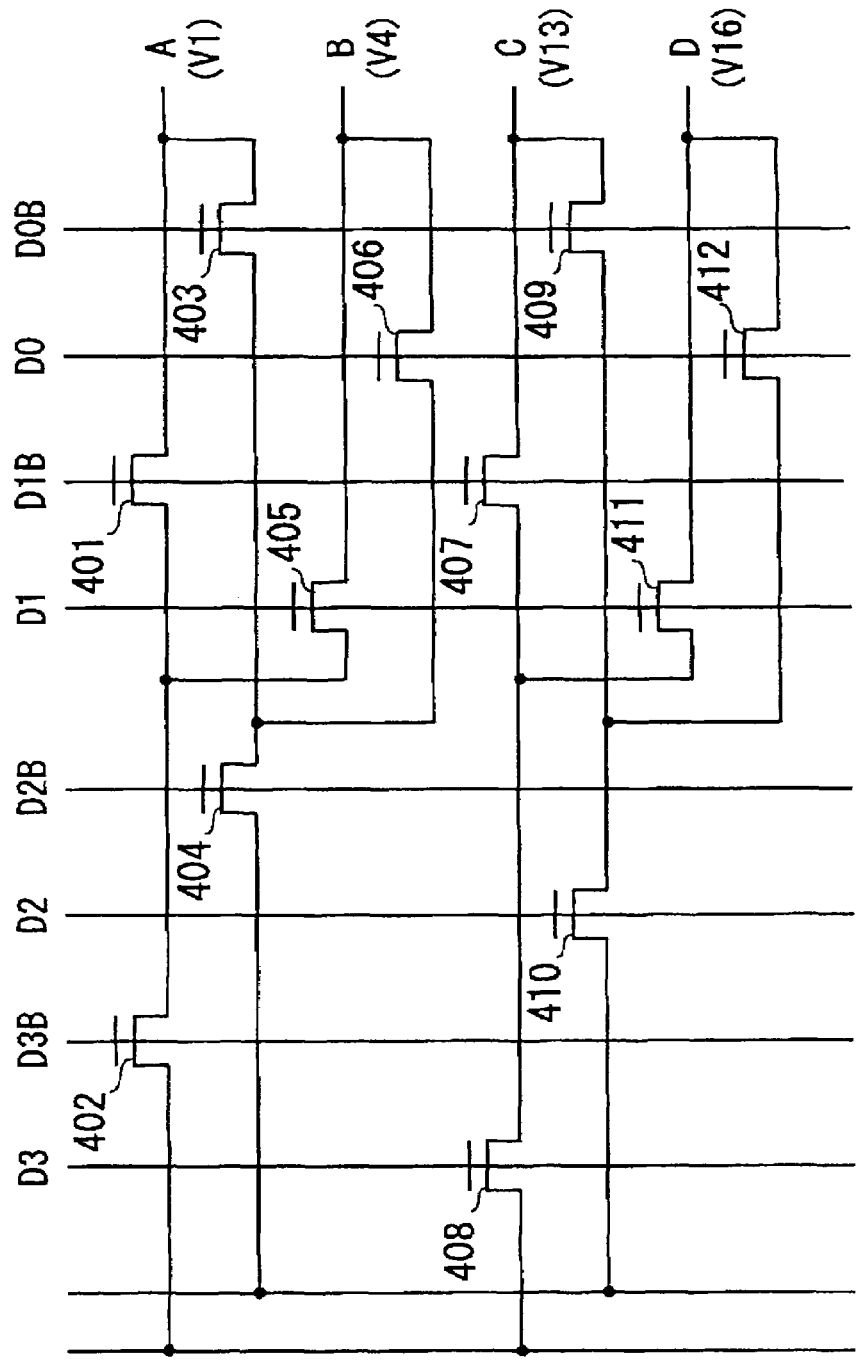
FIG. 13 is a schematic circuit diagram of a 4-bit decoder realized by modifying that of FIG. 12.

FIG. 13 is a schematic circuit diagram of a 4-bit decoder realized by modifying that of FIG. 12. As in the case of FIG. 12, the decoder is adapted to divide the upper two bits (D3, D2) and the lower two bits (D1, D0) and the lower two bits are commonly shared by the upper two bits so as to reduce the number of transistors. By referring to FIG. 13, it will be seen that the decoder circuit (selection circuit) includes:

first and second switches 401, 402 connected between the first reference voltage A (level V1) and the first terminal T1 and adapted to receive as input D1B and D3B at the respective control terminals, third and fourth switches 403, 404 connected between the first reference voltage A and the second terminal T2 and adapted to receive as input D0B and D2B at the respective control terminals, a fifth switch 405 connected between the second reference voltage B (level V4) and the connection point of the first and second switches 401, 402 and adapted to receive as input D1 at the control terminal, a sixth switch 406 connected between the second reference voltage B and the connection point of the third and fourth switches 403, 404 and adapted to receive as input D0 at the control terminal, seventh and eighth switches 407, 408 connected between the third reference voltage C (level V13) and the first terminal T1 and adapted to receive as input D1B and D3 at the respective control terminals, ninth and tenth switches 409, 410 connected between the third reference voltage C and the second terminal T2 and adapted to receive as input D0B and D2 at the respective control terminals, an eleventh switch 411 connected between the fourth reference voltage D (level V16) and the connection point of the seventh and eighth switches 407, 408 and adapted to receive as input D1 at the control terminal, and a twelfth switch 412 connected between the fourth reference voltage D and the connection point of the ninth and tenth switches 409, 410 and adapted to receive as input D0 at the control terminal.

In this case again, the number of transistors is twelve.

Many other alternative arrangements are conceivable for circuit configuration of the decoder and the number of transistors may vary depending on the circuit configuration. However, with any arrangement, the first reference voltage A and the first terminal T1 are connected to each other by way of the two switches for inputting D1B and D3B to the respective control terminals and the first reference voltage A and the second terminal T2 are connected to each other by way of the two switches for inputting D0B and D2B to the respective control terminals, while the second reference voltage B and the first terminal T1 are connected to each other by way of the two switches for inputting D1 and D3B to the respective control terminals and the second reference voltage B and the second terminal T2 are connected to each other by way of the two switches for inputting D0 and D2B to the respective control terminals, whereas the third reference voltage C and the first terminal T1 are connected to each other by way of the two switches for inputting D1B and D3 to the respective control terminals and the third reference voltage C and the second terminal T2 are connected to each other by way of the two switches for inputting D0B and D2 to the respective control terminals, while the fourth reference voltage D and the first terminal T1 are connected to each other by way of the two switches for inputting D1 and D3 to the respective control terminals and the fourth reference voltage D and the second terminal T2 are connected to each other by way of the two switches for inputting D0 and D2 to the respective control terminals.

In the following, typical decoder circuit configurations with a relatively small number of transistors will be described. Additionally, as described above for the modified arrangements of 4-bit decoder by referring to FIGS. 12 and 13, a number of modified arrangements can be prepared so as to connect each of a number of predetermined reference voltages and one of the predetermined terminals (T1 and T2) by way of a plurality of switches for inputting a selection signal to the corresponding respective control terminals.

Figure 21:
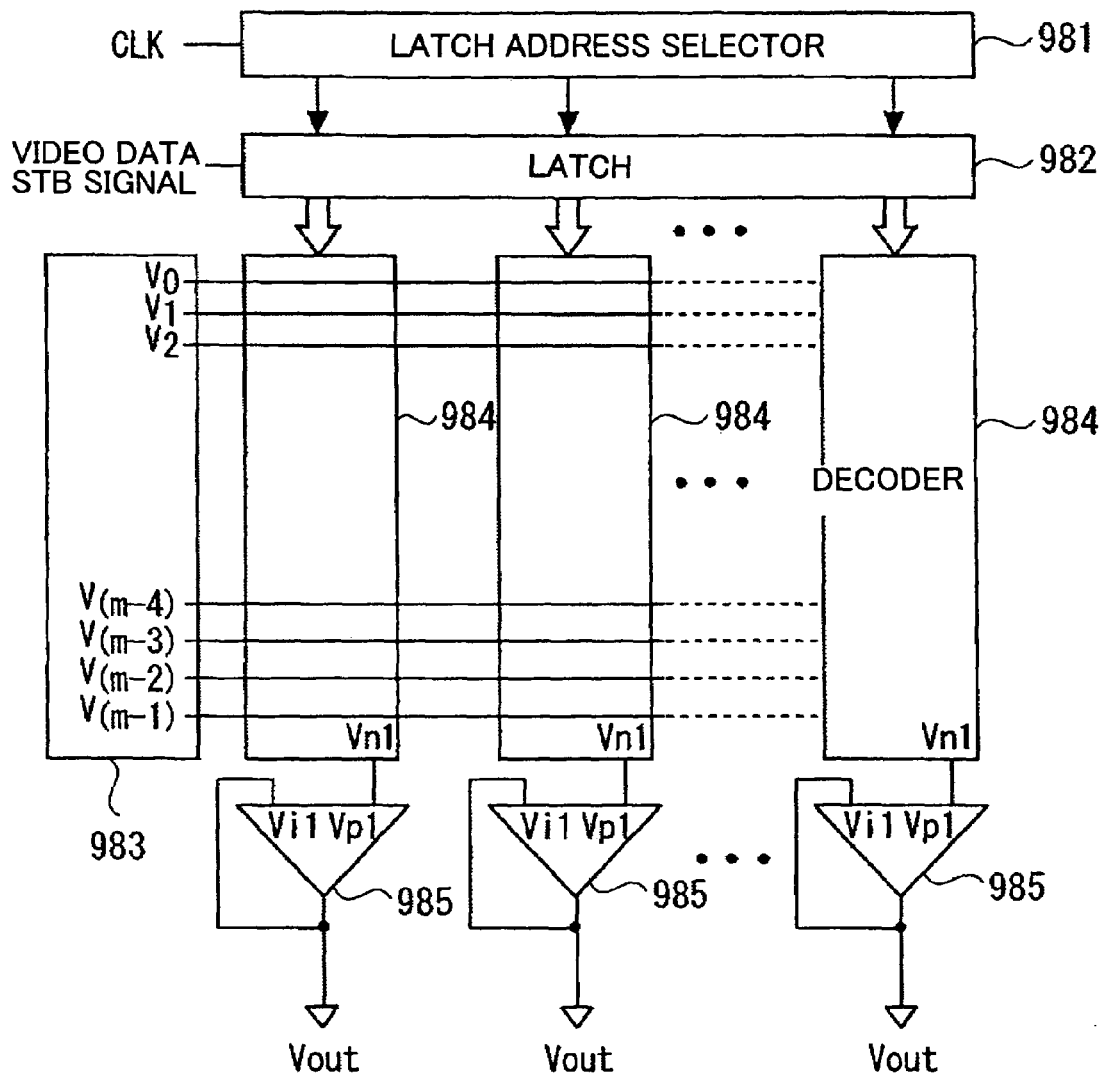
FIG. 21 is a schematic block diagram of a known data driver, showing the configuration thereof.
Figure 24:
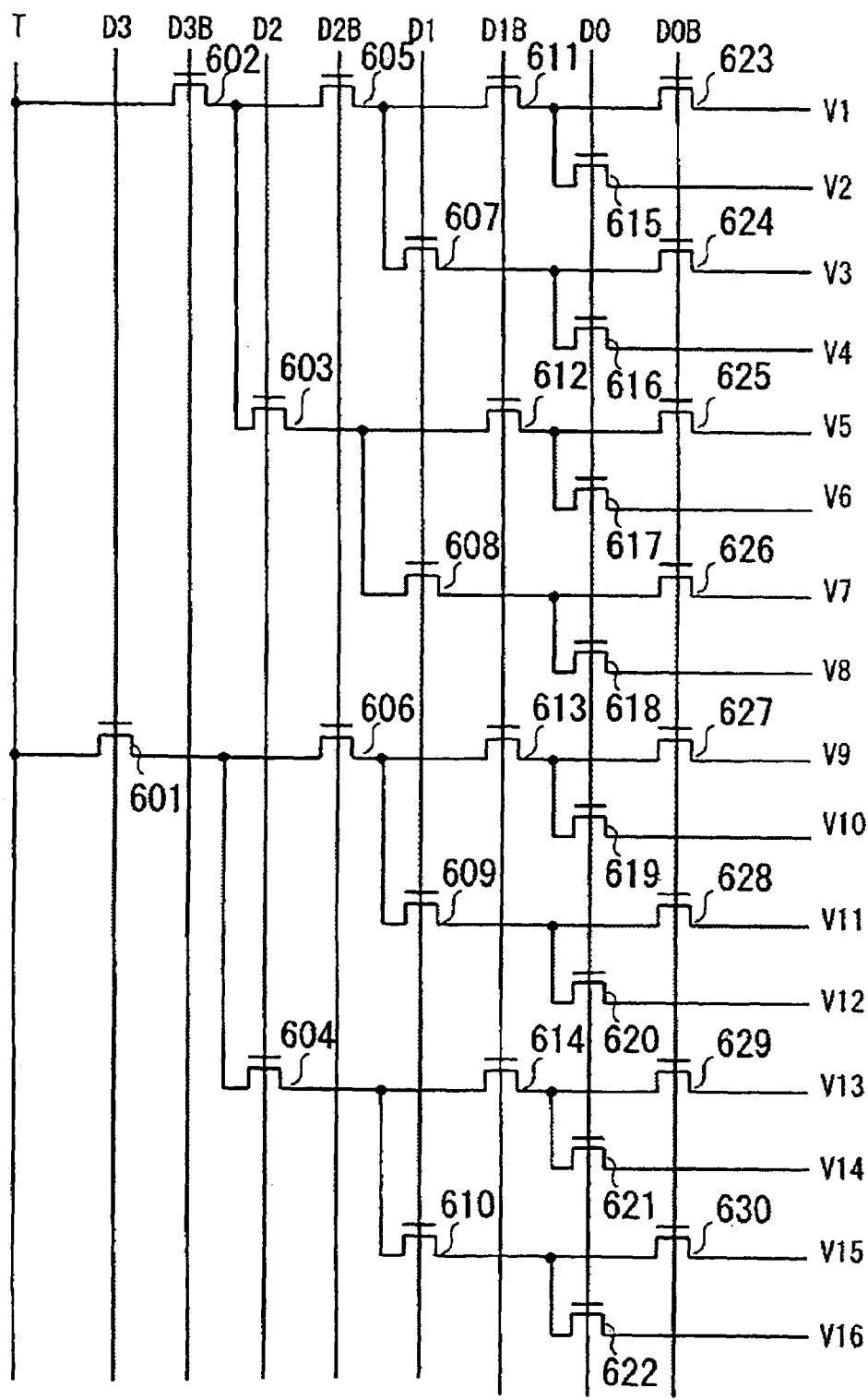
FIG. 24 is a schematic circuit diagram of the decoder 984 of FIG. 21, showing the configuration thereof.

By comparing the 4-bit decoders of FIGS. 12 and 13 with the known decoder shown in FIG. 24 (an exemplar arrangement for the decoder 984 of FIG. 21), it will be appreciated that not only the number of input voltages (the number of reference voltages) is reduced in FIGS. 12 and 13 from the corresponding number in FIG. 24 but also the number of transistors of the decoder circuit is only twelve in FIGS. 12 and 13 relative to thirty in FIG. 24 to realize a remarkable reduction in the number of transistors and a remarkable area-saving effect.

The present invention realizes a remarkable area-saving effect for more than 4-bit decoders as well. Thus, the present invention remarkably simplifies the configuration of the decoder to realize an area-saving effect.

Figure 14:
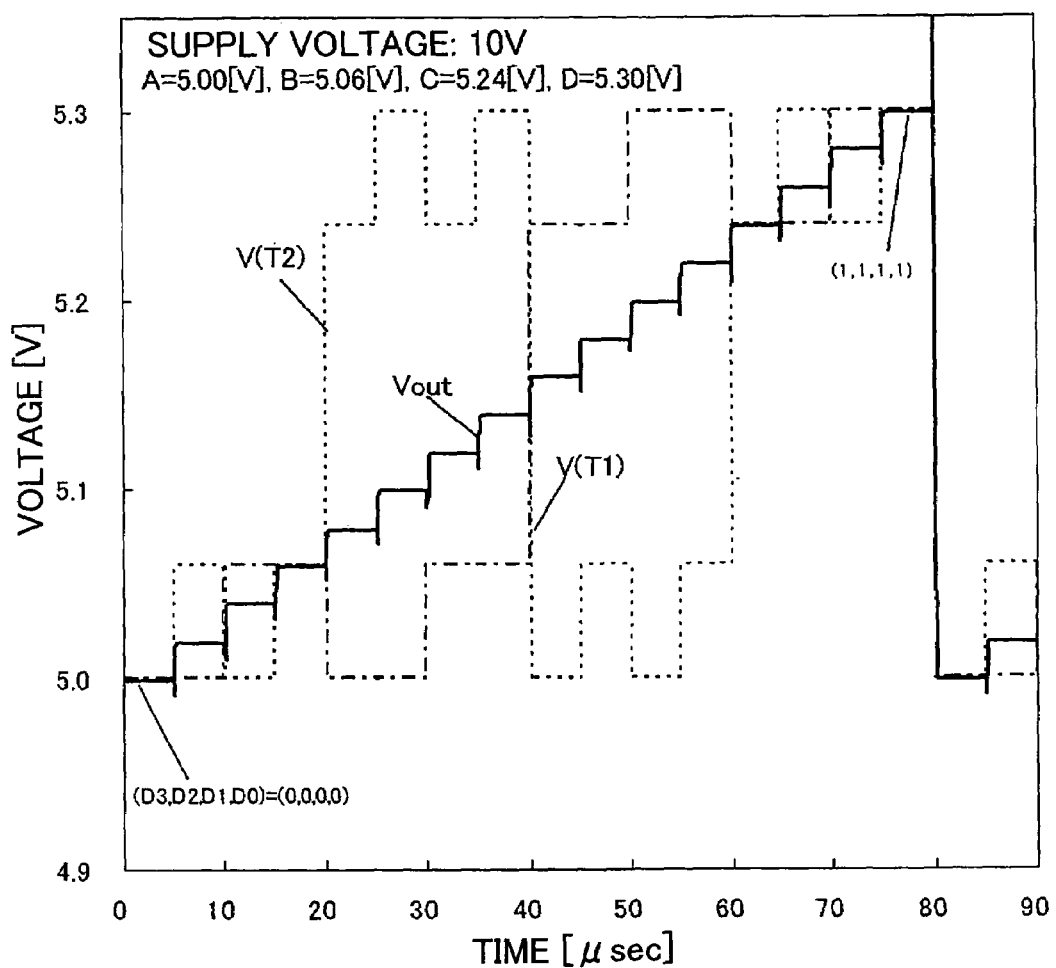
FIG. 14 is a schematic illustration of the output waveform of a 4-bit DAC comprising a decoder as illustrated in FIG. 12 or 13 and a differential amplifier as illustrated in FIG. 5.

FIG. 14 is a schematic illustration of the output voltage waveform of a 4-bit DAC realized by using a decoder circuit as illustrated in FIG. 12 or 13 and a differential amplifier as illustrated in FIG. 5 for the amplifier circuit 13. FIG. 14 shows the voltages V(T1), V(T2) of the terminals T1, T2 and the output waveform of the output voltage Vout of the differential amplifier that were obtained when the 4-bit data (D3, D2 D1, D0) were shifted so as to be (0, 0, 0, 0)' (0, 0, 0, 1)' (0, 0, 1, 0)' ... ' (1, 1, 1, 1) within a predetermined period of time in an experiment. The input voltages (A, B, C, D) were respectively 5.00V, 5.06V, 5.24V and 5.30V and any two adjacent levels of the output voltage Vout were differentiated by a voltage difference of 20 mV. From FIG. 14, it was confirmed that voltages could be output highly accurately at sixteen levels from 5.0V to 5.3V that were separated at regular intervals of 20 mV in accordance with 4-bit data from (0, 0, 0, 0) to (1, 1, 1, 1).

Now, an embodiment of 6-bit DAC according to the present invention will be described below. FIG. 15 schematically illustrates the correspondence of input and output levels of the 6-bit DAC of FIG. 15 as input/output characteristic. Now, the DAC that selectively receives two (which may be same) out of eight input voltages (A, B, C, D, E, F, G, H) and outputs voltages at voltage levels equal to square of eight, or the number of input voltages, or sixty four voltage levels to the input terminals (T1, T2) will be described in greater detail below. The selection of the sixty four combinations of the eight input voltages (A, B, C, D, E, F, G, H) that are selectively input to the input terminals (T1, T2) is controlled by 6-bit data (D5, D4, D3, D2, D1, D0). The level numbers in FIG. 11 can be made to correspond to the voltage levels (Vo1 through Vo16) in FIG. 10. Additionally, the amplifier circuit 13 can output an interpolation (internally divided) voltage obtained by internally dividing the voltage difference between the voltages V(T1) and V(T2) input to the terminals T1, T2 to a ratio of 1:2 and hence make the sixty four output voltages separated at regular intervals. Note, however, that the input voltages (A, B, C, D, E, F, G, H) are so defined as to be at the first, the fourth, the thirteenth, the sixteenth, the forty ninth, the fifty second, the sixty first and the sixty fourth voltage levels for the amplifier circuit 13. Also note that T1 and T2 in FIG. 10 are switched when the amplifier circuit 13 is adapted to output an interpolation voltage obtained by internally dividing the voltage difference between the voltages V(T1) and V(T2) input to the terminals T1, T2 to a ratio of 2:1.

Then, the eight reference voltages A through H are defined to be at the first, the fourth, the thirteenth, the sixteenth, the fourth ninth, the fifty second, the sixty first and the sixty fourth voltage levels. Thus, the selection circuit (decoder circuit) 12 can select one of the pairs of

(01) the first, first reference voltages (A, A),
(02) the first, second reference voltages (A, B),
(03) the second, first reference voltages (B, A),
(04) the second, second reference voltages (B, B),
(05) the first, third reference voltages (A, C),
(06) the first, fourth reference voltages (A, D),
(07) the second, third reference voltages (B, C),
(08) the second, fourth reference voltages (B, D),
(09) the third, first reference voltages (C, A),
(10) the third, second reference voltages (C, B),
(11) the fourth, first reference voltages (D, A),
(12) the fourth, second reference voltages (D, B),
(13) the third, third reference voltages (C, C),
(14) the third, fourth reference voltages (C, D),
(15) the fourth, third reference voltages (D, C),
(16) the fourth, fourth reference voltages (D, D),
(17) the first, fifth reference voltages (A, E),
(18) the first, sixth reference voltages (A, F),
(19) the second, fifth reference voltages (B, E),
(20) the second, sixth reference voltages (B, F),
(21) the first, seventh reference voltages (A, G),
(22) the first, eighth reference voltages (A, H),
(23) the second, seventh reference voltages (B, G),
(24) the second, eighth reference voltages (B, H),
(25) the third, fifth reference voltages (C, E),
(26) the third, sixth reference voltages (C, F),
(27) the fourth, fifth reference voltages (D, E),
(28) the fourth, sixth reference voltages (D, F),
(29) the third, seventh reference voltages (C, G),
(30) the third, eighth reference voltages (C, H),
(31) the fourth, seventh reference voltages (D, G),
(32) the fourth, eighth reference voltages (D, H),
(33) the fifth, first reference voltages (E, A),
(34) the fifth, second reference voltages (E, B),
(35) the sixth, first reference voltages (F, A),
(36) the sixth, second reference voltages (F, B),
(37) the fifth, third reference voltages (E, C),
(38) the fifth, fourth reference voltages (E, D),
(39) the sixth, third reference voltages (F, C),
(40) the sixth, fourth reference voltages (F, D),
(41) the seventh, first reference voltages (G, A),
(42) the seventh, second reference voltages (G, B),
(43) the eighth, first reference voltages (H, A),
(44) the eighth, second reference voltages (H, B),
(45) the seventh, third reference voltages (G, C),
(46) the seventh, fourth reference voltages (G, D),
(47) the eighth, third reference voltages (H, C),
(48) the eighth, fourth reference voltages (H, D),
(49) the fifth, fifth reference voltages (E, E),
(50) the fifth, sixth reference voltages (E, F),
(51) the sixth, fifth reference voltages (F, E),
(52) the sixth, sixth reference voltages (F, F),
(53) the fifth, seventh reference voltages (E, G),
(54) the fifth, eighth reference voltages (E, H),
(55) the sixth, seventh reference voltages (F, G),
(56) the sixth, eighth reference voltages (F, H),
(57) the seventh, fifth reference voltages (G, E),
(58), the seventh, sixth reference voltages (G, F),
(59) the eighth, fifth reference voltages (H, E),
(60), the eighth, sixth reference voltages (H, F),
(61) the seventh, seventh reference voltages (G, G),
(62) the seventh, eighth reference voltages (G, H),
(63) the eighth, seventh reference voltages (H, G) and
(64) the eighth, eighth reference voltages (H, H)

according to the 6-bit data signal (selection signal) and supplies the selected pair to the first and second terminals T1, T2 of the amplifier circuit 13. When the ratio of the internal division of the amplifier circuit 13 is 1:2, the sum of double of the first terminal voltage V(T1) and the second terminal voltage V(T2) is equal to three times of the output voltage Vout and then it is possible to output voltages at the first through sixty fourth voltage levels. If the ratio of internal division of the amplifier circuit 13 is 2:1, it is possible to output voltages exactly at the same voltage levels by inversely defining the input voltages at the terminals T1 and T2 shown in FIG. 15. In such a case, the sum of the first terminal voltage V(T1) and double of the second terminal voltage V(T2) is equal to three times of the output voltage Vout and then it is possible to output voltages at the first through sixty fourth voltage levels.

Figure 16:
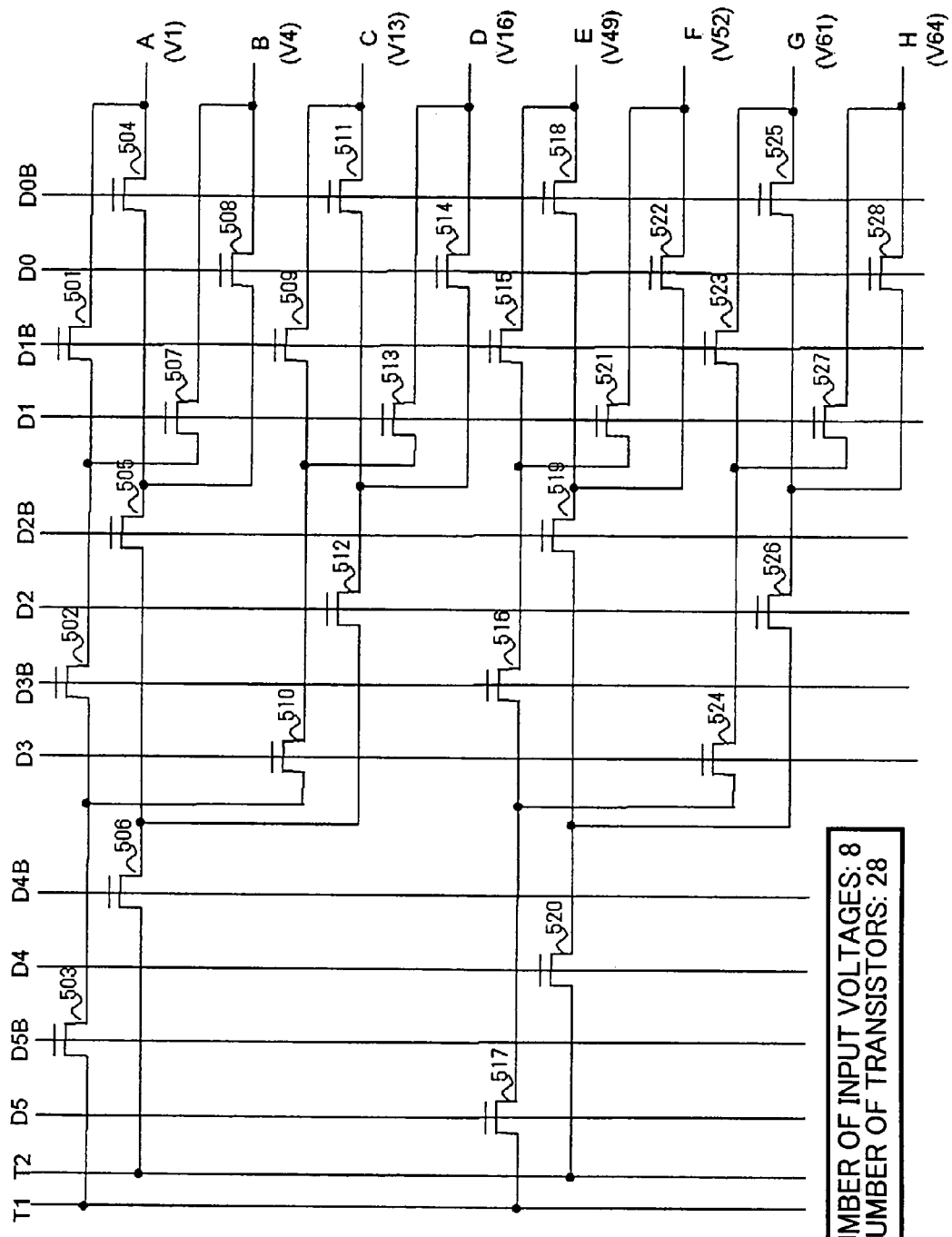
FIG. 16 is a schematic circuit diagram of a 6-bit decoder (Nch) for realizing the correspondence relationship of FIG. 15, showing the configuration thereof.

FIG. 16 is a schematic circuit diagram of a 6-bit decoder (Nch) for realizing the control arrangement of FIG. 15, showing the configuration thereof. Referring to FIG. 16, the decoder is adapted to divide six bits into two bits of (D5, D4), two bits of (D3, D2) and two bits of (D1, D0) and the lower bits are commonly shared by the upper bits so as to reduce the number of transistors. By referring to FIG. 16, it will be seen that the decoder circuit (selection circuit) includes:

first through third switches 501 through 503 connected between the first reference voltage A (V1) and the first terminal T1 and adapted to receive as input D1B, D3B and D5B at the respective control terminals, fourth through sixth switches 504 through 506 connected between the first reference voltage A and the second terminal T2 and adapted to receive as input D0B, D2B and D4B at the respective control terminals, a seventh switch 507 connected between the second reference voltage B (V4) and the connection point of the first and second switches 501, 502 and adapted to receive as input D1 at the control terminal, an eighth switch 508 connected between the second reference voltage B and the connection point of the fourth and fifth switches 504, 505 and adapted to receive as input D0 at the control terminal, ninth and tenth switches 509, 510 connected between the third reference voltage C (V13) and the connection point of the second and third switches 502, 503 and adapted to receive as input D1B and D3 at the respective control terminal, eleventh and twelfth switches 511, 512 connected between the third reference voltage C and the connection point of the fifth and sixth switches 505, 506 and adapted to receive as input D0B and D2 at the respective control terminal, a thirteenth switch 513 connected between the fourth reference voltage D (V16) and the connection point of the ninth and tenth switches 509, 510 and adapted to receive as input D1 at the control terminal, a fourteenth switch 514 connected between the fourth reference voltage D and the connection point of the eleventh and twelfth switches 511, 512 and adapted to receive as input D0 at the control terminal, fifteenth through seventeenth switches 515 through 517 connected between the fifth reference voltage E (V49) and the first terminal T1 and adapted to receive as input D1B, D3B and D5B at the respective control terminals, eighteenth through twentieth switches 518 through 520 connected between the fifth reference voltage E and the second terminal T2 and adapted to receive as input D0B, D2B and D4 at the respective control terminals, a twenty first switch 521 connected between the sixth reference voltage F (V52) and the connection point of the fifteenth and sixteenth switches 515, 516 and adapted to receive as input D1 at the control terminal, a twenty second switch 522 connected between the sixth reference voltage F and the connection point of the eighteenth and nineteenth switches 518, 519 and adapted to receive as input D0 at the control terminal, twenty third and twenty fourth switches 523, 524 connected between the seventh reference voltage G (V61) and the connection point of the sixteenth and seventeenth switches 516, 517 and adapted to receive as input D1B and D3 at the respective control terminals, twenty fifth and twenty sixth switches 525, 526 connected between the seventh reference voltage G and the connection point of the nineteenth and twentieth switches 519, 520 and adapted to receive as input D0B and D2 at the respective control terminals, a twenty seventh switch 527 connected between the eighth reference voltage H (V64) and the connection point of the twenty third and twenty fourth switches 523, 524 and adapted to receive as input D1 at the control terminal and a twenty eighth switch 528 connected between the eighth reference voltage H and the connection point of the twenty fifth and twenty sixth switches 525, 526 and adapted to receive as input D0 at the control terminal.

The arrangement of FIG. 16 can be realized by using eight input voltages A through H (V1, V4, V13, V16, V49, V52, V61, V64) and twenty eight transistors 501 through 528. The bit signals (D5, D4, D3, D2 D1, D0) and their inverted signals may be arranged in any order. Additionally, the arrangement of FIG. 16 may be modified in various different ways so long each of the predetermined reference voltages and either of the predetermined terminals (T1 or T2) are connected by way of a plurality of switches, each of which is adapted to receive a signal at the control terminal as shown in FIG. 16.

Figure 17:
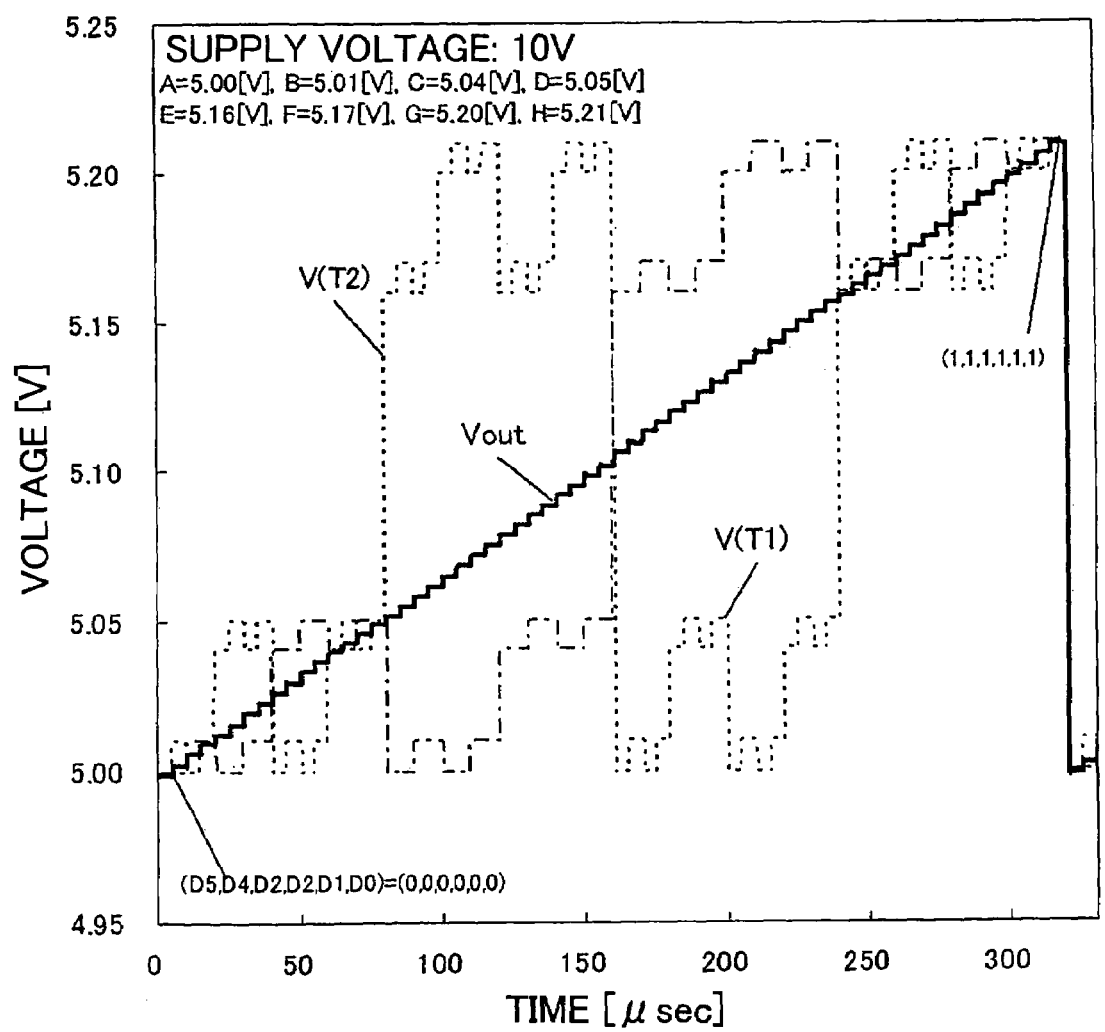
FIG. 17 is a schematic illustration of the output waveform of a 6-bit DAC comprising a decoder as illustrated in FIG. 16 and a differential amplifier as illustrated in FIG. 5.

FIG. 17 is a schematic illustration of the output voltage waveform of a 6-bit DAC realized by using a decoder circuit as illustrated in FIG. 16 and a differential amplifier as illustrated in FIG. 5 for the amplifier circuit 13 of FIG. 1. FIG. 17 shows the voltages V(T1), V(T2) of the terminals T1, T2 and the output waveform of the output voltage Vout of the differential amplifier that were obtained when the 6-bit data (D5, D4, D3, D2 D1, D0) were shifted so as to be (0, 0, 0, 0, 0, 0)' (0, 0, 0, 0, 0, 1)' (0, 0, 0, 0, 1, 0)' . . . ' (1, 1, 1, 1, 1, 1) within a predetermined period of time in an experiment. The input voltages (A, B, C, D, E, F, G, H) were respectively 5.00V, 5.01V, 5.04V, 5.05V, 5.16V, 5.17V, 5.20V and 5.21V and any two adjacent levels of the output voltage Vout were differentiated by a voltage difference of 3.3 mV. From FIG. 17, it was confirmed that voltages could be output highly accurately at sixty four levels from 5.01V to 5.21V that were separated at regular intervals of 3.3 mV.

DACs adapted to receive input data of two, four and six bits and output voltages at voltage levels, the number of which is equal to square of the number of input voltages are described above. While any number of input voltages may be used for the purpose of the present invention, it is preferable to select a K-th power of 2 (K-th power of m=2, where K is an integer not smaller than 1) for the number of voltages m. Thus, m will be selected from 2, 4, 8 and so on. Then, the square of the number of input voltages ($2^K$) ($=4^K$) consecutive output levels (1st through $4^K$-th levels) are selectively used by means of a digital data of 2K bits and each of the input voltages is set to the level defined by formula (1) below:

$$\{1+a1\times 4^{(K-1)}+a2\times 4^{(K-2)}+a3\times 4^{(K-3)}+ \ldots +ak\times 4^{(K-K)}\} \quad (1)$$

where coefficients a1, a2, a3, . . . , ak are 0 or 3.

If K=1, the number of input voltages m is m=2 and the two input voltages take the {1+a1} levels (a1=0, 3) out of the consecutive four output levels (level 1 through level 4). In other words, the input voltages A, B are at levels 1 and 4 as shown in FIG. 7.

If K=2, the number of input voltages m is m=4 and the four input voltages take the {1+a1×4+a2} levels (a1, a2=0, 3) out of the consecutive sixteen output levels. In other words, the four input voltages A, B, C, D are at level 1(a1=a2=0), level 4 (a1=0, a2=3), level 13 (a1=3, a2=3).

If K=3, the number of input voltages m is m=8 and the eight input voltages take the {1+a1×4+a2×16+a3} levels (a1, a2, a3=0, 3) out of the consecutive sixteen four output levels. In other words, the eight input voltages A, B, C, D, E, F, G, H are at levels 1, 4, 13, 16, 49, 52, 61, 64 that correspond to the combinations of coefficients (a1, a2, a3)=(0, 0, 0), (0, 0, 3), (0, 3, 0), (0, 3, 3), (3, 0, 0), (3, 0, 3), (3, 3, 0), (3, 3, 3).

Thus, it will be seen that the DACs adapted to receive input data of two, four and six bits (FIG. 7, FIG. 11, FIG. 15) show the input voltage levels as defined above. This statement holds true when K=4 or greater than 4.

If the number of input voltages is not equal to the K-th power of 2, it is possible to output voltages at levels of square of the number of input voltages. However, it is rather difficult to define regular output levels.

Any of the above-described embodiments can be applied to a liquid crystal driving DAC (digital/analog conversion circuit). More specifically, a liquid crystal driving DAC is required to adjust the intervals of tone voltages according to a gamma curve. While a gamma curve has a substantially straight part for intermediate tones, the gradient changes remarkably at and near the highest tone and also at and near the lowest tone. Therefore, it is possible to realize decoder by appropriately combining decoders. For example, a decoder with four input voltages (to divide by 16) or a decoder with eight input voltages (to divide by 64) may be used for intermediate tones where the tone characteristic shows a straight line and a decoder with a smaller divisor such as a decoder with two input voltage (to divide by 4) may be used at and near the highest tone and at and near the lowest tone where the tone characteristic shows a curb.

Figure 18:
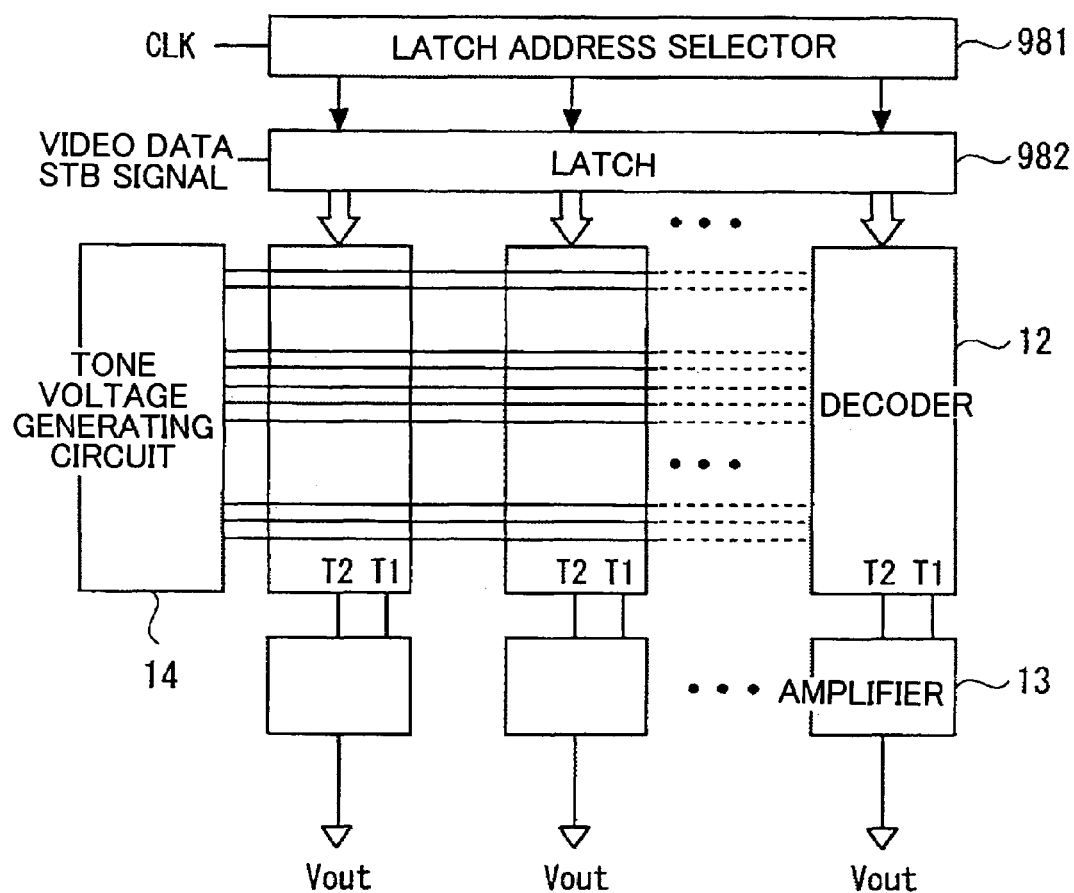
FIG. 18 is a schematic block diagram of a data driver realized by applying an embodiment of the invention, showing the configuration thereof.
Figure 19:
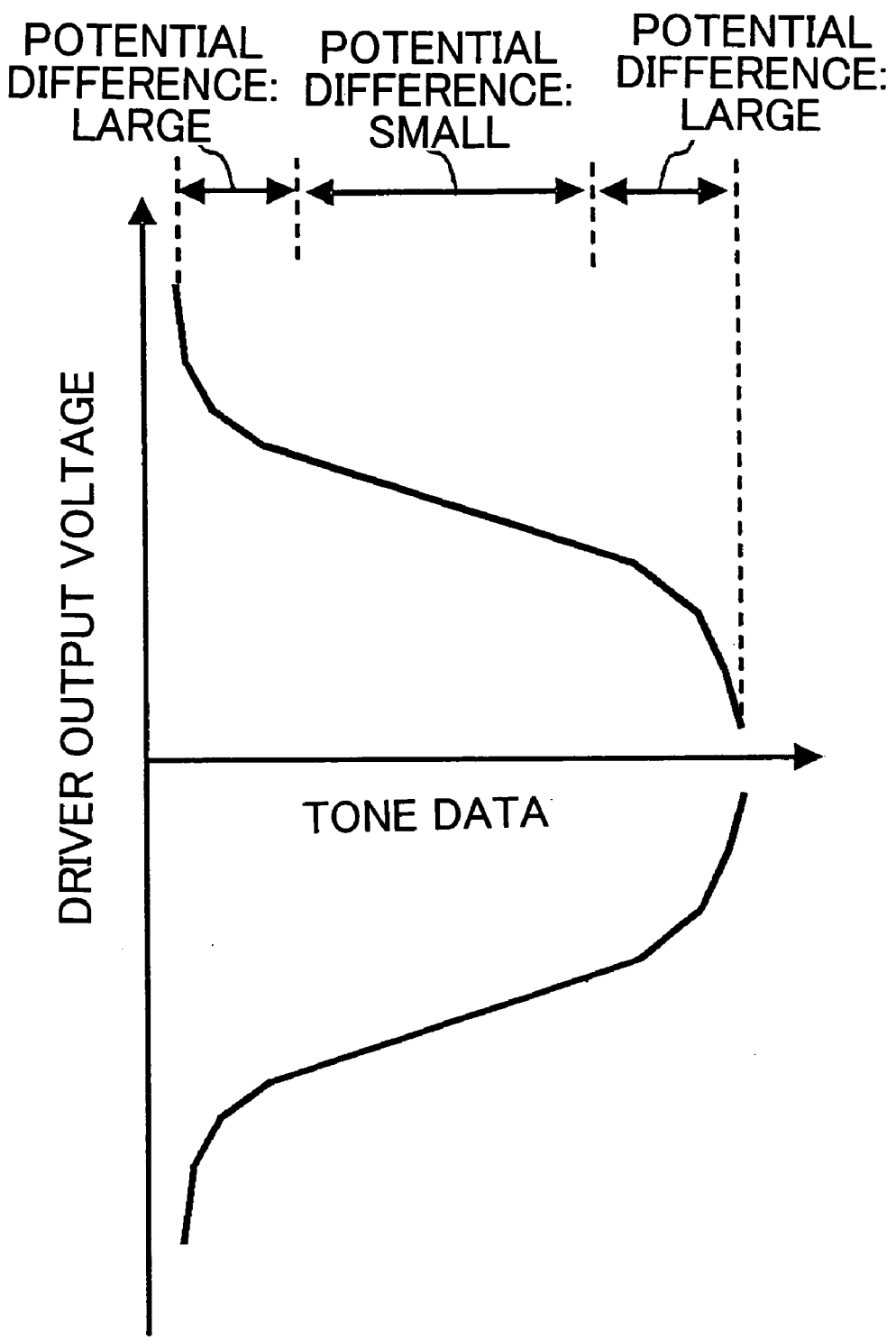
FIG. 19 is a graph illustration the output voltage characteristic of the data driver of FIG. 18.

FIG. 18 is a schematic block diagram of a data driver realized by applying the invention and adapted to be used typically for a liquid crystal display apparatus, showing the configuration thereof. Referring to FIG. 18, the data driver comprises a decoder 12 and an amplifier circuit (amplifier) 13 realized by applying the present invention. The circuit blocks such as the latch address selector and the latch are the same as those illustrated in FIG. 21, which are described earlier. In the arrangement of FIG. 18, the present invention is applied to the entire DAC or a part thereof responsible for intermediate tones so that the configuration of the amplifier is not required to be altered if the divisor is raised. Thus, it is possible to remarkably reduce the number of transistors necessary for forming the decoder 12 and hence save area for the entire data driver. The tone voltage generating circuit 14 generates reference voltages as described above for the above embodiments. Therefore, the number of voltages that the tone voltage generating circuit 14 needs to generate is remarkably reduced.

The tone voltage generating circuit 14 may be entirely or partly arranged outside the data driver. When the present invention is applied to a DAC, it is desirable that the plurality of reference voltages to be input to a single section may be arranged linearly for tone values. The reason for this will be described below. In the instance of the arrangement of FIG. 11, in a section where the number of reference voltages is four and voltages are output at sixteen levels, all of the sixteen output voltage levels are linearly arranged if the reference voltages are arranged linearly relative to tone values because the sixteen output voltage levels are defined arithmetically on the basis of the reference voltages. If, on the other hand, the reference voltages are not arranged linearly, the sixteen output voltage levels are not arranged linearly and, what is worse, tones can be inverted depending on the circumstances. Such a problem is fatal to the drive circuit of a display apparatus. Therefore, it is desirable to arrange reference voltages linearly relative to tone values. In the case of a liquid crystal data driver that is required to operate for adjustment according to a gamma curve, it is desirable that the tone voltage generating circuit 14 adjusts the tone voltages so as to make them match the opposite ends of a section. If a voltage is adjusted so as to make it match an intermediate level of a section, the reference voltages input to the section are not arranged linearly to give rise to the above identified problem.

While a differential amplifier and a DAC realized by using a difference amplifier according to the invention are described above by way of preferred embodiments, a differential amplifier and a DAC according to the invention do no necessarily have to be realized as an LSI circuit formed on a silicon substrate. They may alternatively be realized by means of thin film transistors that do no have a back gate and are formed on a insulating substrate typically made of glass or plastic.

Figure 20:
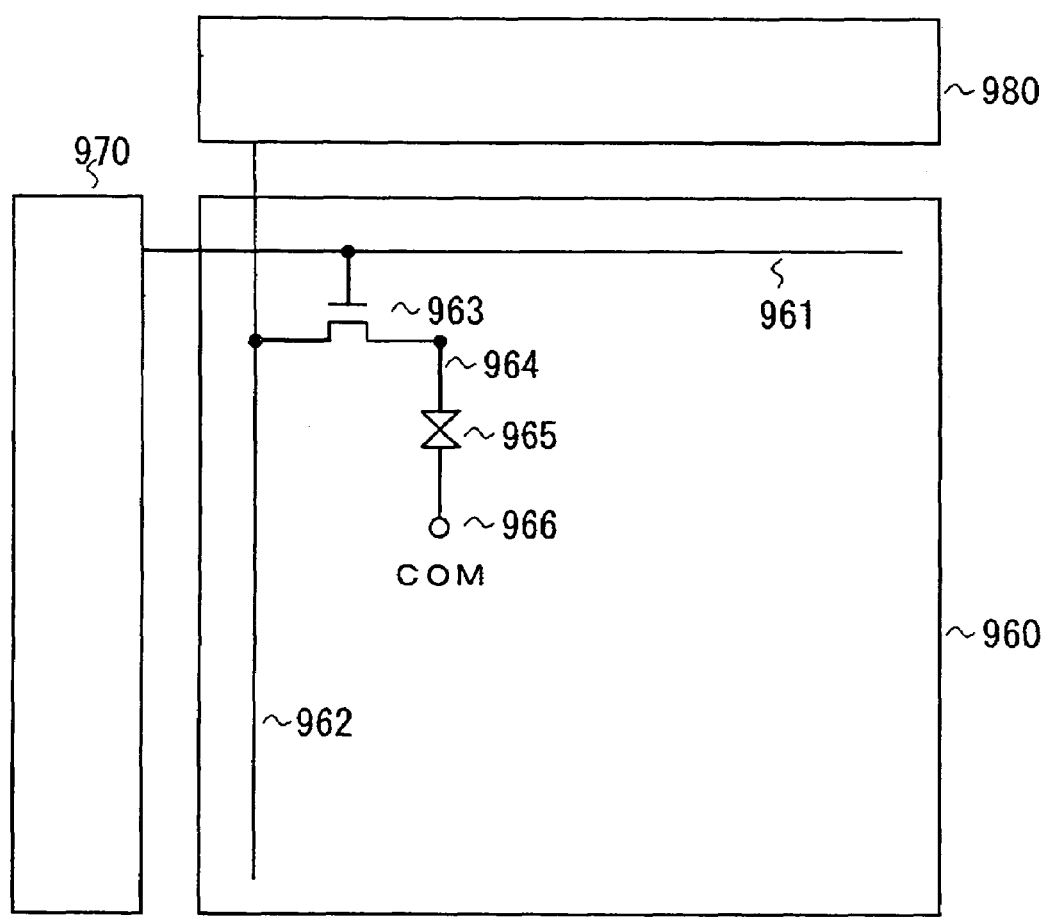
FIG. 20 is a schematic circuit diagram of an active matrix type liquid crystal display apparatus.

A data driver formed by using a differential amplifier and a DAC according to the invention can be used as the data driver 980 of a liquid crystal display apparatus as shown in FIG. 20. The data driver 980 that comprises a differential amplifier and a DAC according to the invention can reduce the decoder area and hence the manufacturing cost. Then, the liquid crystal display apparatus formed by using such a data driver can be manufactured at low cost. Note that, in the liquid crystal display apparatus illustrated in FIG. 20, the data driver 980 may be formed separately as a silicon LSI and connected to the display section 960 or formed integrally with the display section 960 by using poly-silicon TFTs (thin film transistors) on an insulating substrate such as a glass substrate. When the data driver and the display section are formed integrally, it is possible to reduce the area of the data driver and hence the depth of the display apparatus (the width between the outer peripheral of the display section 960 and the outer peripheral of the substrate).

Thus, it is possible to promote cost reduction and depth reduction for display apparatus by applying a differential amplifier and a DAC according to the present invention to the data driver of a display apparatus. The differential amplifier and the DAC may be of any mode for carrying out the invention regardless if the mode for carrying out the invention is selected from the above-described ones or other ones. It may be needless to say that a differential amplifier according to the present invention can be applied to an active matrix type organic EL display adapted to output voltage signals at multiple levels to the data lines as in the case of liquid crystal display apparatus as well to some other display apparatus.

The differential amplifier of any of the above-described embodiments is formed by using MOS transistors. The drive circuit of a liquid crystal display apparatus may be formed by using MOS transistors (TFTs) that are typically made of polycrystalline silicon. While the above-described embodiments are applied to integrated circuits, they may equally be applied to arrangements realized by using discrete elements.

Figure 30:
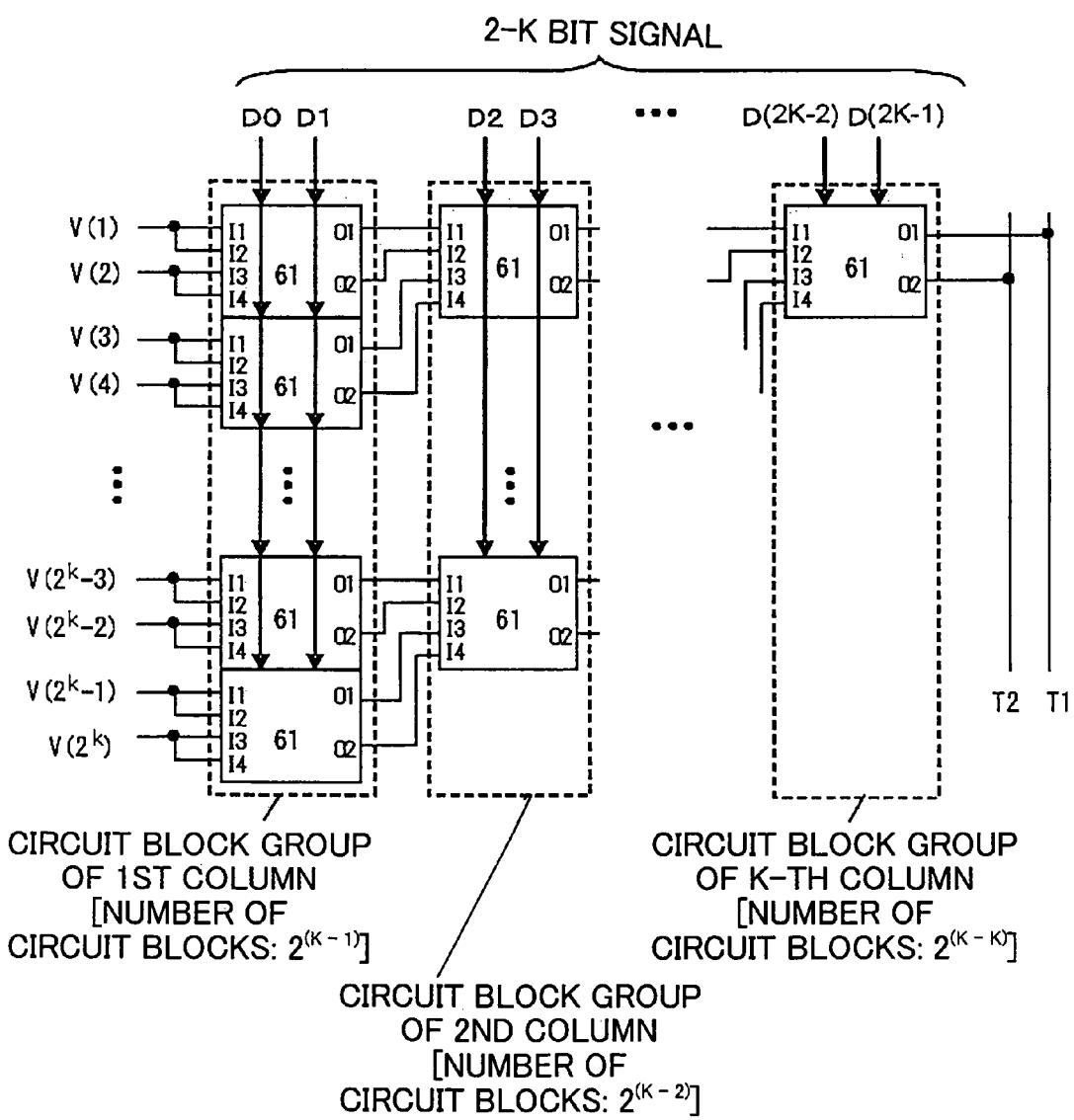
FIG. 30 is a schematic circuit diagram of the selection circuit (decoder) of still another embodiment of the invention.

Now, the above description on output circuits and digital/analog conversion circuits according to the invention will be reiterated and supplemented below. When the number of input voltages m is the K-th power of 2 ($m=2^K$, where K is a positive integer) and the number of output voltages is equal to $4^K$ in a digital/analog conversion circuit according to the invention, the digital data signal for selecting output voltages is minimally a 2K-bit signal. This is because the number of output voltages that can be selected by a digital data, which is a binary number, is defined by the number-of-bits-th power of 2. For example, the $2^K$-th power of 2 is equal to $4^K$ and hence it will be easily understood that the expression matches the number of output voltages of any of the above-described embodiments. While the configurations of decoders to be used with digital data signals of 2, 4 and 6 bits are described above by referring to FIGS. 8, 12, 13 and 16, those of decoders to be used with digital data signals of 2K bits (where K is a positive integer) will generally be described below as an extension of the arrangement. FIG. 30 is a schematic circuit diagram of a decoder (selection circuit) to be used with 2K-bit digital data signals.

Referring to FIG. 30, with the decoder, the input voltages V(1), V(2), V(3), ..., V($2^K$), the number of which is equal to the K-th power of 2 ($2^K$), are selected by a 2K-bit digital data signal and the selected input voltages are output to the terminals T1, T2. The decoder of FIG. 30 comprises groups of circuit blocks including a group of circuit blocks of the first column through a group of circuit blocks of the K-th column and each of the groups of circuit blocks by turn comprises a single circuit block or a plurality of circuit blocks 61. The circuit block or circuit blocks 61 receive voltage signals at the four input terminals I1 through I4 and output the voltage signals selected by a 2-bit signal from the two output terminals O1, O2.

The group of circuit blocks of the first column is formed by circuit blocks 61 whose number is equal to the (K-1)-th power of two. In each of the circuit blocks 61 of the group, the input terminals I1 and I2 and the input terminals I3 and I4 of the four input terminals are commonly connected and two reference voltages selected out of the first through $2^K$-th reference blocks (V(1) through V($2^K$)) are respectively input to the two input terminals. Then, the input two reference voltages are selected according to the first and second bit signals (D0, D1) of a digital data signal and output to the terminals O1, O2 as two output voltage signals in the circuit block 61.

The group of circuit blocks of the second column is formed by circuit blocks 61 whose number is equal to the (K-2)-th power of two. In each of the circuit blocks 61 of the group, the output voltage signals of two circuit blocks 61 of the group of circuit blocks 61 of the first column (a total of four output voltage signals) are input to the four input terminals I1 through I4 thereof. Then, two of the input four voltage signals are selected according to the third and fourth bit signals (D2, D3) of the digital data signal and output to the terminals O1, O2 as two output voltage signals of the circuit block 61.

Each of the groups of circuit blocks of the third and the remaining columns is formed in a similar manner. By using variable F, it may be so described that the group of circuit blocks 61 of the F-th column (F being a positive integer selected from 3 through (K-1)) is formed by circuit blocks whose number is equal to the (K-F)-th power of two. In each of the circuit blocks 61 of the group, the output voltage signals of two circuit blocks of the group of circuit blocks 61 of the (F-1)-th column (a total of four output voltage signals) are input to the four input terminals I1 through I4 thereof. Then, two of the input four voltage signals are selected according to the (2F-1)-th and (2F)-th bit signals (D(2F-2), D(2F-1)) and output to the terminals O1, O2 as two output voltage signals of the circuit block 61.

The group of circuit blocks of the K-th column is formed by a single circuit block 61. In the circuit block 61, the output voltage signals of two circuit blocks of the group of circuit blocks 61 of the (K-1)-th column (a total of four output voltage signals) are input to the four input terminals I1 through I4 thereof. Then, two of the input four voltage signals are selected according to the (2K-1)-th and (2K)-th bit signals (D(2K-2), D(2K-1)) and output to the terminals O1, O2 as two output voltage signals of the circuit block 61.

Particularly, in the case of K=1, the decoder is formed by the group of circuit blocks of the first column. In other words, it is formed by a single circuit block 61. Then, the first and second reference voltages V(1), V(2) are input to the circuit block 61 and selected according to the first and second bit signals (D0, D1). Then, they are output to the terminals T1, T2 by way of the terminals O1, O2 as two output voltage signals. The circuit block 61 may show the configuration illustrated in FIG. 31.

Figure 31:
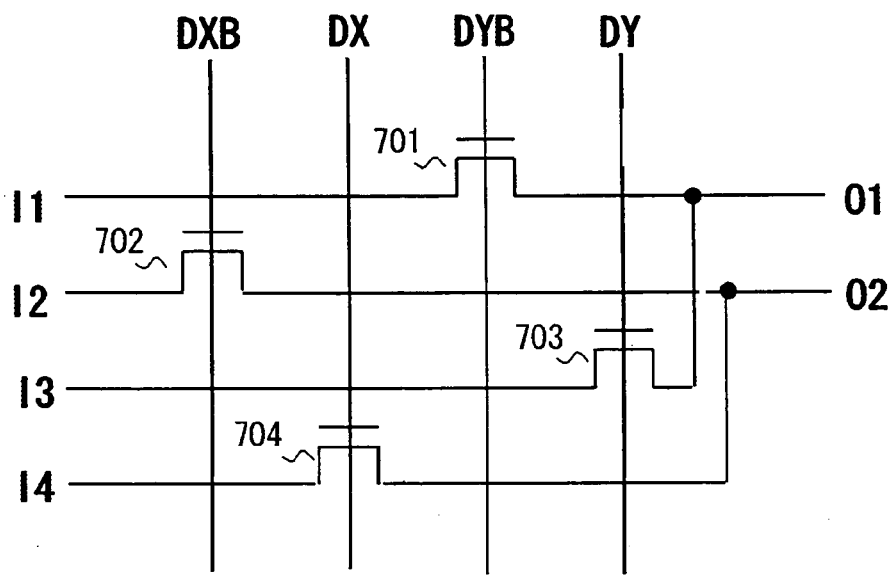
FIG. 31 is a schematic circuit diagram of a circuit block of the selection circuit of FIG. 30.

FIG. 31 is a schematic circuit diagram of the circuit block 61 of a 2-bit decoder (Nch transistors). Referring to FIG. 31, the decoder comprises transistor switches 703, 701 respectively connected between terminal I3, I1 and terminal O1 and adapted to input data bit signal DY and its inverted signal DYB to the respective control terminals and transistor switches 704, 702 respectively connected between terminals I4, I2 and terminal O2 and adapted to input data bit signal DX and its inverted signal DXB to the respective control terminals. Note that, of the signals DX, DY, the signal DY is a bit signal of a bit higher than the signal DX.

As the circuit configuration of FIG. 31 is used for the circuit block 61 of the decoder of FIG. 30, the circuit is equivalent with the circuit of FIG. 8 when K=1 and with the circuit of FIG. 14 when K=2. Thus, the arrangement of FIG. 30 represents a circuit configuration that can be used to realize a decoder according to the invention with a reduced number of elements.

Decoders as shown in FIGS. 8, 12, 13 and 16 are described above as embodiments in order to indicate that the number of transistors may vary depending on the circuit configuration among decoders that are functionally equivalent. Additionally, it is also described above that a plurality of combinations of decoders having a same number of input voltages m that is equal to a power of 2 such as 2, 4 or 8 and also a plurality of combinations of decoders having different numbers of input voltages are possible. Particularly, when the number of output voltages is extremely large, the number of transistors can vary enormously depending on the configuration of decoder so that the area of a decoder is significantly affected by the number of transistors. In view of this fact, the relationship between a decoder having a very large number of output voltages and the number of transistors will be discussed below.

Figure 25:
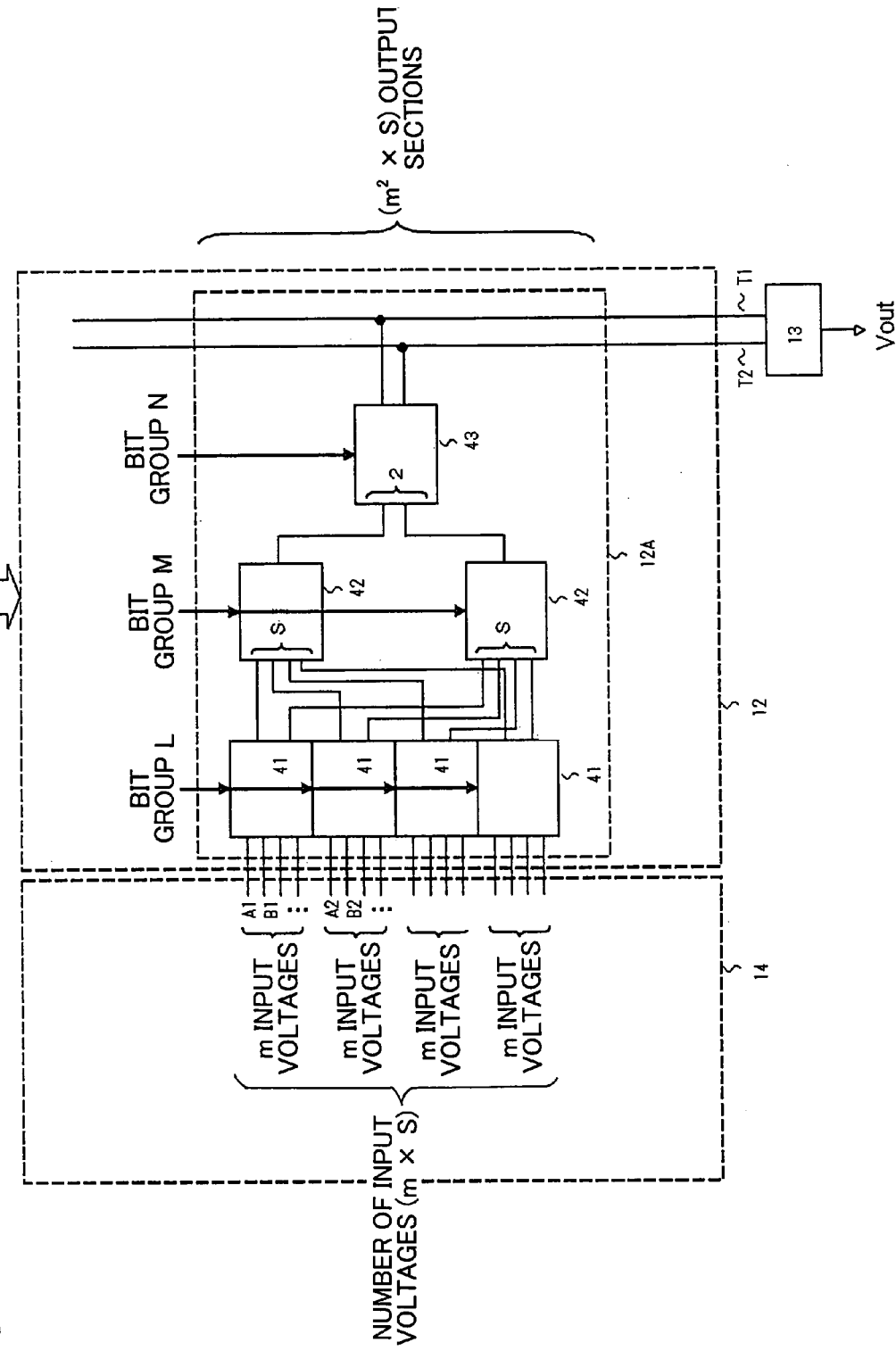
FIG. 25 is a schematic circuit diagram of the decoder of another embodiment of the invention, showing the configuration thereof.
Figure 26:
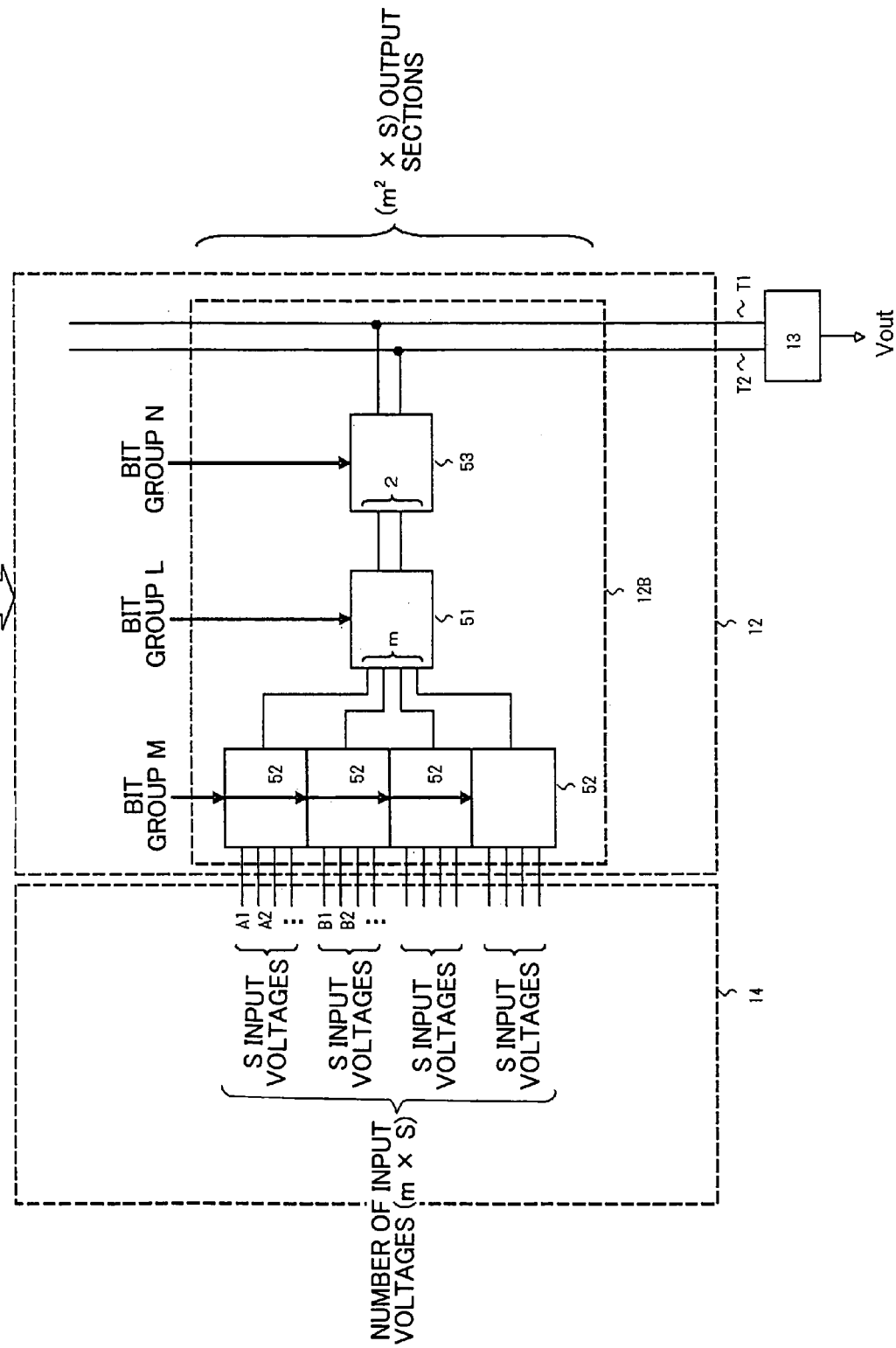
FIG. 26 is a schematic circuit diagram of the decoder of still another embodiment of the invention, showing the configuration thereof.

FIGS. 25 and 26 illustrate the configurations of two different decoders, both of which can suitably be used for the purpose of the present invention. More particularly, they illustrate the configurations of the tone voltage generating circuit 14 and that of a decoder 12 and an amplifier circuit (amplifier) 13 for a single output in FIG. 18.

Referring to FIGS. 25 and 26, assume that the decoder 12 has S sections having m input voltages and corresponding $m^2$ output voltage levels ($m^2$ output sections) as a decoder for a single output or part thereof. Also assume that the S sections are those of the decoder block 12A (FIG. 25) or the decoder block 12B (FIG. 26). For the purpose of simplicity of explanation, assume that any output voltage levels do not overlap in each of the S sections. Then, the number of input voltages of the decoder block 12A of FIG. 25 is (m×S) and the number of corresponding output voltage levels is (m²×S) and also the number of input voltages of the decoder block 12B of FIG. 26 is (m×S) and the number of corresponding output voltage levels is (m²×S).

Bit groups L, M, N are input to the decoder block 12A. Bit groups L, M, N are also input to the decoder block 12B.

The bit groups L, M, N are formed by assigning bits that are necessary for selections out of the digital data to be used for an input that are input to the decoder 12. Referring to FIG. 25, (m×S) input voltages are generated by tone voltage generating circuit 14 and input to the decoder block 12A. Referring to FIG. 26, (m×S) input voltages are generated by tone voltage generating circuit 14 and input to the decoder block 12B.

In FIGS. 25 and 26, the amplifier circuit 13 amplifies the voltage obtained by internally dividing the voltage difference of the voltages output to the terminals T1, T2 to a ratio of 1:2 or 2:1 and outputs it. The amplifier circuit 13 typically has a circuit configuration as illustrated in FIG. 4, 5 or 6.

Firstly, the configuration of the decoder block 12A of FIG. 25 will be described. The decoder block 12A comprises first through S-th circuit blocks 41 for receiving bit group L as input, first and second circuit blocks 42 for receiving bit group M as input and a circuit block 43 for receiving bit group N as input. In the decoder block 12A, the first through S-th circuit blocks 41 are adapted to select two voltages out of the m input voltages in each section by means of the bit group L, allowing duplication.

The first circuit block 42 receives as input one of the two voltages selected by each of the first through S-th circuit blocks 41 (to make the total equal to S) and the second circuit block 42 receives as input the other of the two voltages selected by each of the first through S-th circuit blocks 41 (to make the total equal to S). Then, each of the first and second circuit blocks 42 selects a voltage in a section out of the S input voltages by means of the bit group M. At this time, the bit group M operates as bits for selecting a section from the S sections of the decoder block 12A.

The circuit block 43 receives as input the voltage selected by each of the first and second circuit blocks 42 (to make the total equal to 2) and discriminates S sections and the other sections of the decoder block 12A by means of the bit group N. When the S sections are selected by means of the bit group N, two input voltages are output respectively to the terminals T1, T2.

The circuit blocks 41 may have any of the configurations of the embodiments described above by referring to FIGS. 8, 12, 13, 16, 30 and so on depending on the number of input voltages m. Each of the circuit blocks 42 may be realized by using a tournament type decoder as shown in FIG. 24 for optimization according to the number of input voltages.

As for the relationship between the configuration of the decoder 12 and the number of transistors of FIG. 25, the number of transistors is relatively small when the number of input voltages m of a section is large and the number of sections S is small. This is because the element efficiency of the circuit blocks 41 (and hence the element reduction ratio relative to a comparable known circuit) is raised as the number of input voltages m of the circuit blocks 41 increases.

Now, the configuration of the decoder block 12B of FIG. 26 will be described. The decoder block 12B comprises first through m-th circuit blocks 52 for receiving bit group M as input, a circuit block 51 for receiving bit group L as input and a circuit block 53 for receiving bit group N as input. In the decoder block 12B, the first through m-th circuit blocks 52 are adapted to receive the input voltages of the same order of arrangement respectively from the S sections (to make the total equal to S) and select a voltage in a section out of the S input voltages by means of the bit group M. At this time, the bit group M operates as bits for selecting a section from the S sections of the decoder block 12B.

Then, the circuit block 51 receives as input the voltage selected by each of the first through m-th circuit blocks 52 (to make the total equal to m) and selects two voltages out of the m input voltages by means of the bit group L, allowing duplication.

The circuit block 53 receives as input the voltage selected by the circuit block 51 (to make the total equal to 2) and discriminates S sections and the other sections of the decoder block 12B by means of the bit group N. When the S sections are selected by means of the bit group N, two input voltages are output respectively to the terminals T1, T2.

The circuit blocks 51 may have any of the configurations of the embodiments described above by referring to FIGS. 8, 12, 13, 16, 30 and so on depending on the number of input voltages m. The circuit blocks 52 may be realized by using a tournament type decoder as shown in FIG. 24 for optimization according to the number of input voltages.

As for the relationship between the configuration of the decoder 12 and the number of transistors of FIG. 26, the number of transistors is also relatively small when the number of input voltages m of a section is large and the number of sections S is small. This is because the element efficiency of the circuit blocks 51 is raised as the number of input voltages m of the circuit blocks 51 increases.

While the decoder blocks 12A and 12B of FIGS. 25 and 26 are described above as two feasible configurations, it is desirable that the (m²×S) output voltage levels are continuous output voltage levels in both of the decoder blocks.

If the output voltage levels are discontinuous from a section to another section, the decoder block may be formed by separating sections so as to make the output voltages level continuous.

The voltage difference of two adjacent voltage levels in each section of the decoder block may be defined separately from the remaining sections (although the output voltage levels of each section need to be arranged at regular intervals).

The decoder block 12A and the decoder block 12B of FIGS. 25 and 26 are described above so as to correspond to the same value of m. However, if the decoder 12 has sections where the value of m varies from section to section, it is desirable to form a decoder block for each value of m.

In the case of the decoder block 12A of FIG. 25, the circuit block 43 may be omitted if all the bits of the bit group N are contained in the bit group L and the bit group M. This is because the decoder block is discriminated from other decoder blocks already by the bit group L and the bit group M.

When the entire decoder 12 has a plurality of decoder blocks with different values of m in the case of the decoder block 12B of FIG. 26, the circuit block 53 may be omitted if all the bits of the bit group N are contained in the bit group L and the bit group M in the decoder block where the value of m is largest.

The reason why the circuit block 53 cannot be omitted in decoder blocks other than the decoder block where the value of m is largest is that unexpected short-circuiting can take place between the terminals T1 and T2 to give rise to an output error in the circuit block 51 if the circuit block 53 is omitted.

Now, the configuration of the decoder 12 of FIG. 25 and that of FIG. 26 will be described in greater detail by way of specific examples.

Figure 27:
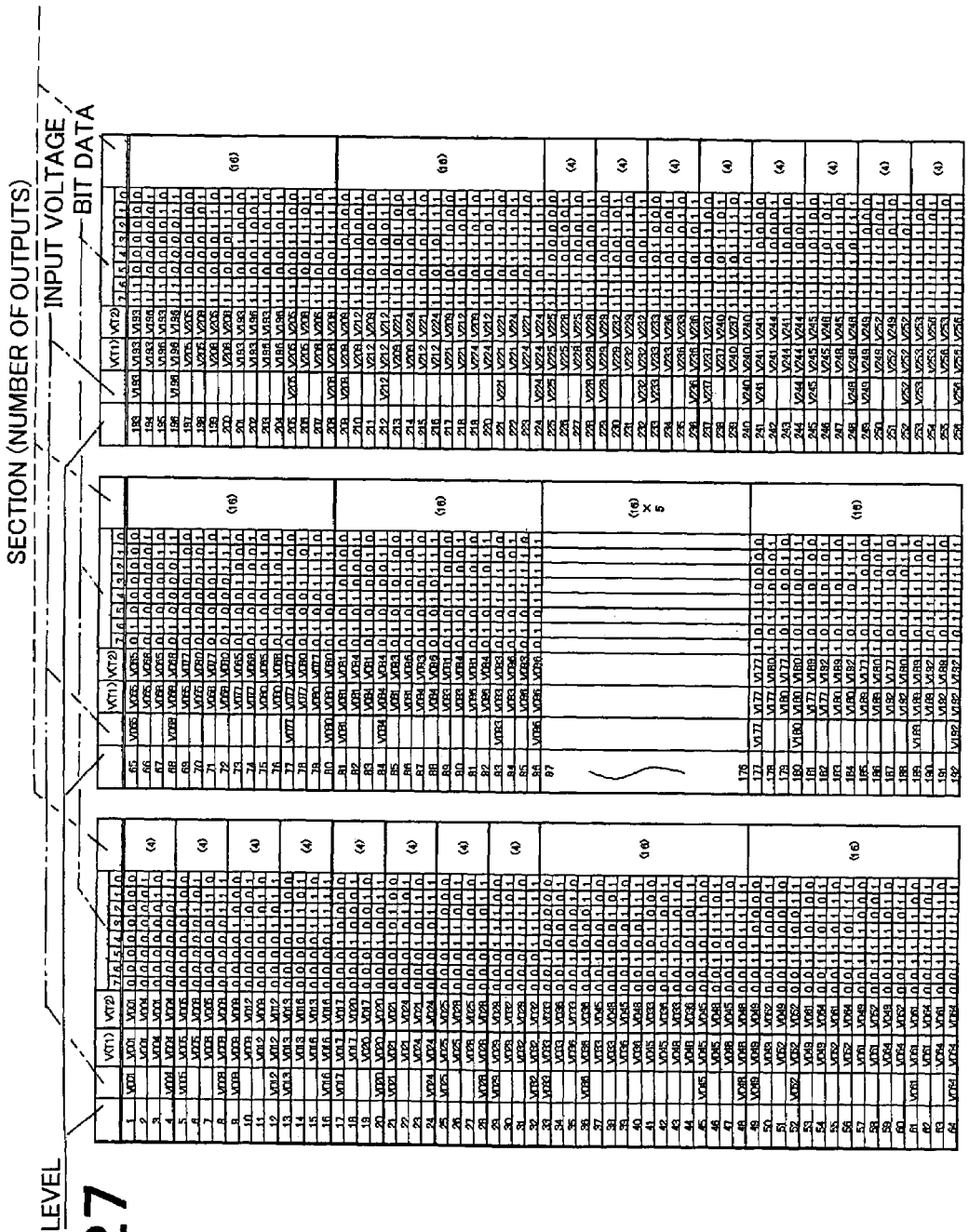
FIG. 27 is a schematic illustration of the correspondence of input and output levels of still another embodiment of DAC according to the invention.

FIG. 27 illustrates the input/output correspondence of an embodiment of DAC according to the invention. Although not specifically limited, FIG. 27 shows the input/output correspondence of an 8-bit DAC adapted to input 8-bit data (D7 through D0) and output voltages at a total of 256 voltage levels according to the data applied to it. The levels 1 through 256 in FIG. 27 are those of the output voltages output from an amplifier circuit 13 according to the invention and the input voltages are those that are generated by a tone voltage generating circuit 14 and input to the decoder 12. The input voltages correspond to predetermined output voltage levels and the numbers of the corresponding output voltage levels are prefixed by V In FIG. 27, V(T1), V(T2) indicates the voltages selected and output to the terminals T1, T2 respectively according to the 8-bit data (D7 through D0) of the decoder (selection circuit) of this embodiment. Each of the output voltage levels indicates the voltage obtained by internally dividing the voltage difference between the voltages V(T1), V(T2) output to the terminals T1, T2 respectively, to a ratio of 1:2. While the amplifier circuit 13 of this embodiment is adapted to output the voltage obtained by internally dividing the voltage difference between the voltages output to the terminals T1 and T2 to a ratio of 1:2, it is only necessary to modify the circuit block 41 or the circuit block 51 so as to invert the voltages output to the terminals T1 and T2 when the amplifier circuit 13 is adapted to output the voltage obtained by internally dividing the voltage difference to a ratio of 2:1 as described earlier. In the following description, the amplifier circuit 13 is an amplifier circuit adapted to output the voltage obtained by internally dividing the voltage difference between the voltages V(T1), V(T2) output to the terminals T1 and T2 to a ratio of 1:2 for the sake of convenience.

In this embodiment, the 256 output levels (tone level) are provided by sections of two types including those of a type with the number of input voltages equal to 2 and the number of output voltages equal to 4 (4-output section; m=2) and those of a type with the number of output voltages equal to 4 and the number of output voltages equal to 16 (16-output section; m=4).

The 1st through 32nd voltage levels are provided by 4-output section×8.

The 33rd through 224th voltage levels are provided by 16-output section×12.

The 225th through 256th voltage levels are provided by 4-output section×8.

As for the input voltages input to the decoder 12, the 1st and the 4th voltage levels of each section for the 4-output sections and the 1st, 4th, 13th and 16th voltage levels of each section for the 16-output sections.

The number of input voltages is a total of 80 for the 256 output voltage levels.

Figure 28:
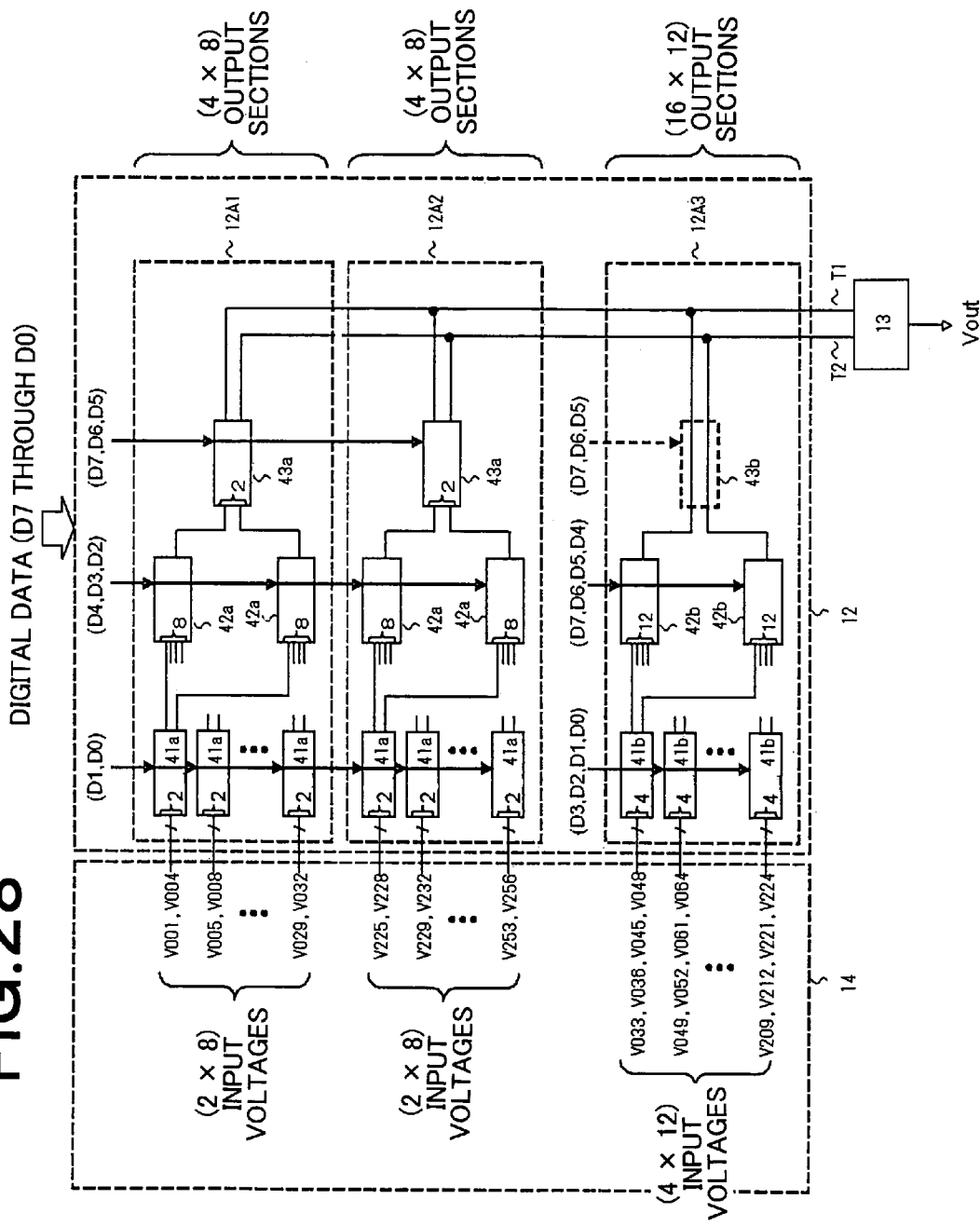
FIG. 28 is a schematic circuit diagram of a decoder for realizing the correspondence relationship of FIG. 27, showing the configuration thereof.

While the 97th through 176th voltage levels are omitted from FIG. 27 for the sake of convenience, they may be understood by reason with ease from the regularity of the remaining voltage levels FIG. 28 is a schematic circuit diagram of a decoder 12 for realizing the correspondence relationship of FIG. 27 that is formed on the basis of FIG. 25, showing the configuration thereof. Like FIG. 25, FIG. 28 illustrates a tone voltage generating circuit 14 that can be used for the data driver illustrated in FIG. 18 along with a decoder 12 for a single output and an amplifier circuit 13.

Referring to FIG. 28, the decoder 12 comprises three decoder blocks 12A1, 12A2 and 12A3.

The decoder block 12A1 is responsible for eight 4-output sections that correspond to the 1st through 32nd voltage levels and the decoder block 12A2 is responsible for eight 4-output sections that correspond to the 225th through 256th voltage levels while the decoder block 12A3 is responsible for twelve 16-output sections that correspond to the 33rd through 224th voltage levels.

Since there are two consecutive 4-output sections (the sections for the 1st through 32nd voltage levels and the sections for the 225th through 256th voltage levels), decoder blocks are provided for the respective groups of consecutive 4-output sections.

The bit groups L, M, N are formed by assigning bits that are necessary for selections out of the 8-bit data signal (D7 through D0) to be used for an output that are input to the decoder 12. While each of the bits of the 8-bit data signals (D7 through D0) is paired with the corresponding bit of an inverted signals (D7B through D0B) thereof, the inverted signal is omitted from FIG. 28.

Now, each of the decoder blocks of FIG. 28 will be described below. The decoder block 12A1 is a decoder block for eight 4-output sections that correspond to the 1st through 32nd voltage levels. It corresponds to the decoder block 12A of FIG. 25 when m=2 and S=8. Therefore, the decoder block 12A1 is formed by first through eighth circuit blocks 41a, first and second circuit blocks 42a and a circuit block 43a.

Of the first through eighth circuit blocks 41a in the decoder block 12A1, the first circuit block 41a receives input voltages V001 and V004 of the sections that correspond to the 1st through 4th voltage levels, the second circuit block 41a receives input voltages V005 and V008 of the sections that correspond to the 5th through 8th voltage levels and so on down to the eighth circuit block 41a.

At each of the circuit blocks 41a, two voltages are selected from the two input voltages of each section, by means of the bit group L, allowing duplication, and output. Therefore, the bit group L requires only two bits. In other words, only 2-bit data (D1, D0) may be used out of 8-bit data. Note that each circuit block 41a shows an input/output correspondence relationship similar to that of FIG. 7 and may show a circuit configuration as shown in FIG. 8.

As for the first and second circuit blocks 42a, one of the two voltages selected in each of the first through eighth circuit blocks 41a is input to the first circuit block 42a (to make the total equal to 8) while the other of the two voltages selected in each of the first through eighth circuit blocks 41a is input to the second circuit block 42a (to make the total equal to 8).

Then, in each of the first and second circuit blocks 42a, a voltage of a section is selected and output from the eight input voltages by means of the bit group M. At this time, the bit group M operates as bits for selecting a section from the eight sections of the decoder block 12A1. In other words, only 3-bit data (D4, D3, D2) may be used out of the 8-bit data. Each of the circuit blocks 42a may be realized by using a tournament type decoder as shown in FIG. 24 for optimization.

The circuit block 43a receives as input the voltage selected by each of the first and second circuit blocks 42a (to make the total equal to 2). Then, in the circuit block 43a, the decoder block 12A1 (sections corresponding to the 1st through 32nd voltage levels) and the other decoder blocks are discriminated by means of the bit group N. When the decoder block 12A1 is selected by the bit group N, the two input voltages are output to the terminals T1, T2 respectively.

As seen from FIG. 27, it is possible to discriminate the sections of the decoder block 12A1 and the other sections by means of three bits of (D7, D6, D5) in this embodiment. Thus, the bit group N is 3-bit data (D7, D6, D5) taken from the 8-bit data.

The circuit block 43*a* outputs the two input voltages to the terminals T1, T2 respectively when (D7, D6, D5)=(0, 0, 0), whereas it does not output the two voltages to the terminals T1, T2 when (D7, D6, D5) are not equal to (0, 0, 0).

Now, the decoder block 12A2 will be described below. The decoder block 12A2 is a decoder block for eight 4-output sections that correspond to the 225th through 256th voltage levels and shows a configuration similar to that of the decoder block 12A1.

The bits assignment to the input bit groups L, M, N for this decoder block is also similar to the one described above for the decoder block 12A1.

The decoder block 12A2 and the decoder block 12A1 differ from each other only in terms of the input voltages to the decoder blocks and the discrimination by means of the bit data (D7, D6, D5) in the circuit block 43*a*. This will be described more specifically. As for the input voltages, the input voltages V225 and V228 of the sections that correspond to the 225th through 228th voltage levels are input to the first circuit block 41*a* of the decoder block 12A2, while the input voltages V229 and V232 of the sections that correspond to the 229th through 232nd voltage levels are input to the second circuit block 41*a*. In this way, the input voltages are input all the way to the eighth circuit block 41*a*. As for the discrimination by means of the bit data (D7, D6, D5) in the circuit block 43*a*, the circuit block 43*a* outputs the two input voltages to the terminals T1, T2 respectively when (D7, D6, D5)=(1, 1, 1) but it does not output the input voltages to the terminals T1, T2 when (D7, D6, D5) is not equal to (1, 1, 1) as seen from FIG. 27.

Now, the decoder block 12A3 will be described below. The decoder block 12A3 is a decoder block for twelve 16-output sections that correspond to the 33rd through 224th voltage levels. It corresponds to the decoder block 12A of FIG. 25 when m=4 and S=12.

Therefore, the decoder block 12A3 is formed by first through twelfth circuit blocks 41*b*, first and second circuit blocks 42*b* and a circuit block 43*b*.

Of the first through twelfth circuit blocks 41*b* in the decoder block 12A3, the first circuit block 41*b* receives four input voltages V033, V036, V045 and V048 of the sections that correspond to the 33rd through 48th voltage levels, the second circuit block 41*b* receives four input voltages V049, V052, V061 and V064 of the sections that correspond to the 49th through 64th voltage levels and so on down to the twelfth circuit block 41*b*, which receives four input voltages V209, V212, V221 and V224 of the sections that correspond to the 209th through 224th voltage levels.

At each of the circuit blocks 41*b*, two voltages are selected from the four input voltages of each section by means of the bit group L, allowing duplication, and output. Therefore, the bit group L requires only four bits. In other words, only 4-bit data (D3, D2, D1, D0) may be used out of 8-bit data. Note that each circuit block 41*b* shows an input/output correspondence relationship similar to that of FIG. 11 and may show a circuit configuration as shown in FIG. 12 or FIG. 13.

As for the first and second circuit blocks 42*b*, one of the two voltages selected in each of the first through twelfth circuit blocks 41*b* is input to the first circuit block 42*b* (to make the total equal to 12) while the other of the two voltages selected in each of the first through twelfth circuit blocks 41*b* is input to the second circuit block 42*b* (to make the total equal to 12).

Then, in each of the circuit blocks 42*b*, a voltage of a section is selected and output from the twelve input voltages by means of the bit group M. At this time, the bit group M operates as bits for selecting a section from the twelve sections of the decoder block 12A3. In other words, the bit group M needs four bits, or 4-bit data (D7, D6, D5, D4) out of the 8-bit data. Each of the circuit blocks 42*b* may be realized by using a tournament type decoder as shown in FIG. 24 for optimization.

The circuit block 43*b* receives as input the voltage selected by each of the first and second circuit blocks 42*b* (to make the total equal to 2). Then, the decoder block 12A3 (sections corresponding to the 33rd through 224th voltage levels) and the other decoder blocks are discriminated by means of the bit group N. When the decoder block 12A3 is selected by the bit group N, the two input voltages are output to the terminals T1, T2 respectively.

As seen from FIG. 28, it is possible to discriminate the sections of the decoder block 12A3 and the other sections by means of three bits of (D7, D6, D5) in this embodiment. Thus, the bit group N is 3-bit data (D7, D6, D5) taken from the 8-bit data.

Then, the decoder block 12A3 is selected when the 3-bit data (D7, D6, D5) is not equal to (0, 0, 0) or (1, 1, 1) and the circuit block 43*b* outputs the two input voltages to the terminals T1, T2 respectively.

In FIG. 28, the circuit block 43*b* may be omitted so that it may be so arranged that the two voltages selected by each of the two circuit blocks 42*b* (to make the total equal to 2) are output to the terminals T1, T2 respectively. This is because the 3-bit data (D7, D6, D5) input to the circuit block 43*b* are contained in the 4-bit data (D7, D6, D5, D4) input to the circuit blocks 42*b* and the decoder block 12A3 and other decoder blocks are already discriminated by the circuit blocks 42*b*.

Figure 29:
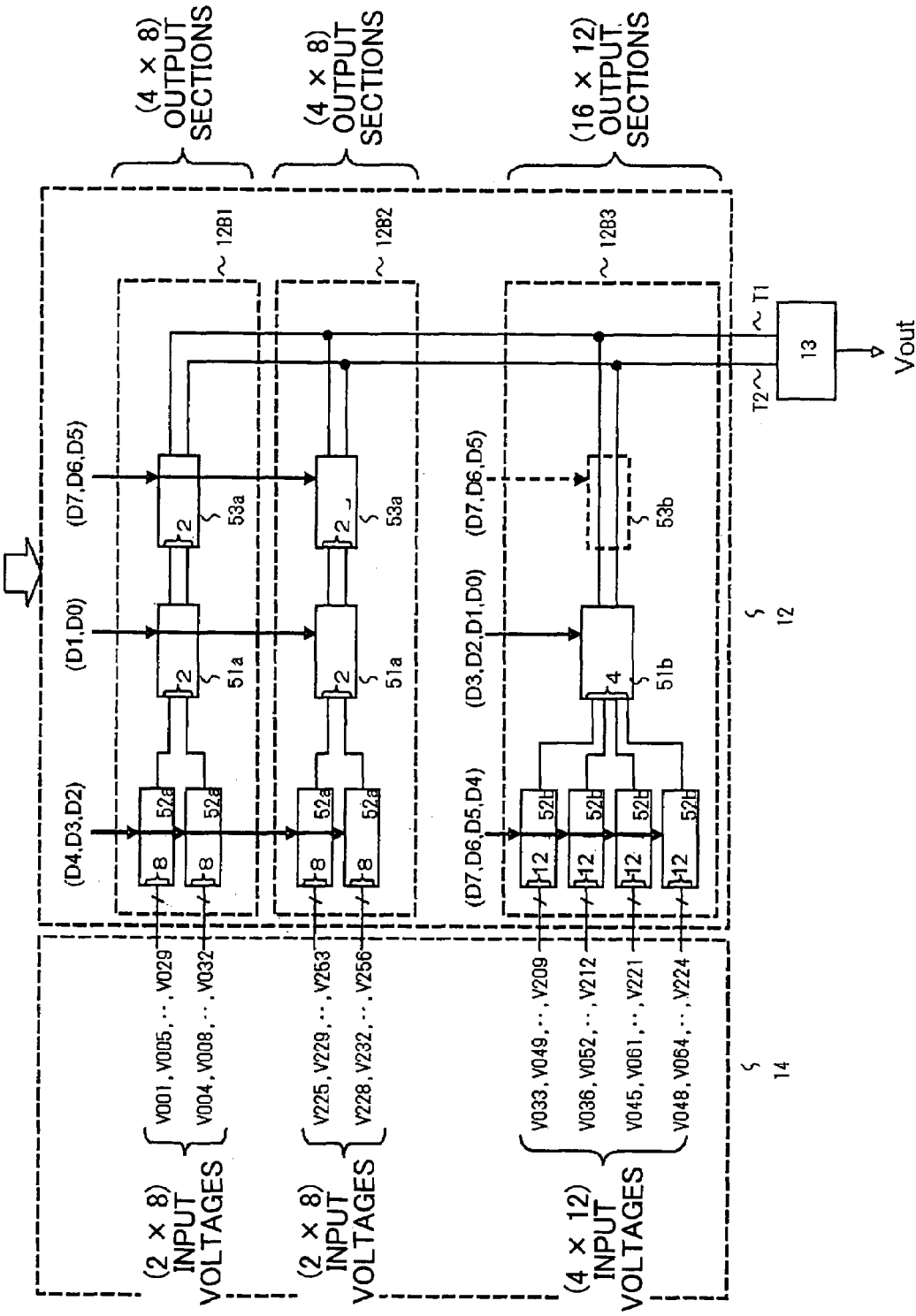
FIG. 29 is a schematic circuit diagram of another decoder for realizing the correspondence relationship of FIG. 27, showing the configuration thereof.

FIG. 29 is a schematic circuit diagram of another decoder 12 for realizing the correspondence relationship of FIG. 27, showing the configuration thereof. Like FIG. 26, FIG. 29 illustrates a tone voltage generating circuit 14 that can be used for the data driver illustrated in FIG. 18 along with a decoder 12 for a single output and an amplifier circuit 13.

Referring to FIG. 29, the decoder 12 comprises three decoder blocks 12B1, 12B2 and 12B3, of which the decoder block 12B1 is responsible for eight 4-output sections that correspond to the 1st through 32nd voltage levels and the decoder block 12B2 is responsible for eight 4-output sections that correspond to the 225th through 256th voltage levels while the decoder block 12B3 is responsible for twelve 16-output sections that correspond to the 33rd through 224th voltage levels. As in the case of FIG. 28, the decoder blocks 12B1, 12B2 are provided for the respective groups of consecutive 4-output sections.

The bit groups L, M, N are formed by assigning bits, allowing duplication, that are necessary for selections out of the 8-bit data signal (D7 through D0) to be used for an output that are input to the decoder 12.

While each of the bits of the 8-bit data signal (D7 through D0) is paired with the corresponding bit of an inverted signals (D7B through D0B) thereof, the inverted signal is omitted from FIG. 28.

Now, each of the decoder blocks of FIG. 29 will be described below. The decoder block 12B1 is a decoder block for eight 4-output sections that correspond to the 1st through 32nd voltage levels. It corresponds to the decoder block 12B of FIG. 26 when m=2 and S=8. Therefore, the decoder block 12B1 is formed by first and second circuit blocks 52a, a circuit block 51a and a circuit block 53a.

As for the first and second circuit blocks 52a of the decoder block 12B1, the first circuit block 52a receives input voltages V001, V005, . . . , V029 (to make the total equal to 8), or the input voltages of the first voltage level in each of the eight sections, and the second circuit block 52a receives input voltages V004, V008, . . . , V032 (to make the total equal to 8), or the input voltages of the fourth voltage level in each of the eight sections.

At each of the circuit blocks 52a, a voltage of a section is selected from the eight input voltages, by means of the bit group M, and output. At this time, the bit group M operates as bits for selecting a section from the eight sections of the decoder block 12B1. In other words, only 3-bit data (D4, D3, D2) may be used out of the 8-bit data. Each of the circuit blocks 52a may by realized by using a tournament type decoder as shown in FIG. 24 for optimization.

The circuit block 51a receives as input the voltage selected by each of the first and second circuit blocks 52a (to make the total equal to 2). Then, at the circuit block 51a, two voltages are selected from the two input voltages by means of the bit group L, allowing duplication, and output. Therefore, the bit group L requires only two bits. In other words, only 2-bit data (D1, D0) may be used out of 8-bit data. Note that each circuit block 51a shows an input/output correspondence relationship similar to that of FIG. 7 and may show a circuit configuration as shown in FIG. 8.

The circuit blocks 53a receives as input the two voltages selected by the circuit block 51a. Then, at the circuit block 53a, the decoder block 12B1 (the sections corresponding to the 1st through 32nd voltage levels) is discriminated from the other decoder block and, when the decoder block 12B1 is selected by the bit group N, the two input voltages are output to the terminals T1, T2 respectively.

As seen from FIG. 27, it is possible to discriminate the sections of the decoder block 12B1 and the other sections by means of three bits of (D7, D6, D5) in this embodiment. Thus, the bit group N is 3-bit data (D7, D6, D5) taken from the 8-bit data. The circuit block 53a outputs the two input voltages to the terminals T1, T2 respectively when (D7, D6, D5)=(0, 0, 0), whereas it does not output the two voltages to the terminals T1, T2 when (D7, D6, D5) are not equal to (0, 0, 0).

Now, the decoder block 12B2 will be described below. The decoder block 12B2 is a decoder block for eight 4-output sections that correspond to the 225th through 256th voltage levels and shows a configuration similar to that of the decoder block 12B1. The bits assignment to the input bit groups L, M, N for this decoder block is also similar to the one described above for the decoder block 12B1.

The decoder block 12B2 and the decoder block 12B1 differ from each other only in terms of the input voltages to the decoder blocks and the discrimination by means of the 3-bit data (D7, D6, D5) in the circuit block 53a. This will be described more specifically. As for the input voltages, in the decoder block 12B2, the first circuit block 52a receives input voltages V225, V229, . . . , V253, or the input voltages of the first voltage level in each of the eight sections, to make the total equal to 8 and the second circuit block 52a receives input voltages V228, V232, . . . , V256, or the input voltages of the fourth voltage level in each of the sections in the decoder block 12B2, to make the total equal to 8.

As for the discrimination by means of the 3-bit data (D7, D6, D5) in the circuit block 53a, it outputs the two input voltages to the terminals T1, T2 respectively when (D7, D6, D5)=(1, 1, 1) but it does not output the input voltages to the terminals T1, T2 when (D7, D6, D5) is not equal to (1, 1, 1) as seen from FIG. 27.

Now, the decoder block 12B3 will be described below. The decoder block 12B3 is a decoder block for twelve 16-output sections that correspond to the 33rd through 224th voltage levels. It corresponds to the decoder block 12B of FIG. 26 when m=4 and S=12. Therefore, the decoder block 12B3 is formed by first through fourth circuit blocks 52b, a circuit block 51b and a circuit block 53b.

As for the first through fourth circuit blocks 52b of the decoder block 12B3, the first circuit block 52b receives input voltages V033, V049, . . . , V209 (to make the total equal to 12), or the input voltages of the first voltage level in each of the twelve sections and the second circuit block 52b receives input voltages V036, V052, . . . , V212 (to make the total equal to 12), or the input voltages of the fourth voltage level in each of the twelve sections, while the third circuit block 52b receives input voltages V045, V061, . . . , V221 (to make the total equal to 12), or the input voltages of the thirteenth voltage level in each of the twelve sections and the fourth circuit block 52b receives input voltages V048, V064, . . . , V224 (to make the total equal to 12), or the input voltages of the sixteenth voltage level in each of the twelve sections.

Then, in each of the circuit blocks 52b, a voltage of a section is selected and output from the twelve input voltages by means of the bit group M.

At this time, the bit group M operates as bits for selecting a section from the twelve sections of the decoder block 12B3. In other words, the bit group M needs four bits, or 4-bit data (D7, D6, D5, D4) out of the 8-bit data. Each of the circuit blocks 52b may by realized by using a tournament type decoder as shown in FIG. 24 for optimization.

The circuit block 51b receives as input the voltage selected by each of the first through fourth circuit blocks 52b (to make the total equal to 4).

Then, at the circuit block 51b, two voltages are selected from the four input voltages by means of the bit group L, allowing duplication, and output. Therefore, the bit group L requires only four bits. In other words, only 4-bit data (D3, D2, D1, D0) may be used out of an 8-bit data. Note that each circuit block 51b shows an input/output correspondence relationship similar to that of FIG. 11 and may show a circuit configuration as shown in FIG. 12 or FIG. 13.

The circuit block 53b receives as input the two voltages selected by the circuit block 51b. Then, at the circuit block 53b, the decoder block 12B3 (sections corresponding to the 33rd through 224th voltage levels) and the other decoder blocks are discriminated by means of the bit group N. When the decoder block 12B3 is selected by the bit group N, the two input voltages are output to the terminals T1, T2 respectively.

As seen from FIG. 27, it is possible to discriminate the sections of the decoder block 12B3 and the other sections by means of three bits of (D7, D6, D5) in this embodiment. Thus, the bit group N is 3-bit data (D7, D6, D5) taken from the 8-bit data. Then, the decoder block 12B3 is selected when the 3-bit data (D7, D6, D5) is not equal to (0, 0, 0) or (1, 1, 1) and the circuit block 53*b* outputs the two input voltages to the terminals T1, T2 respectively.

In the arrangement of FIG. 29, the circuit block 63*b* may be omitted so that it may be so arranged that the two voltages selected by each of the circuit blocks 51*b* are output to the terminals T1, T2 respectively. This is because the decoder blocks 12B1, 12B2, 12B3 correspond respectively to m=2, 2, 4 and the 3-bit data (D7, D6, D5) input to the circuit block 53*b*, which is the decoder block 12B3 for the largest value of m, are contained in the 4-bit data (D7, D6, D5, D4) input to the circuit blocks 52*b*. Therefore, the decoder block 12B3 and other decoder blocks are already discriminated by the circuit blocks 52*b* and unexpected short-circuiting can be prevented from taking place between the terminals T1, T2 in the circuit block 51*a* of the decoder block 12B1 or the decoder block 12B2 for the smaller value of m.

Unexpected short-circuiting that can take place between the terminals T1, T2 in the circuit block 51*a* of the decoder block 12B1 or the decoder block 12B2 will be discussed below. For the purpose of simplicity of explanation, assume that the circuit blocks 53*a*, 53*b* that receive the bit group N can be omitted.

Then, the two output terminals of the circuit block 51*a* and those of the circuit block 51*b* are connected respectively to the terminals T1, T2. The circuit block 51*a* may show a configuration as illustrated in FIG. 8, whereas the circuit block 51*b* may show a configuration as illustrated in FIG. 12 or 13. Short-circuiting can take place between the terminals T1, T2 depending on the values of the 2-bit data (D1, D0) with the arrangement of FIG. 8 and also on the values of the 4-bit data (D3, D2, D1, D0) with the arrangement of FIG. 12 or 13.

Referring to FIG. 27, T1 and T2 are short-circuited in the circuit block 51*a* of the decoder block 12B1 or 12B2 when the 2-bit data (D1, D2)=(0, 0) or (1, 1).

On the other hand, T1 and T2 are short-circuited in the circuit block 51*b* of the decoder block 12B3 when the 4-bit data (D3, D2, D1, D0)=(0, 0, 0, 0), (0, 0, 1, 1), (1, 1, 0, 0) or (1, 1, 1, 1).

Therefore, in the decoder block 12B3, short-circuiting can take place between the terminals T1 and T2 due to the decoder block 12B1 or the decoder block 12B2 and an error output can arise. For example, when the 4-bit data (D3, D2, D1, D0)=(0, 1, 0, 0), no short-circuiting take place between T1 and T2 in the decoder block 12B3 but T1 and T2 are short-circuited in the decoder block 12B1 and in the decoder block 12B2 because the lower 2 bits (D1, D0) of the 4-bit data meet the above requirement. Then, referring to FIG. 29, when the thirty seventh tone (D7, D6, D5, D4, D3, D2, D1, D0)=(0, 0, 1, 0, 0, 1, 0, 0) is output, short-circuiting takes place in the decoder block 12B1 and in the decoder block 12B2, although the output voltages of T1 and T2 of the decoder block 12B3 differ from each other (V(T1)=V033, V(T2)=V045) so that the voltages supplied to the terminals T1 and T2 show unexpected values.

On the other hand, no short-circuiting can take place between the terminal T1 and the terminal T2 in the decoder block 12B1 or in the decoder block 12B2 due to the decoder block 12B3. This is because, when short-circuiting takes place between the terminal T1 and the terminal T2 in the circuit block 51*b*, the requirement for short-circuiting between the terminal T1 and the terminal T2 is met in the circuit block 51*a*.

Therefore, when there is a plurality of decoder blocks with different values of m, the circuit block to which the bit group N is input of the decoder block where m takes the largest value can be omitted to prevent short-circuiting between the terminal T1 and the terminal T2, while the circuit blocks to which the bit group N is input of any other decoder blocks need to remain provided.

Now, the number of elements of the arrangements of FIGS. 28 and 29 will be discussed below.

In FIGS. 28 and 29, when the arrangement of FIG. 8 (the number of transistors: 4) is used for the circuit blocks 41*a*, 51*a* and the arrangement of FIG. 12 or that of FIG. 13 (the number of transistors: 12) is used for the circuit blocks 41*b*, 51*b*, while an 8-input tournament type decoder (the number of transistors: 14) is sued for the circuit blocks 42*a*, 52*a* and a 12-input tournament type decoder (the number of transistors: 24) is used for the circuit blocks 42*b*, 52*b*, the total number of transistors of the decoder 12 in FIG. 28 is equal to 276, while the total number of transistors of the decoder 12 in FIG. 29 is equal to 184.

While the number of elements of a decoder may vary depending on how sections are defined, it may be appreciated that the arrangement of decoder of FIG. 29 requires less transistors and hence is more area-saving if compared with the arrangement of decoder of FIG. 28.

Now a modified embodiment of the present invention will be described below. The above-described embodiments are adapted to output a voltage obtained by interpolating the voltage difference between the voltage V(T1) and the voltage V(T2) that are selected and output respectively to the terminals T1, T2 of the amplifier circuit 13 of FIG. 1. However, the present invention is by no means limited to such an arrangement and, according to the present invention, it is also possible to input two input voltages V(T1) and V(T2) serially from a single terminal to thereby further reduce the number of elements. In the following, an arrangement for inputting two input voltages serially to an amplifier circuit and its advantages will be discussed.

Figure 33:
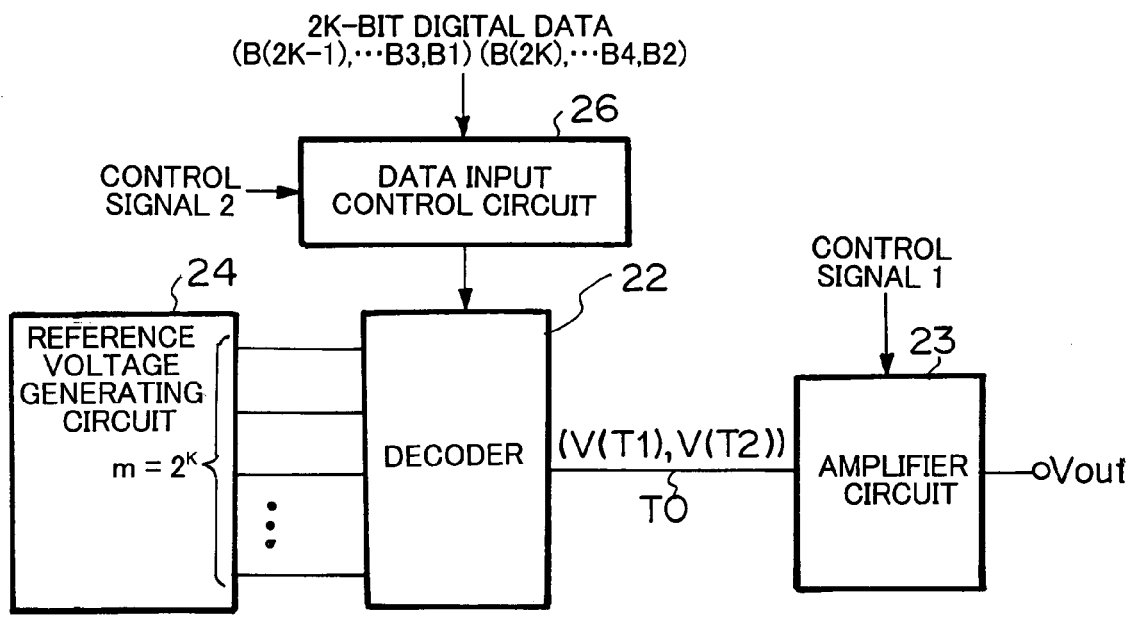
FIG. 33 is a schematic circuit diagram of another embodiment of digital/analog converter (DAC) according to the invention.

FIG. 33 is a schematic circuit diagram of another embodiment of digital/analog converter (DAC) according to the invention, wherein two input voltages are serially input to the amplifier circuit thereof. Referring to FIG. 33, the DAC can maximally output $4^K$ voltage levels by means of a 2K-bit digital data and comprises a reference voltage generating circuit 24, a decoder 22, a data input control circuit 26 and an amplifier circuit 33.

The reference voltage generating circuit 24 generates $2^K$ (m=$2^K$) reference voltages (V(1), V(2), . . . , V($2^K$)) and inputs them to the decoder 22. When the reference voltages (V(1), V(2), . . . , V($2^K$)) are defined by the formula (1), the $4^K$ voltage levels are arranged at regular intervals to provide a linear output profile.

The reference voltage generating circuit 24 is typically formed by using a resistor string and a predetermined voltage is applied to the opposite ends of them so that a voltage can be taken out from each of the taps of the resistor string. The voltage taken out from each of the taps may be amplified and output by means of an amplifier that operates as voltage follower.

The data input control circuit 26 converts the digital data that are input in parallel into serially input digital data. In the following description of FIG. 33, a 2K-bit digital data signal is expressed as (B(2K), B(2K-1), . . . , B3, B2, B1). This signal corresponds to the digital data (D(2K-1), D(2K-2), . . . , D2, D1, D0) in FIGS. 1 through 32. The data input control circuit 26 receives as input a 2K-bit digital data signal (B(2K), B(2K-1), . . . , B3, B2, B1), divides it into a bit signal (B(2K), . . . , B4, B2), or a group of bits, formed by using the even-number-th bits of the 2K-bit digital data signal where the bits from the MSB to the LSB are orderly arranged and a bit signal (B(2K-1), . . . , B3, B1), or a group of bits, formed by using the odd-number-th bits of the 2K-bit signal and outputs the bit groups of the K-bit data in series according to the control signal 2.

The decoder 22 selects one of the $2^K$ reference voltages (V(1), V(2), . . . , V($2^K$)) for each bit group of K-bit data input from the data input control circuit 26 at the same timing and outputs them to terminal T0. The amplifier circuit 23 has a capacity for holding at least either of the two voltages (V(T1), V(T2)) output to the terminal T0 in series and amplifies and outputs the voltage obtained by interpolating the voltage difference of the two voltages to a predetermined ratio (1:2). This operation is controlled according to control signal 1.

Thus, as described above, the DAC of FIG. 33 is realized by modifying the arrangement of FIG. 1, where two voltages are input to the amplifier circuit 13 in parallel by way of two terminals T1, T2 respectively, in such a way that two voltages are input in series by way of a single terminal T0. Therefore, the number of reference voltages and that of output voltage levels remain same as the above-described embodiment. However, the number of elements of the decoder 22 of FIG. 33 is ½ of that of the decoder 12 of FIG. 1 because the transistors necessary for selecting either the terminal T1 or the terminal T2 and outputting a voltage from it in the decoder 12 of FIG. 1 are not required in the decoder of FIG. 22 so that the DAC of FIG. 33 is more area-saving than the DAC of FIG. 1.

Now, the data input control circuit 26, the decoder 22 and the amplifier circuit 23 of FIG. 33 will be described in greater detail below in terms of configuration.

Figure 34A:
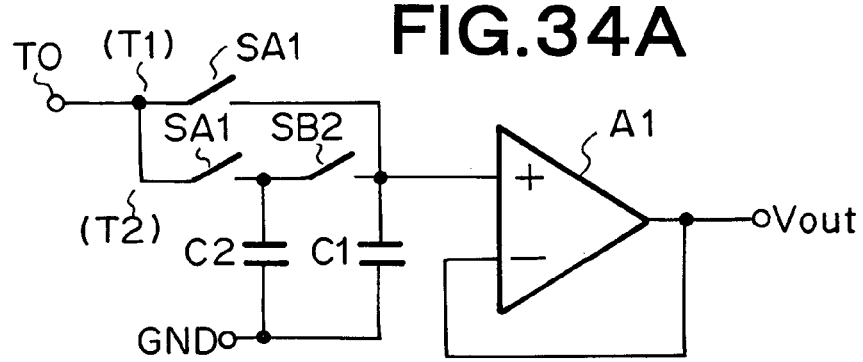
FIGS. 34A and 34B are schematic circuit diagram diagrams of the amplifier circuit 23 of FIG. 33, showing a possible configuration thereof.

FIG. 34A shows a circuit configuration that can be used for the amplifier circuit 23 of FIG. 33. It is formed by modifying the arrangement of FIG. 4. The amplifier circuit of FIG. 4 can amplify and output the voltage obtained by interpolating the voltage difference between the voltage V(T1) and the voltage V(T2) at the terminals T1, T2 to a ratio of 1:2 by the re-combination between the first and second capacitors C1, C2, in which the ratio of the capacitors is defined to be 2:1. Note that either one of the switches SB1, SB2 of FIG. 4 may be omitted. The circuit of FIG. 34A is realized by commonly connecting the terminals T1, T2 of the amplifier circuit shown in FIG. 4 to produce a terminal T0 and removing the switch SB1.

Figure 34B:
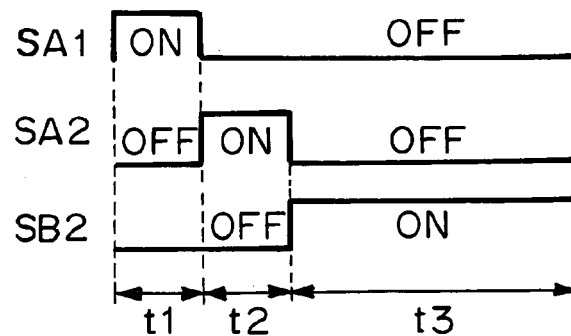

FIG. 34B is a timing chart for turning on and off the switches SA1, SA2, SB2 of the voltage amplifier circuit of FIG. 34A under control in a data output period (t1 through t3). As the switch SA1 is held on while the switches SA2, SB2 are held off in period t1, the voltage input to the terminal T0 at that time is held by the capacitor C1. If the voltage is V(T1), the voltage V(T1) is amplified and output by the voltage follower A1. As the switch SA2 is held on while the switches SA1, SB2 are held off in period t2, the voltage input to the terminal T0 at that time is held by the capacitor C2. The voltage is V(T2). On the other hand, the voltage V(T1) held in the capacitor C1 keeps on being continuously held there after the switch SA1 is turned off. As the switch SB2 is held on while the switches SA1, SA2 are held off in period t3, the electric charges held by the capacitors C1, C2 are recombined so that the voltage of the non-inverting input terminal (+) of the voltage follower A1 is made equal to the voltage obtained by interpolating the voltage difference between the voltage V(T1) and the voltage V(T2) to a ratio of 1:2, which voltage is then amplified and output.

Thus, the amplifier circuit of FIG. 34A is adapted to receive as input the two input voltages V(T1) and V(T2) of FIG. 4 in series in the respective periods of t1, t2. The sequence of inputting the input voltages V(T1), V(T2) can be inverted by inverting the timings of turning on and off the switches SA1, SA2.

Figure 35A:
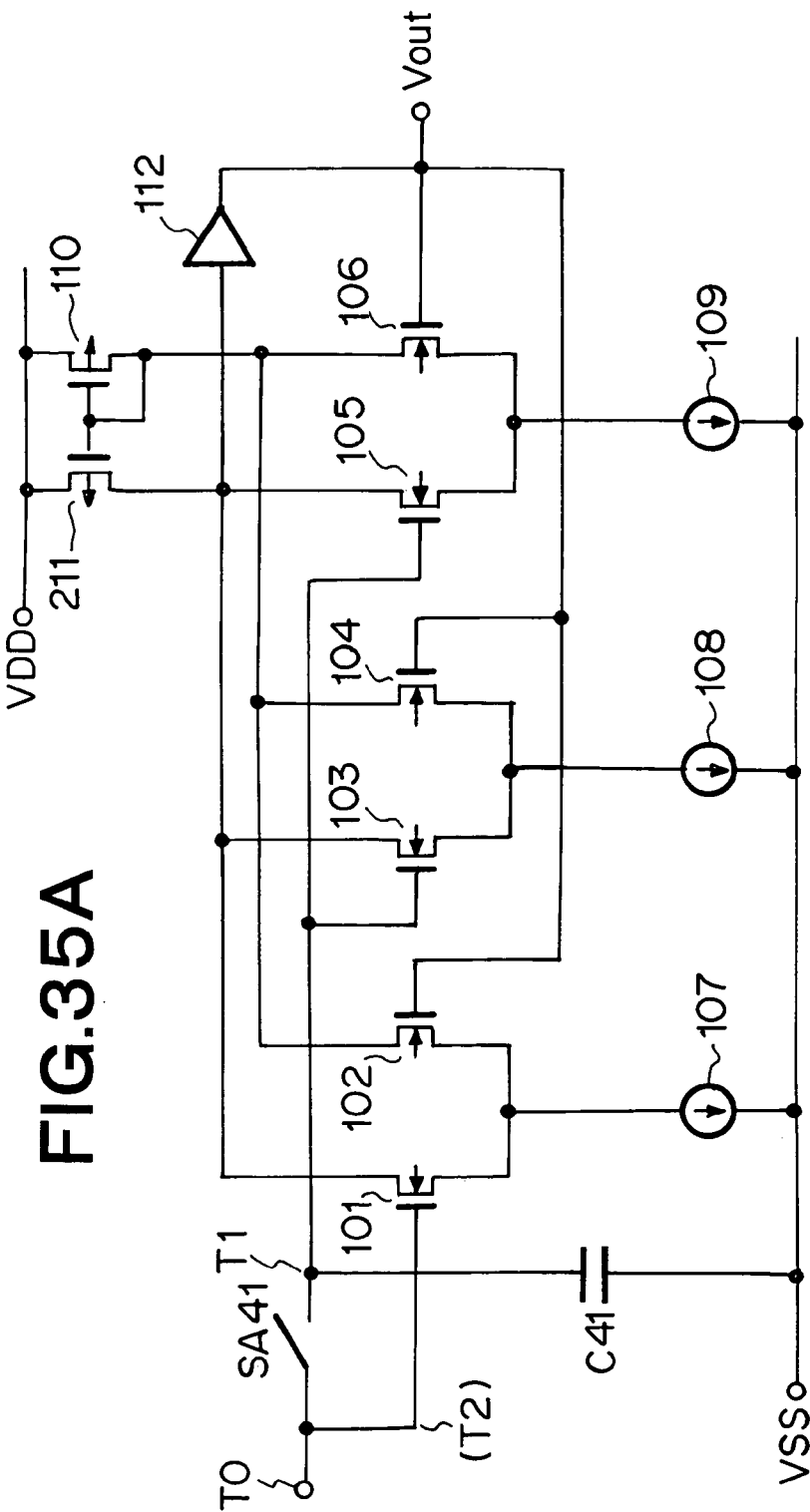
FIGS. 35A and 35B are schematic circuit diagram diagrams of the amplifier circuit 23 of FIG. 33, showing another possible configuration thereof.

FIG. 35A shows another circuit configuration that can also be used for the amplifier circuit 23 of FIG. 33. It is formed by modifying the arrangement of FIG. 5. By seeing FIG. 35A it will be appreciated that the amplifier circuit is realized by using the terminal T2 of FIG. 5 as terminal T0, connecting the switch SW41 to between the terminals T0, T1 and also connecting the capacitor C41 to between the terminal T1 and the supply voltage VSS. The amplifier of FIG. 5 or FIG. 6 may be used for the amplifier 112, although the amplifier 112 of FIG. 6 is used in FIG. 35A. Otherwise, the circuit configuration of FIG. 35A is same as that of FIG. 5.

Figure 35B:
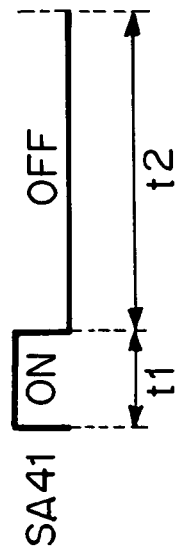

FIG. 35B is a timing chart for turning on and off the switch SW41 of the voltage amplifier circuit of FIG. 35A under control in a data output period (t1 and t2). As the switch SW41 is held on in period t1, the voltage input to the terminal T0 at that time is held in the capacitor C41. If the voltage is V(T1), the voltage V(T1) is input to the non-inverting input terminals (the gates of transistors 101, 103, 105) of differential pairs (101, 102), (103, 104), (105, 106) and amplified as output voltage Vout. As the switch SW41 is held off in period t2, the voltage input to the terminal T0 at that time is input to the non-inverting input terminal (the gate of transistor 101) of the differential pair (101, 102). The voltage is V(T2). On the other hand, the voltage V(T1) held by the capacitor C41 is input to the non-inverting input terminals (the gates of the transistors 103, 105) of the differential pairs (103, 104), (105, 106). Therefore, FIG. 35B is equivalent with FIG. 5 in the period t2 and the voltage obtained by interpolating the voltage difference between the voltage V(T1) and the voltage V(T2) to a ratio of 1:2 is output as output voltage Vout.

Thus, the amplifier circuit of FIG. 35A is adapted to receive as input the two input voltages V(T1) and V(T2) of FIG. 5 in series in the respective periods of t1, t2. The sequence of inputting the input voltages V(T1), V(T2) can be inverted by using the terminal T1 as terminal T0, connecting the switch SW41 to between the terminals T0, T2 and also connecting the capacitor C41 to between the terminal T2 and the supply voltage VSS.

Figure 36:
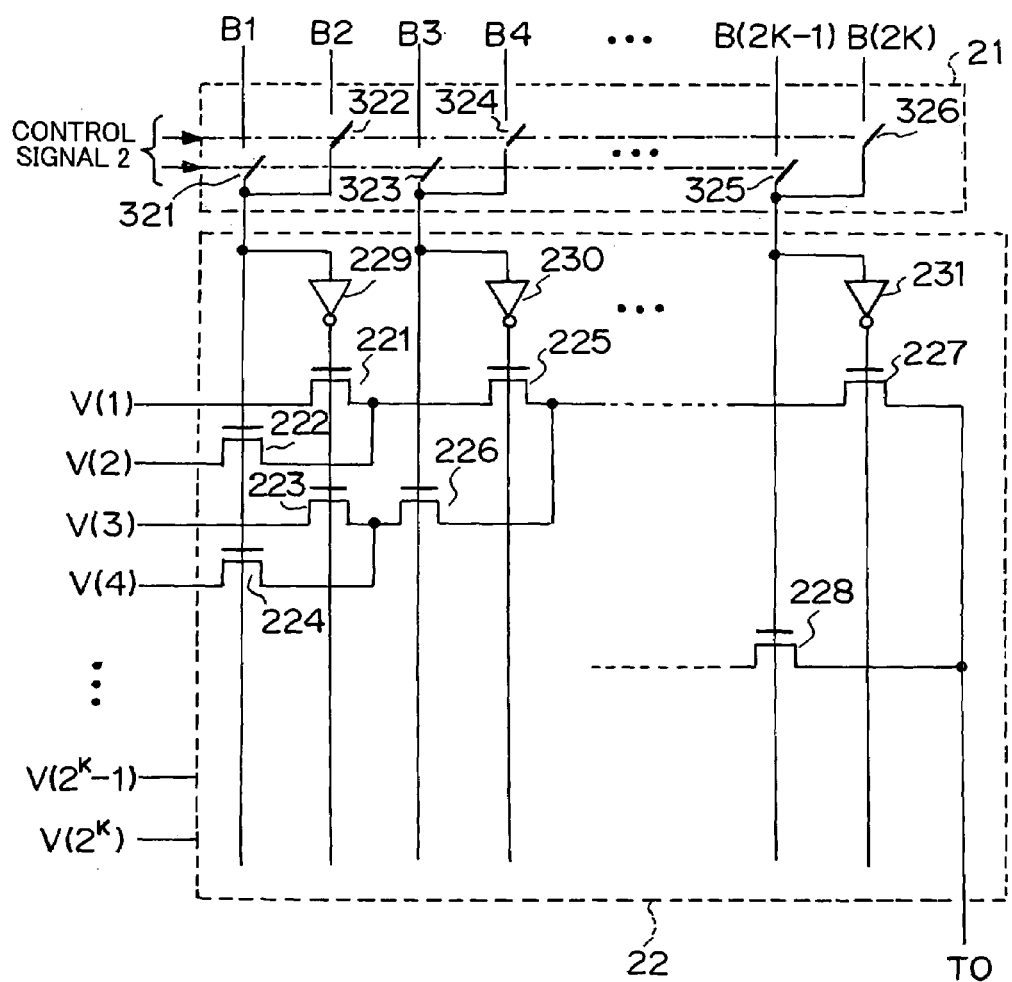
FIG. 36 is a schematic circuit diagram of the data input control circuit 26 and the decoder 22 of FIG. 33, showing a possible configuration thereof.

Now, the circuit configuration of the data input control circuit 26 and that of the decoder 22 of FIG. 33 will be described below. FIG. 36 illustrates the circuit configuration of a data input control circuit 26 and a decoder 22 adapted for a 2K-bit digital data signal (B(2K-1), B(2K-2), . . . , B3, B2, B1).

Referring to FIG. 36, the data input control circuit 26 receives as input a 2K-bit digital data in parallel and forms pairs of 2 bits of bit data B(2L-1) and bit data B(2L) (where L is a positive number from 1 to K) so that it has an output end for each pair. The input ends for odd number bit data B(2L-1) are connected to the output ends by way of switches 821, 823, . . . , 825, whereas the input ends for even number bit data B(2L) are connected to the output ends by way of switches 822, 824, . . . , 826. Each switch is controlled by the control signal 2 for each even number bit group (B(2K), . . . , B4, B2) and for each odd number bit group (B(2K-1), . . . , B3, B1). The K-bit digital data of the even number bit groups and the K-bit digital data of the odd number bit groups are sequentially output from the data input control circuit 26.

Any decoder may be used for the decoder 22 so long as it can select one of the $2^K$ reference voltages (V(1) through V(2K)) according to the K-bit digital data from the data input control circuit 26 and output it to the terminal T0. FIG. 36 shows a tournament type decoder having a configuration similar to that of FIG. 24, although it is partly omitted in FIG. 36. The $2^K$ reference voltages are defined by using the formula (1) and assigned to the circuit sequentially from the voltage V(1) of the lowest level to the voltage V($2^K$) of the highest level. If the voltage selected and output to the terminal T0 according to the data of the even number bit groups (B(2K), . . . , B4, B2) is V(T1) and the voltage selected and output to the terminal T0 according to the data of the odd number bit groups (B(2K-1), . . . , B3, B1) is V(T2), the two voltages V(T1), V(T2) are output to the terminal T0 in series according to the control signal 2.

In the arrangement of FIG. 36, the decoder 22 is shared by the even number bit groups and the odd number bit groups and hence it can be a K-bit decoder to remarkably reduce the number of elements, although a 2K-bit digital data is input to it. The reason why such an arrangement is possible will be discussed below.

Assume firstly that K=2 for 2K bits. FIG. 39 is a schematic illustration of the correspondence of input and output levels for the 4-bit data (D3, D2, D1, D0) as shown in FIG. 11. More specifically, FIG. 39 is formed by modifying FIG. 11 for 4-bit data of (B4, B3, B2, B1) and replacing the voltages A, B, C, D in FIG. 11 with the voltage level numbers prefixed by V. It will be appreciated that FIG. 39 shows the input/output level correspondence when 16 voltage levels are selectively output by means of the 4-bit data (B4, B3, B2, B1). The number of reference voltages can be reduced to four at minimum and, if the voltage levels of the four reference voltages are set respectively to the first, fourth, thirteenth and sixteenth levels, or V01, V04, V13, V16, it is possible linearly output sixteen voltage levels.

FIG. 40 is a schematic illustration of the condition of selection of each reference voltage of FIG. 39 by means of bit data when they are selectively output as voltages V(T1), V(T2). Referring to FIG. 40, the selection for the voltage V(T1) is conducted according to even-numbered bit signals (B4, B2), whereas the selection for the voltage V(T2) is conducted according to odd-numbered bit signals (B3, B1). Same data are used for selecting a same reference voltage. Therefore, the circuit for selecting four reference voltages by means of even numbered bit signals (B4, B2) is equivalent with the circuit for selecting four reference voltages by means of odd numbered bit signals (B3, B1). Thus, if the bit signals are input in series, the circuit for selecting reference voltages can be shared. The above statement is not limited to K=2 but also to any K that is equal to a positive number. The principle underlying this statement will be explained below.

As described earlier, when the output voltage Vout is obtained by interpolating the voltage difference between voltage V(T1) and voltage V(T2) to a ratio of 1:2, the following relationship holds true.

$$\text{Vout} = \{2 \cdot V(T1) + V(T2)\}/3 \qquad (2)$$

When $4^K$ linearly arranged voltages are output by using $2^K$ reference voltages by means of 2K-bit data, the $2^K$ reference voltage VREF can be defined by using the formula (1). The formula (1) can be rewritten to read as in formula (3) below.

$$\text{VREF} = 1 + (,,_0 \cdot 4^0) + (,,_1 \cdot 4^1) + (,,_2 \cdot 4^2) + \ldots + (,,_{K-1} \cdot 4^{K-1})$$
$$= 1 + ,,^{(K-1)}{}_{(X=0)}(,,x \cdot 4^X) \qquad (3),$$

where $,,x = 0, 3$.

When the digital data is 2-K bit data, the 1 through $4^K$ levels of the output voltage Vout is expressed by the formulas below, using binary numbers of 2K digits ($b_{k-1}$, $c_{k-1}$, $b_{k-2}$, $c_{k-2}$, . . . , $b_1$, $c_1$, $b_0$, $c_0$):

$$\text{Vout} = 1 + (c_0 \cdot 2^0) + (b_0 \cdot 2^1) + (c_1 \cdot 2^2) + (b_1 \cdot 2^3) + \ldots + \qquad (4)$$
$$(c_{K-1} \cdot 2^{2(K-1)} + b_{K-1} \cdot 2^{2(K-1)+1})$$
$$= 1 + ,,^{(K-1)}{}_{(x=0)} (c_x \cdot 2^{2x} + b_x \cdot 2^{2x+1}),$$

where $c_x, b_x = 0, 1,$ $$= 1 + ,,^{(K-1)}{}_{(x=0)} (c_x + 2 \cdot b_x) \cdot 4^x, \qquad (5)$$

where $c_x, b_x = 0, 1$.

Note that $c_X$ and $b_X$ are respectively the value of the odd-number-th place and that of the even-number-th place of a binary number of 2K digits. Since binary numbers of 2K digits are expressed by 0 through ($4^K$-1), 1 is added to the right side to make them agree with the number of levels 1 through $4^K$ at the left side Vout of the equation. The ,, term of the formula (5) is an expression of the quaternary system. Table 1 below shows the relationship of ($c_x + 2 \cdot b_x$) relative to $c_x, b_x = 0, 1$.

TABLE 1

| $b_x$ | $c_x$ | $(c_x + 2 \cdot b_x)$ |
| --- | --- | --- |
| 0 | 0 | 0 |
| 0 | 1 | 1 |
| 1 | 0 | 2 |
| 1 | 1 | 3 |

Meanwhile, if the output voltage Vout is at the voltage level obtained by internally dividing the voltage difference between the reference voltages V(T1) and V(T2) to a ratio of 1:2, the equation (2) holds true and the reference voltage V(T1) and V(T2) are defined by the formula (3). Thus, V(T1) an V(T2) are expressed as follows on the basis of the formula (3):

$$V(T1) = 1 + ,,^{(K-1)}{}_{(X=0)}(,,x \cdot 4^X) \qquad (6),$$

where $,,x = 0, 3$ and $$V(T2) = 1 + ,,^{(K-1)}{}_{(X=0)}(,,x \cdot 4^X) \qquad (7),$$

where $,,x = 0, 3$.

The equation below is obtained by substituting the formula (2) by (6) and (7) above:

$$\text{Vout} = 1 + ,,^{(K-1)}{}_{(X=0)}\{(,,x + 2 \cdot ,,x)/3\} \cdot 4^X,$$

where $,,x, ,,x = 0, 3$.

The ,, term of the equation (4) expresses a number of the quaternary system and $\{(,,x + 2 \cdot ,,x)/3\}$ expresses the value of each digit. Table 2 below shows the relationship of $\{(,,x + 2 \cdot ,,x)/3\}$ relative to $,,x, ,,x = 0, 3$.

TABLE 2

| ,,x | ,,x | (,,x + 2 · ,,x)/3 |
| --- | --- | --- |
| 0 | 0 | 0 |
| 0 | 3 | 1 |
| 3 | 0 | 2 |
| 3 | 3 | 3 |

By comparing the formula (8) and Table 2, it will be appreciated they are equivalent to the formula (5) and Table 1 respectively. Thus, it is clear that V(T1) and V(T2) are defined by the formula (3) and, when the requirement of the formula (2) is met, Vout takes any of the levels 1 through $4^K$. By comparing Table 1 and Table 2, the following relationship is drawn:

$$,,x=3 \cdot b_X \quad (9),$$

where $b_X=0, 1$ and $$,,x=3 \cdot c_X \quad (10),$$

where $c_X=0, 1$.

The equations shown below are obtained by substituting the formulas (6) and (7) respectively by the formulas (9) and (10);

$$V(T1)=1+,,^{(K-1)}{}_{(X=0)}(3 \cdot b_X \cdot 4^X) \quad (11),$$

where $b_X=0, 1$ and $$V(T2)=1+,,^{(K-1)}{}_{(X=0)}(3 \cdot c_X \cdot 4^X) \quad (12),$$

where $c_X=0, 1$.

From the equations (11) and (12), it is clear that the level of V(T1) is defined by the values of the even-number-th digits of the binary expression of Vout while V(T2) is defined by the values of the odd-number-th digits of the binary expression of Vout. Thus, when the output voltage Vout is at the level obtained by internally dividing the voltage difference between the voltages V(T1) and V(T2), the voltages (VT1) and V(T2) are selected according to an even-number-th bit signal and an odd-number-th bit signal respectively.

The relationship between the binary expression of Vout and the voltages V(T1), V(T2) will be described below. The expression (11) for V(T1) is modified to a binary expression as shown below:

$$V(T1)=1+,,^{(K-1)}{}_{(X=0)}\{(2+1) \cdot b_X \cdot 4^X\}=1+,,^{(K-1)}{}_{(X=0)} (b_x \cdot 2^{2X+1}+b_X \cdot 2^{2X}\} \quad (13),$$

where $b_X=0,1$.

By comparing the formula (4) and the formula (13) and if the output level of Vout is associated with a binary number and the even-number-th digits and the odd-number-th digits are expressed by bx and $c_x$ respectively, it will be drawn that V(T1) shows the voltage level where the two digits equal to $(b_X, c_X)$ are $(b_X, b_X)$.

Similarly, the expression (12) for V(T2) is modified to a binary expression as shown below:

$$V(T2)=1+,,^{(K-1)}{}_{(X=0)}(c_x \cdot 2^{2X+1}+c_X \cdot 2^{2X}\} \quad (14),$$

where $c_x=0, 1$.

By comparing the formula (4) and the formula (14) and if the output level of Vout is associated with a binary number and the even-number-th digits and the odd-number-th digits are expressed by $b_x$ and $c_x$ respectively, it will be drawn that V(T2) shows the voltage level where the two digits equal to $(b_X, c_X)$ are $(c_X, c_X)$.

If, for example, Vout that corresponds to 4-bit data (B4, B3, B2, B2) is (0, 1, 0, 0), the V(T1) is equal to (0, 0, 0, 0) due to the values of the even-number-th digits, which are B4 and B2, whereas V(T2) is equal to (1, 1, 0, 0) due to the values of the odd-number-th digits, which are B3 and B1. Thus, they reflect the relationship illustrated in FIG. 39.

If the same reference voltage is selected for V(T1) and V(T2), V(T1)=V(T2)=Vout from the equation (2) and hence $b_X=c_X$ from the formulas (13) and (14). Therefore, when the same reference voltage is selected for V(T1) and V(T2), the values of the even-number-th digits of the binary expression that define V(T1) are equal to the values of the odd-number-th digits of the binary expression that define V(T2). For example, in FIG. 40, both the even numbered bit data (B4, B2) and the odd numbered bit data (B3, B1) for selecting and outputting the reference voltage V01 for V(T1) and V(T2) are (0, 0) and hence equal to each other. A similar statement applies to any other reference voltage.

Thus, for the purpose of the present invention, the circuit for selecting a reference voltage according to the data of a group of even numbered bits and the circuit for selecting a reference voltage according to the data of a corresponding group of odd numbered bits are equivalent with each other. Thus, the decoder 22 of FIG. 36 can be shared by a group of even numbered bits and the data of a group of odd numbered bits and hence they can be sequentially input to the decoder 22 in series. Therefore, the DAC of FIG. 33 can be realized by using a decoder 22 where the number of elements is remarkably reduced and hence an area-saving effect is achieved.

Figure 37:
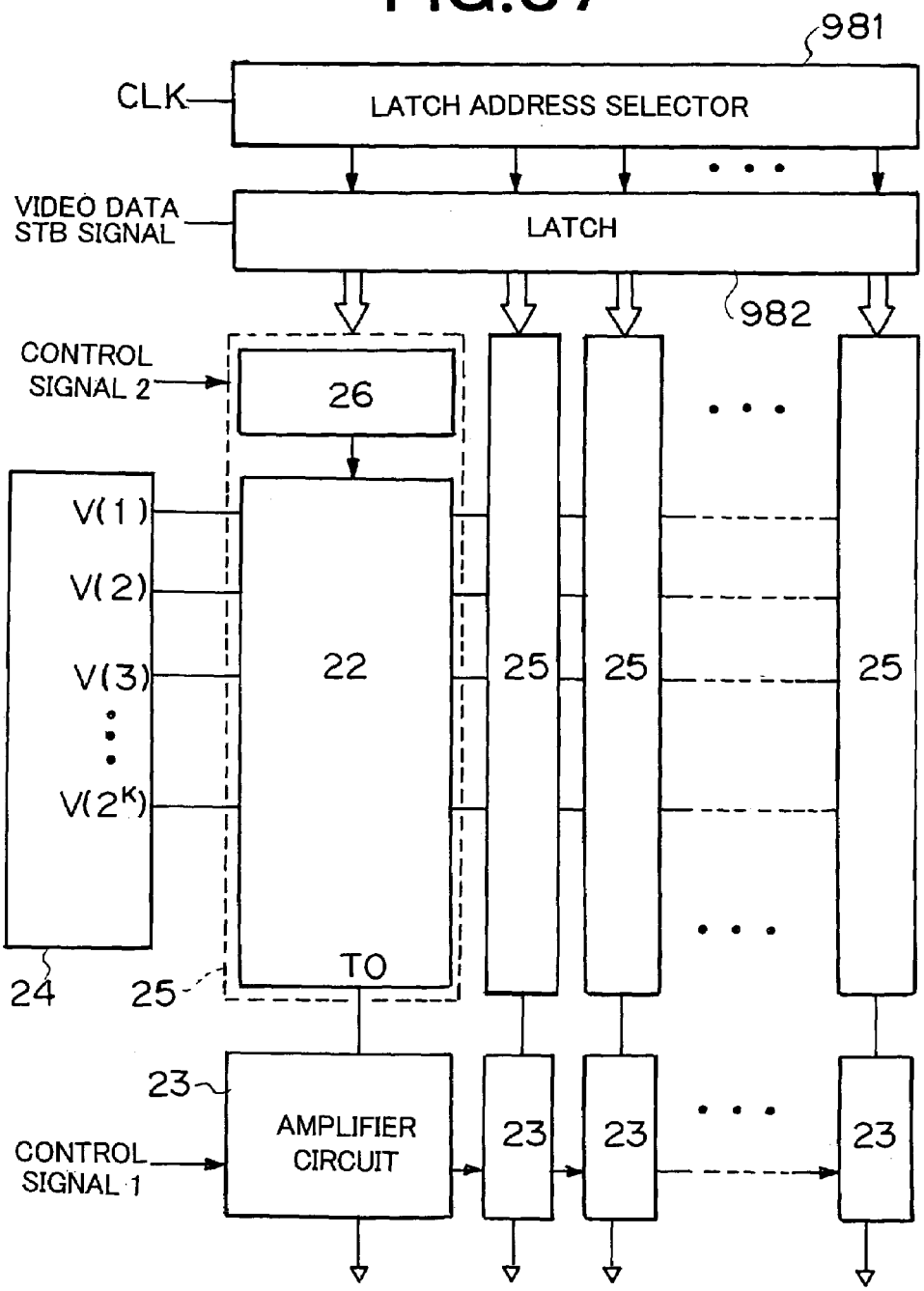
FIG. 37 is a schematic block diagram of the data driver of another embodiment of the invention.

FIG. 37 is a schematic block diagram of the data driver of another embodiment of the invention. It is realized by modifying the DAC of FIG. 33 so as to operate as multiple-output DACs. More specifically, it is realized by replacing the decoder 12, the amplifier circuit 13 and the tone voltage generating circuit 14 of the data driver of FIG. 18 with the data input control circuit 26, the decoder 22, the amplifier circuit 23 and the reference voltage generating circuit 24 of FIG. 33. Note that, in FIG. 37, the data input control circuit 26 and the decoder 22 are collectively denoted by circuit 25. The latch address selector 981 and the latch 982 in FIG. 37 may be equivalent to those of FIG. 18.

The reference voltage generating circuit 24 generates and outputs 2K reference voltages for $4^K$ output levels and is shared by the multiple-output DACs. When the $2^K$ reference voltages are defined by the formula (3), the $4^K$ output levels of the DACs shows a linear profile. The arrangement of FIG. 36 may be used for the circuit 25 of FIG. 37. The arrangement of FIG. 34 or 35 may be used for the amplifier circuit 23 of FIG. 37. If such is the case, control signal 1 and control signal 2 control the timing of operation in such a way that the data of the group of even numbered bits is output from the data input control circuit 26 to the decoder 22 in the period t1 of FIGS. 34 and 35 and the reference voltage selected according to the data is input to the amplifier circuit 23 as voltage V(T1), whereas the data of the group of odd numbered bits is output from the data input control circuit 26 to the decoder 22 in the period t2 and the reference voltage selected according to the data is input to the amplifier circuit 23 as voltage V(T2).

Each DAC of FIG. 37 may be formed by using a plurality of blocks, each block providing a total of $4^K$ output levels. Then, the $2^K$ reference voltages are divided by the number of blocks when they are generated by the reference voltage generating circuit 24 and the decoder 22 is also arranged to match the number of blocks. However, the data input control circuit 26 can be shared by the plurality of blocks of the decoder 22. Each of the blocks provides the advantage of effect of reducing the number of elements and the area-saving effect as pointed out above.

The supply voltage of each of the reference (tone) voltage generating circuits 14, the decoder 12, and the amplifier circuit 13 illustrated in FIG. 18 and the reference (tone) voltage generating circuit 24, the decoder 22 and the amplifier circuit 23 illustrated in FIG. 37 is defined by the voltage generated by the corresponding reference (tone) voltage generating circuit. On the other hand, the supply voltage of each of the data input control circuit 26, the latch address selector 981 and the latch 982 can be defined separately from the above supply voltage. In other words, a value lower than the former supply voltage of each of the reference (tone) voltage generating circuits, the decoders, the amplifier circuits may be selected for the purpose of achieving an area-saving effect and a power-saving effect.

In such a case, a level shift circuit is provided. When a level shift circuit is applied to the present invention, it is preferably arranged between the latch 982 and the decoder 12 in FIG. 18 and between the data input control circuit 26 and the decoder 22 in FIG. 37.

Figure 38:
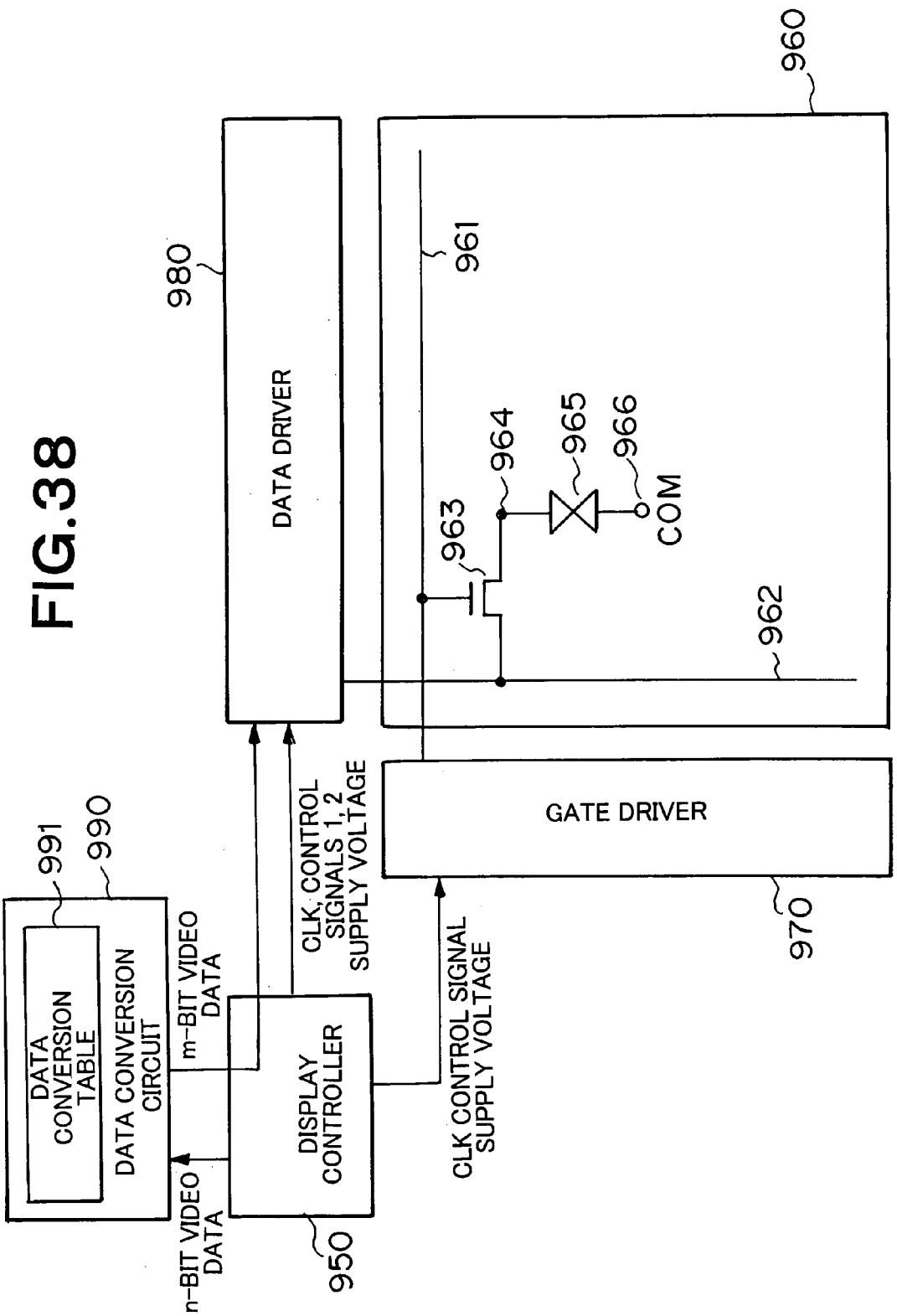
FIG. 38 is a schematic block diagram of an embodiment of display apparatus according to the invention, which is an active matrix type liquid crystal display apparatus.

FIG. 39 illustrates an embodiment of display apparatus according to the invention. In FIG. 39, the data driver 980 has a configuration as shown in FIG. 38 and is adapted to receive m ($=2^K$) bit data as input and output voltages showing a linear profile. When a data driver that is adapted to output voltages showing a linear profile is used, it is possible to output tone voltages that match the gamma characteristic of the display device (liquid crystal, organic EL element or the like) by assigning tone voltages that match the gamma characteristic out of a large number of output voltages showing a linear profile. For this reason, the data driver has a number of linearly arranged tones that is greater than the number of tones to be displayed. The arrangement of FIG. 39 comprises a data conversion table 991 for converting n-bit data that correspond to the tones to be displayed into m-bit data (m>n) that correspond to the linearly arranged tones and a data conversion circuit 990 for converting data according to the data conversion table 991. The data conversion table 991 is preferably adapted to correspond to the gamma curve of liquid crystal and the characteristic of each of the RGB of liquid crystal and organic EL. The data conversion table 991 and the data conversion circuit 990 are arranged so as to input m (=2K)-bit data to the data driver 980. They are preferably linked with a display controller 950 as shown in FIG. 39 for the purpose of simplicity of arrangement.

As described above by referring to FIGS. 33 through 40 as supplement, according to the present invention, it is possible to remarkably reduce the number of elements of the decoder and achieve an area-saving effect by providing a data input control circuit 26 for converting the input 2K-bit digital data into a group of even numbered bits and a group of odd numbered bits that are output in series and modifying the amplifier circuit so as to amplify and output the voltage obtained by interpolating the voltage difference of the two voltages that are input in time series. As the chip size is reduced, it is possible to realize a low cost data driver LSI, which will contribute enormously for reducing the cost of manufacturing a display apparatus. Additionally, in the case of a display apparatus produced by integrally forming a display section, a gate driver, a data driver and so on by means of thin film semiconductors typically made of poly-silicon (amorphous silicon), it is possible to produce a low depth display apparatus due to the effect of saving the area of the data driver.

While the present invention is described above by way of preferred embodiments, the present invention is by no means limited thereto and it may be apparent to those who are skilled in the art that the above-described embodiments may be modified and/or altered in various different ways without departing from the scope of the present invention.

What is claimed is:

1. An output circuit comprising:
   a selection circuit for receiving as input a plurality of m reference voltages (wherein m=$2^K$, and K is a positive integer number equal to or more than 2) reference voltages having mutually different respective voltage values and selecting a pair of two reference voltages supplied to first and second terminals out of square of m combinations of the m reference voltages according to an input selection signal; and
   an amplifier circuit for receiving as input the voltages supplied to the first and second terminals and outputting the voltage obtained by internally dividing the difference of the voltages of the first and second terminals to a predetermined internal ratio from an output terminal, wherein
   any one of square of m different voltages corresponding to the square of m different combinations of the m reference voltages is output from the output terminal.

2. The output circuit according to claim 1, wherein the square of m different reference voltages output from the output terminal have regular voltage intervals.

3. The circuit according to claim 1, wherein
   the selection circuit receives as input first through fourth reference voltages (A, B, C, D) having mutually different voltage values and supplies one of the pairs of
   the first, first reference voltages (A, A),
   the first, second reference voltages (A, B),
   the second, first reference voltages (B, A),
   the second, second reference voltages (B, B),
   the first, third reference voltages (A, C),
   the first, fourth reference voltages (A, D),
   the second, third reference voltages (B, C),
   the second, fourth reference voltages (B, D),
   the third, first reference voltages (C, A),
   the third, second reference voltages (C, B),
   the fourth, first reference voltages (D, A),
   the fourth, second reference voltages (D, B),
   the third, third reference voltages (C, C),
   the third, fourth reference voltages (C, D),
   the fourth, third reference voltages (D, C) and
   the fourth, fourth reference voltages (D, D)
   selected according to the selection signal to the first and second terminals so that voltages of square of four mutually different voltage levels can be output at maximum.

4. The circuit according to claim 3, wherein
   the selection circuit is so arranged as to select two of the first through fourth reference voltages according to the total of 4 bits of the first through fourth signals that operate as selection signals and output them to the first and second terminals respectively and
   the circuit further comprising a plurality of switches for controlling the respective connections between the supply terminals of the first through fourth reference voltages and the first and second terminals,
   the supply terminal of the first reference voltage being connected to the first terminal by way of two switches adapted to receive as input the complementary signal of the second signal and the complementary signal of the fourth signal at the respective control terminals,
   the supply terminal of the first reference voltage being connected to the second terminal by way of two switches adapted to receive as input the complementary signal of the first signal and the complementary signal of the third signal at the respective control terminals, the supply terminal of the second reference voltage being connected to the first terminal by way of two switches adapted to receive as input the second signal and the complementary signal of the fourth signal at the respective control terminals, the supply terminal of the second reference voltage being connected to the second terminal by way of two switches adapted to receive as input the first signal and the complementary signal of the third signal at the respective control terminals, the supply terminal of the third reference voltage being connected to the first terminal by way of two switches adapted to receive as input the complementary signal of the second signal and the fourth signal at the respective control terminals, the supply terminal of the third reference voltage being connected to the second terminal by way of two switches adapted to receive as input the complementary signal of the first signal and the third signal at the respective control terminals, the supply terminal of the fourth reference voltage being connected to the first terminal by way of two switches adapted to receive as input the second signal and the fourth signal at the respective control terminals, the supply terminal of the fourth reference voltage being connected to the second terminal by way of two switches adapted to receive as input the first signal and the third signal at the respective control terminals.

5. The circuit according to claim 3, wherein
the selection circuit is so arranged as to select two of the first through fourth reference voltages according to the total of 4 bits of the first through fourth signals that operate as selection signals and output them to the first and second terminals respectively and the circuit further comprises:

first and second switches connected between the first terminal and the supply terminal of the first reference voltage to receive as input the complementary signal of the second signal and the complementary signal of the fourth signal at the respective control terminals, third and fourth switches connected between the second terminal and the supply terminal of the first reference voltage to receive as input the complementary signal of the first signal and the complementary signal of the third signal at the respective control terminals, fifth and sixth switches connected between the first terminal and the supply terminal of the second reference voltage to receive as input the second signal and the complementary signal of the fourth signal at the respective control terminals, seventh and eighth switches connected between the second terminal and the supply terminal of the second reference voltage to receive as input the first signal and the complementary signal of the third signal at the respective control terminals, a ninth switch connected between the connection point of the first and second switches and the supply terminal of the third reference voltage to receive as input the fourth signal at the control terminal, a tenth switch connected between the connection point of the third and fourth switches and the supply terminal of the third reference voltage to receive as input the third signal at the control terminal, an eleventh switch connected between the connection point of the fifth and sixth switches and the supply terminal of the fourth reference voltage to receive as input the fourth signal at the control terminal and a twelfth switch connected between the connection point of the seventh and eighth switches and the supply terminal of the fourth reference voltage to receive as input the third signal at the control terminal.

6. The circuit according to claim 3, wherein
the selection circuit is so arranged as to select two of the first through fourth reference voltages according to the total of 4 bits of the first through fourth signals that operate as selection signals and output them to the first and second terminals respectively and the circuit further comprises:

first and second switches connected between the first reference voltage supply terminal and the first terminal to receive as input the complementary signal of the second signal and the complementary signal of the fourth signal at the respective control terminals, third and fourth switches connected between the first reference voltage supply terminal and the second terminal to receive as input the complementary signal of the first signal and the complementary signal of the third signal at the respective control terminals, a fifth switch connected between the second reference voltage supply terminal and the connection point of the first and second switches to receive as input the second signal at the control terminal, a sixth switch connected between the second reference voltage supply terminal and the connection point of the third and fourth switches to receive as input the first signal at the control terminal, seventh and eighth switches connected between the third reference voltage supply terminal and the first terminal to receive as input the complementary signal of the second signal and the fourth signal at the respective control terminals, ninth and tenth switches connected between the third reference voltage supply terminal and the second terminal to receive the complementary signal of the first signal and the third signal at the respective control terminals, an eleventh switch connected between the fourth reference voltage supply terminal and the connection point of the seventh and eighth switches to receive as input the second signal at the control terminal, and a twelfth switch connected between the fourth reference voltage supply terminal and the connection point of the ninth and tenth switches to receive as input the first signal at the control terminal.

7. The circuit according to claim 3, wherein
the internal ratio is 1:2 or 2:1 and the sum of double of the input voltage of either the first terminal or the second terminal and the input voltage of the other terminal of the first and second terminals shows a relationship of being equal to three times of the output voltage, the first through fourth reference voltages being respectively at the first, fourth, thirteenth and sixteenth levels out of the first through sixteenth voltage levels arranged at regular intervals so that voltages of a total of sixteen levels including the output voltage of the level due to the selection of the pair of the first, first reference voltages (A, A) through the output voltage of the level due to the selection of the pair of the fourth, fourth reference voltages (D, D) are output at the selection circuit.

8. The circuit according to claim 1, wherein
the selection circuit receives as input first through eighth reference voltages (A, B, C, D, E, F, G, H) having mutually different voltage values and supplies one of the pairs of
the first, first reference voltages (A, A),
the first, second reference voltages (A, B),
the second, first reference voltages (B, A),
the second, second reference voltages (B, B),
the first, third reference voltages (A, C),
the first, fourth reference voltages (A, D),
the second, third reference voltages (B, C),
the second, fourth reference voltages (B, D),
the third, first reference voltages (C, A),
the third, second reference voltages (C, B),
the fourth, first reference voltages (D, A),
the fourth, second reference voltages (D, B),
the third, third reference voltages (C, C),
the third, fourth reference voltages (C, D),
the fourth, third reference voltages (D, C),
the fourth, fourth reference voltages (D, D),
the first, fifth reference voltages (A, E),
the first, sixth reference voltages (A, F),
the second, fifth reference voltages (B, E),
the second, sixth reference voltages (B, F),
the first, seventh reference voltages (A, G),
the first, eighth reference voltages (A, H),
the second, seventh reference voltages (B, G),
the second, eighth reference voltages (B, H),
the third, fifth reference voltages (C, E),
the third, sixth reference voltages (C, F),
the fourth, fifth reference voltages (D, E),
the fourth, sixth reference voltages (D, F),
the third, seventh reference voltages (C, G),
the third, eighth reference voltages (C, H),
the fourth, seventh reference voltages (D, G),
the fourth, eighth reference voltages (D, H),
the fifth, first reference voltages (E, A),
the fifth, second reference voltages (E, B),
the sixth, first reference voltages (F, A),
the sixth, second reference voltages (F, B),
the fifth, third reference voltages (E, C),
the fifth, fourth reference voltages (E, D),
the sixth, third reference voltages (F, C),
the sixth, fourth reference voltages (F, D),
the seventh, first reference voltages (G, A),
the seventh, second reference voltages (G, B),
the eighth, first reference voltages (H, A),
the eighth, second reference voltages (H, B),
the seventh, third reference voltages (G, C),
the seventh, fourth reference voltages (G, D),
the eighth, third reference voltages (H, C),
the eighth, fourth reference voltages (H, D),
the fifth, fifth reference voltages (E, E),
the fifth, sixth reference voltages (E, F),
the sixth, fifth reference voltages (F, E),
the sixth, sixth reference voltages (F, F),
the fifth, seventh reference voltages (E, G),
the fifth, eighth reference voltages (E, H),
the sixth, seventh reference voltages (F, G),
the sixth, eighth reference voltages (F, H),
the seventh, fifth reference voltages (G, E),
the seventh, sixth reference voltages (G, F),
the eighth, fifth reference voltages (H, E),
the eighth, sixth reference voltages (H, F),
the seventh, seventh reference voltages (G, G),
the seventh, eighth reference voltages (G, H),
the eighth, seventh reference voltages (H, G) and
the eighth, eighth reference voltages (H, H)
according to the selection signal and supplies the selected pair to the first and second terminals so as to be capable of outputting square of eight mutually different voltage levels from the output terminals.

9. The circuit according to claim 8, wherein
the selection circuit is so arranged as to select two of the first through eighth reference voltages according to the total of 6 bits of the first through sixth signals that operate as selection signals and output them to the first and second terminals respectively, and
the circuit further comprising a plurality of switches for controlling the respective connections between the supply terminals of the first through eighth reference voltages and the first and second terminals,
the supply terminal of the first reference voltage being connected to the first terminal by way of three switches adapted to receive as input the complementary signal of the second signal, the complementary signal of the fourth signal and the complementary signal of the sixth signal at the respective control terminals,
the supply terminal of the first reference voltage being connected to the second terminal by way of three switches adapted to receive as input the complementary signal of the first signal, the complementary signal of the third signal and the complementary signal of the fifth signal at the respective control terminals,
the supply terminal of the second reference voltage being connected to the first terminal by way of three switches adapted to receive as input the second signal, the complementary signal of the fourth signal and the complementary signal of the sixth signal at the respective control terminals,
the supply terminal of the second reference voltage being connected to the second terminal by way of three switches adapted to receive as input the first signal, the complementary signal of the third signal and the complementary signal of the fifth signal at the respective control terminals,
the supply terminal of the third reference voltage being connected to the first terminal by way of three switches adapted to receive as input the complementary signal of the second signal, the fourth signal and the complementary signal of the sixth signal at the respective control terminals,
the supply terminal of the third reference voltage being connected to the second terminal by way of three switches adapted to receive as input the complementary signal of the first signal, the third signal and the complementary signal of the fifth signal at the respective control terminals,
the supply terminal of the fourth reference voltage being connected to the first terminal by way of three switches adapted to receive as input the second signal, the fourth signal and the complementary signal of the sixth signal at the respective control terminals,
the supply terminal of the fourth reference voltage being connected to the second terminal by way of three switches adapted to receive as input the first signal, the third signal and the complementary signal of the fifth signal at the respective control terminals,
the supply terminal of the fifth reference voltage being connected to the first terminal by way of three switches adapted to receive as input the complementary signal of the second signal, the complementary signal of the fourth signal and the sixth signal at the respective control terminals, the supply terminal of the fifth reference voltage being connected to the second terminal by way of three switches adapted to receive as input the complementary signal of the first signal, the complementary signal of the third signal and the fifth signal at the respective control terminals, the supply terminal of the sixth reference voltage being connected to the first terminal by way of three switches adapted to receive as input the second signal, the complementary signal of the fourth signal and the sixth signal at the respective control terminals, the supply terminal of the sixth reference voltage being connected to the second terminal by way of three switches adapted to receive as input the first signal, the complementary signal of the third signal and the fifth signal at the respective control terminals, the supply terminal of the seventh reference voltage being connected to the first terminal by way of three switches adapted to receive as input the complementary signal of the second signal, the fourth signal and the sixth signal at the respective control terminals, the supply terminal of the seventh reference voltage being connected to the second terminal by way of three switches adapted to receive as input the complementary signal of the first signal, the third signal and the fifth signal at the respective control terminals, the supply terminal of the eighth reference voltage being connected to the first terminal by way of three switches adapted to receive as input the second signal, the fourth signal and the sixth signal at the respective control terminals, the supply terminal of the eighth reference voltage being connected to the second terminal by way of three switches adapted to receive as input the complementary signal of the first signal, the third signal and the fifth signal at the respective control terminals.

10. The circuit according to claim 8, wherein the selection circuit is so arranged as to select two of the first through eighth reference voltages according to the total of 6 bits of the first through six signals that operate as selection signals and output them to the first and second terminals respectively and the circuit further comprises:

first through third switches connected between the supply terminal of the first reference voltage and the first terminal to receive as input the complementary signal of the second signal, the complementary signal of the fourth signal and the complementary signal of the sixth signal at the respective control terminals, fourth through sixth switches connected between the supply terminal of the first reference voltage and the second terminal to receive as input the complementary signal of the first signal, the complementary signal of the third signal and the complementary signal of the fifth signal at the respective control terminals, seventh through ninth switches connected between the supply terminal of the second reference voltage and the first terminal to receive as input the second signal, the complementary signal of the fourth signal and the complementary signal of the sixth signal at the respective control terminals, tenth through twelfth switches connected between the supply terminal of the second reference voltage and the second terminal to receive as input the first signal, the complementary signal of the third signal and the complementary signal of the fifth signal at the respective control terminals, thirteenth through fifteenth switches connected between the supply terminal of the third reference voltage and the first terminal to receive as input the complementary signal of the second signal, the fourth signal and the complementary signal of the sixth signal at the respective control terminals, sixteenth through eighteenth switches connected between the supply terminal of the third reference voltage and the second terminal to receive as input the complementary signal of the first signal, the third signal and the complementary signal of the fifth signal at the respective control terminals, nineteenth through twenty first switches connected between the supply terminal of the fourth reference voltage and the first terminal to receive as input the second signal, the fourth signal and the complementary signal of the sixth signal at the respective control terminals, twenty second through twenty fourth switches connected between the supply terminal of the fourth reference voltage and the second terminal to receive as input the first signal, the third signal and the complementary signal of the fifth signal at the respective control terminals, twenty fifth through twenty seventh switches connected between the supply terminal of the fifth reference voltage and the first terminal to receive as input the complementary signal of the second signal, the complementary signal of the fourth signal and the sixth signal at the respective control terminals, twenty eighth through thirtieth switches connected between the supply terminal of the fifth reference voltage and the second terminal to receive as input the complementary signal of the first signal, the complementary signal of the third signal and the fifth signal at the respective control terminals, thirty first through thirty third switches connected between the supply terminal of the sixth reference voltage and the first terminal to receive as input the second signal, the complementary signal of the fourth signal and the sixth signal at the respective control terminals, thirty fourth through thirty sixth switches connected between the supply terminal of the sixth reference voltage and the second terminal to receive as input the first signal, the complementary signal of the third signal and the fifth signal at the respective control terminals, thirty seventh through thirty ninth switches connected between the supply terminal of the seventh reference voltage and the first terminal to receive as input the complementary signal of the second signal, the fourth signal and the sixth signal at the respective control terminals, fortieth through forty second switches connected between the supply terminal of the seventh reference voltage and the second terminal to receive as input the complementary signal of the first signal, the third signal and the fifth signal at the respective control terminals, forty third through forty fifth switches connected between the supply terminal of the eighth reference voltage and the first terminal to receive as input the second signal, the fourth signal and the sixth signal at the respective control terminals, and forty sixth through forty eighth switches connected between the supply terminal of the eighth reference voltage and the second terminal to receive as input the complementary signal of the first signal, the third signal and the fifth signal at the respective control terminals, as for the switches for commonly receiving as input the complementary signal of the third signal at the control terminals, (a01) the fifth and eleventh switches share a single switch or formed by two respective switches and (a02) the twenty ninth and thirty fifth switches share a single switch or formed by two respective switches, as for the switches for commonly receiving as input the third signal at the control terminals, (a03) the seventeenth and twenty third switches share a single switch or formed by two respective switches and (a04) the forty first and forty seventh switches share a single switch or formed by two respective switches, as for the switches for commonly receiving as input the fourth signal at the control terminals, (a05) the fourteenth and twentieth switches share a single switch or formed by two respective switches and (a06) the thirty eighth and forty fourth switches share a single switch or formed by two respective switches, as for the switches for commonly receiving as input the complementary signal of the fourth signal at the control terminals, (a07) the second and eighth switches share a single switch or formed by two respective switches and (a08) the twenty sixth and thirty second switches share a single switch or formed by two respective switches, as for the switches for commonly receiving as input the complementary signal of the fifth signal at the control terminals, (a09) the sixth, twelfth, eighteenth and twenty fourth switches share a single switch or (a10) the sixth and twelfth switches share a single switch or formed by two respective switches and the eighteenth and twenty fourth switches share a single switch or formed by two respective switches, as for the switches for commonly receiving as input the fifth signal at the control terminals, (a11) the thirtieth, thirty sixth, forty second and forty eighth switches share a single switch or (a12) the thirtieth and thirty sixth switches share a single switch or formed by two respective switches and the forty second and forty eighth switches share a single switch or formed by two respective switches, as for the switches for commonly receiving as input the sixth signal at the control terminals, (a13) the twenty seventh, thirty third, thirty ninth and forty fifth switches share a single switch or (a14) the twenty seventh and thirty third switches share a single switch or formed by two respective switches and the thirty ninth and forty fifth switches share a single switch or formed by two respective switches and as for the switches for commonly receiving as input the complementary signal of the sixth signal at the control terminals, (a15) the third, ninth, fifteenth and twenty first switches share a single switch or (a16) the third and ninth switches share a single switch or formed by two respective switches and the fifteenth and twenty first switches share a single switch or formed by two respective switches.

11. The circuit according to claim 8, wherein the selection circuit is so arranged as to select two of the first through eighth reference voltages according to the total of 6 bits of the first through six signals that operate as selection signals and output them to the first and second terminals respectively and the circuit further comprises:

first through third switches connected between the supply terminal of the first reference voltage and the first terminal to receive as input the complementary signal of the second signal, the complementary signal of the fourth signal and the complementary signal of the sixth signal at the respective control terminals, fourth through sixth switches connected between the supply terminal of the first reference voltage and the second terminal to receive as input the complementary signal of the first signal, the complementary signal of the third signal and the complementary signal of the fifth signal at the respective control terminals, a seventh switch connected between the supply terminal of the second reference voltage and the connection point of the first and second switches to receive as input the second signal at the control terminal, an eighth switch connected between the supply terminal of the second reference voltage and the connection point of the fourth and fifth switches to receive as input the first signal at the control terminal, ninth and tenth switches connected between the supply terminal of the third reference voltage and the connection point of the second and third switches to receive the complementary signal of the second signal and the fourth signal at the respective control terminals, eleventh and twelfth switches connected between the supply terminal of the third reference voltage and the connection point of the fifth and sixth switches to receive the complementary signal of the first signal and the third signal at the respective control terminals, a thirteenth switch connected between the supply terminal of the fourth reference voltage and the connection point of the ninth and tenth switches to receive the second signal at the control terminal, a fourteenth switch connected between the supply terminal of the fourth reference voltage and the connection point of the eleventh and twelfth switches to receive the first signal at the control terminal, fifteenth through seventeenth switches connected between the supply terminal of the fifth reference voltage and the first terminal to receive the complementary signal of the second signal, the complementary signal of the fourth signal and the sixth signal at the respective control terminals, eighteenth through twentieth switches connected between the supply terminal of the fifth reference voltage and the second terminal to receive the complementary signal of the first switch, the complementary signal of the third signal and the fifth signal at the respective control terminals, a twenty first switch connected between the supply terminal of the sixth reference voltage and the connection point of the fifteenth and sixteenth switches to receive the second signal at the control terminal, a twenty second switch connected between the supply terminal of the sixth reference voltage and the connection point of the eighteenth and nineteenth switches to receive the first signal at the control terminal, twenty third and twenty fourth switches connected between the supply terminal of the seventh reference voltage and the connection point of the sixteenth and seventeenth switches to receive the complementary signal of the second signal and the fourth signal at the respective control terminals, twenty fifth and twenty sixth switches connected between the supply terminal of the seventh reference voltage and the connection point of the nineteenth and twentieth switches to receive the complementary signal of the first signal and the third signal at the respective control terminals, a twenty seventh switch connected between the supply terminal of the eighth reference voltage and the connection point of the twenty third and twenty fourth switches to receive the second signal at the control terminal and a twenty eighth switch connected between the supply terminal of the eighth reference voltage and the connection point of the twenty fifth and twenty sixth switches to receive the first signal at the control terminal.

12. The circuit according to claim 8, wherein
the internal ratio is 1:2 or 2:1 and the sum of double of the input voltage of either the first terminal or the second terminal and the input voltage of the other terminal of the first and second terminals shows a relationship of being equal to three times of the output voltage,
the first through eighth reference voltages being respectively at the first, fourth, thirteenth, sixteenth, forty ninth, fifty second, sixty first and sixty fourth levels out of the first through sixty fourth voltage levels arranged at regular intervals so that voltages of a total of sixty four levels including the output voltage of the level due to the selection of the pair of the first, first reference voltages (A, A) through the output voltage of the level due to the selection of the pair of the eighth, eighth reference voltages (H, H) are output at the selection circuit.

13. The circuit according to claim 1, wherein
the amplifier circuit includes:
a differential amplifier circuit having the output end and the inverting input end connected to the output terminal,
a first switch having one of the opposite ends thereof connected to the first terminal,
a second switch connected between the other end of the first switch and the non-inverting input end of the differential amplifier circuit,
a third switch having one of the opposite ends thereof connected to the second terminal,
a fourth switch connected between the other end of the third switch and the non-inverting input end of the differential amplifier circuit,
a first capacitor connected between the connection point of the first and second switches and a first power source and
a second capacitor connected between the connection point of the third and fourth switches and the first power source.

14. The circuit according to claim 13, wherein
as the second and fourth switches are turned OFF and the first and third switches are turned ON for a period, the voltages supplied to the first and second terminals are stored respectively in the first and second capacitors by way of the first and third switches and
then, as the first and third switches are turned OFF and the second and fourth switches are turned ON for the next period, the voltage obtained by internally dividing the voltage difference between the first and second input terminals is output from the output terminal according to the defined value of the capacity ratio of the first and second capacitors.

15. The circuit according to claim 1, wherein
the amplifier circuit includes:
first and second differential pairs, each having one of the input pair connected to the first input terminal and the other of the input pair connected to the output terminal,
a third differential pair having one of the input pair connected to the second terminal and the other of the input pair connected to the output terminal,
first through third current sources for supplying electric currents respectively to the first through third differential pairs,
a load circuit commonly connected to the output pairs of the first through third differential pairs, and
an amplifier circuit connected between a common output pair for the first through third differential pairs and the output terminal.

16. The circuit according to claim 1, wherein
the amplifier circuit includes:
first and second differential pairs, each having one of the input pair connected to the first input terminal and the other of the input pair connected to the output terminal,
a third differential pair having one of the input pair connected to the second terminal and the other of the input pair connected to the output terminal,
a first electric current source commonly connected to the first through third differential pairs for supplying an electric current to the first through third differential pairs,
a load circuit commonly connected to the output pairs of the first through third differential pairs, and
an amplifier circuit connected between a common output pair for the first through third differential pairs and the output terminal.

17. The output circuit according to claim 1, wherein
the internal ratio is 1:2 or 2:1 and the sum of double of the input voltage of either the first terminal or the second terminal and the input voltage of the other terminal of the first and second terminals shows a relationship of being equal to three times of the output voltage,
the selection circuit receives as input the first through the m-th reference voltage value (wherein m=$2^K$, and K is a positive integer number equal to or more than 2) having mutually different respective voltage values,
the first through $2^K$ reference voltages shows respective levels of $\{1+a_1\times 4^{(K-1)}+a_2\times 4^{(K-2)}+a_3\times 4^{(K-3)}+ \ldots +a_K\times 4^{(K-K)}\}$, (where each of $a_1, a_2, a_3, \ldots, a_K$ is equal to 0 or 3),
out of the first through $4^{K-th}$ levels arranged at regular intervals, and
voltages of $4^K$ different voltage levels from the first level to the $4^{K-th}$ level are output from the output terminal according to the selection signal.

18. The output circuit according to claim 1, wherein
the m is equal to $2^K$ and K is a positive integer equal to or more than 2;
the selection circuit is adapted to select voltages from the first through $2^K$ reference voltages according to the total of 2K bit signals of the first through 2K-th signals of the selection signal and output the selected voltages the first and second terminals;
the output circuit, further comprising:
groups of circuit blocks including a group of the first column circuit blocks through a group of the K-th column circuit blocks, each of the circuit blocks having four input terminals and two output terminals and adapted to receive voltage signals from the four input terminals and output the voltage signals selected according to a 2-bit signal to the two output terminals;

the first column having $2^{(K-1)}$ circuit blocks, each of the $2^{(K-1)}$ circuit blocks having two input ends, each being formed by commonly connecting two of the four input terminals of the circuit block and adapted to receive as input two of the first through $2^K$-th reference voltages and output selectively two voltage signals according to the first and second signals;

the F-th column (where F being a positive integer from 2 to K) having $2^{(K-F)}$ circuit blocks, each of the $2^{(K-F)}$ ((K-F)-th power of 2) circuit blocks being adapted to receive as input the output voltage signals of two circuit blocks of the (F-1)-th column at its four input terminals and output selectively two voltage signals according to the (2F-1)-th and 2F-th signals; and the two output voltages of the circuit block group of the K-th column being output to the first and second terminals.

19. The circuit according to claim 18, wherein as for the four input terminals (to be referred to as "the first through fourth input terminals") and the two output terminals (to be referred to as "the first and second output terminals), the circuit blocks having:

two switches respectively inserted between the first and third input terminals and the first output terminal and adapted to be controlled for on and off according to one of the two bit signals and two switches respectively inserted between the second and fourth input terminals and the second output terminal and adapted to be controlled for on and off according to the other of the two bit signals.

20. A data driver for driving data lines according to an input data signal comprising:

an output circuit comprised of:

a selection circuit for receiving as input a plurality of m reference voltages (wherein m=$2^K$, and K is a positive integer number equal to or more than 2) reference voltages having mutually different respective voltage values and selecting a pair of two reference voltages supplied to first and second terminals out of square of m combinations of the m reference voltages according to an input selection signal; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal;

the data signal being adapted to be used for the selection signal to be input to the selection circuit.

21. A data driver to be used for a display apparatus comprising:

a tone voltage generating circuit for generating a plurality of voltage levels, a decoder circuit for outputting at least two voltages selected from the plurality of voltage levels according to video data and amplifier for receiving as input the voltages output from the decoder circuit and outputting a voltage corresponding to the video data from an output terminal, the data driver further comprising an output circuit comprised of:

a selection circuit for receiving as input a plurality of m reference voltages (wherein m=$2^K$, and K is a positive integer number equal to or more than 2) reference voltages having mutually different respective voltage values and selecting a pair of two reference voltages supplied to first and second terminals out of square of m combinations of the m reference voltages according to an input selection signal; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal;

the decoder being constituted by the selection circuit of the output circuit, the selection circuit being adapted to receive a plurality of voltage levels as the plurality of reference voltages from the tone voltage generating circuit and also the video data as selection signal, the amplifier for outputting a voltage corresponding to the video data from the output terminal being constituted by the amplifier circuit of the output circuit.

22. A display apparatus comprising:

a plurality of data lines extending in parallel with each other in a direction, a plurality of scanning lines extending in parallel with each other in a direction orthogonal relative to the direction, a plurality of pixel electrodes arranged respectively at the intersections of the plurality of data lines and the plurality of scanning lines to form of a matrix, a plurality of transistors arranged respectively at the plurality of pixel electrodes, each of the plurality of transistors having either its drain or its source connected to the corresponding pixel electrode, its source or its drain, whichever appropriate, connected to the corresponding data line and its gate connected to the corresponding scanning line, a gate driver for supplying a scanning signal to the plurality of scanning lines and a data driver for supplying tone signals corresponding to input data respectively to the plurality of data lines, the driver being a data driver to be used for a display apparatus comprised of:

a tone voltage generating circuit for generating a plurality of voltage levels, a decoder circuit for outputting at least two voltages selected from the plurality of voltage levels according to video data and amplifier for receiving as input the voltages output from the decoder circuit and outputting a voltage corresponding to the video data from an output terminal, the data driver further comprising an output circuit comprised of:

a selection circuit for receiving as input a plurality of m reference voltages (wherein m=$2^K$, and K is a positive integer number equal to or more than 2) reference voltages having mutually different respective voltage values and selecting a pair of two reference voltages supplied to first and second terminals out of square of m combinations of the m reference voltages according to an input selection signal; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal;

the decoder being constituted by the selection circuit of the output circuit, the selection circuit being adapted to receive a plurality of voltage levels as the plurality of reference voltages from the tone voltage generating circuit and also the video data as selection signal, the amplifier for outputting a voltage corresponding to the video data from the output terminal being constituted by the amplifier circuit of the output circuit.

23. A digital/analog conversion circuit comprising:
an output circuit comprised of:
a selection circuit for receiving as input a plurality of m reference voltages (wherein m=$2^K$, and K is a positive integer number equal to or more than 2) reference voltages having mutually different respective voltage values and selecting a pair of two reference voltages supplied to first and second terminals out of square of m combinations of the m reference voltages according to an input selection signal; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal; and adapted to receive as input the digital input signal input to it from a data input terminal as selection signal at the selection circuit and output an output voltage corresponding to the digital input signal input to it from the amplifier circuit.

24. A digital/analog conversion circuit comprising:
a selection circuit for receiving as input a plurality of m reference voltages (wherein m=$2^K$, and K is a positive integer number equal to or more than 2) reference voltages having mutually different respective voltage values, selecting same or different two reference voltages from the m reference voltages according to the 2K bit digital data signal input from a data input terminal, using it as selection signal, and supplying them respectively to first and second terminals; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal.

25. The digital/analog conversion circuit according to claim 24, wherein the square of m different reference voltages output from the output terminal have regular voltage intervals.

26. The circuit according to claim 24, wherein
the amplifier circuit includes:
a differential amplifier circuit having the output end and the inverting input end connected to the output terminal,
a first switch having one of the opposite ends thereof connected to the first terminal,
a second switch connected between the other end of the first switch and the non-inverting input end of the differential amplifier circuit,
a third switch having one of the opposite ends thereof connected to the second terminal,
a fourth switch connected between the other end of the third switch and the non-inverting input end of the differential amplifier circuit,
a first capacitor connected between the connection point of the first and second switches and a first power source and
a second capacitor connected between the connection point of the third and fourth switches and the first power source.

27. The circuit according to claim 26, wherein
as the second and fourth switches are turned OFF and the first and third switches are turned ON for a period, the voltages supplied to the first and second input terminals are stored respectively in the first and second capacitors by way of the first and third switches and
then, as the first and third switches are turned OFF and the second and fourth switches are turned ON for the next period, the voltage obtained by internally dividing the voltage difference between the first and second terminals is output from the output terminal according to the defined value of the capacity ratio of the first and second capacitors.

28. The circuit according to claim 24, wherein
the amplifier circuit includes:
first and second differential pairs, each having one of the input pair connected to the first input terminal and the other of the input pair connected to the output terminal,
a third differential pair having one of the input pair connected to the second terminal and the other of the input pair connected to the output terminal,
first through third current sources for supplying electric currents respectively to the first through third differential pairs,
a load circuit commonly connected to the output pairs of the first through third differential pairs, and
an amplifier circuit connected between a common output pair for the first through third differential pairs and the output terminal.

29. The digital/analog conversion circuit according to claim 24, wherein
the amplifier circuit includes:
first and second differential pairs, each having one of the input pair connected to the first terminal and the other of the input pair connected to the output terminal;
a third differential pair having one of the input pair connected to the second terminal and the other of the input pair connected to the output terminal;
a first current source connected commonly to the first through third differential pairs to supply electric current to the first through third differential pairs;

a load circuit commonly connected to the output pairs of the first through third differential pairs; and an amplifier circuit connected between a common output pair for the first through third differential pairs and the output terminal.

30. The digital/analog conversion circuit according to claim 24, wherein the internal ratio is 1:2 or 2:1 and the sum of double of the input voltage of either the first terminal or the second terminal and the input voltage of the other terminal of the first and second terminals shows a relationship of being equal to three times of the output voltage, the selection circuit receives as input first through m-th (=$2^K$, where K is a positive integer number equal to or more than 2) having mutually different respective voltage values, the first through $2^K$ reference voltages shows respective levels of $\{1+a_1 \times 4^{(K-1)} + a_2 \times 4^{(K-2)} + a_3 \times 4^{(K-3)} + \ldots + a_K \times 4^{(K-K)}\}$, (where each of $a_1, a_2, a_3, \ldots, a_K$ equal to 0 or 3), out of the first through $4^K$ levels arranged at regular intervals, and voltages of $4^K$ different voltage levels from the first level to the $4^K$-th level are output from the output terminal according to the input digital data signal of at least 2K bits.

31. The digital/analog conversion circuit according to claim 24, wherein:

the m is equal to $2^K$ (where K is a predetermined positive integer equal to or more than 2);

the selection circuit is adapted to select voltages from the first through $2^K$ reference voltages according to the total of 2K bit signals of the first through 2K-th signals of the selection signal and output the selected voltages to the first and second terminals;

the output circuit, further comprising:

groups of circuit blocks including a group of the first column circuit blocks through a group of the K-th column circuit blocks, each of the circuit blocks having four input terminals and two output terminals and adapted to receive voltage signals from the four input terminals and output the voltage signals selected according to a 2-bit signal to the two output terminals;

the first column having $2^{(K-1)}$ circuit blocks, each of the $2^{(K-1)}$ circuit blocks having two input ends, each being formed by commonly connecting two of the four input terminals of the circuit block and adapted to receive as input two of the first through $2^K$-th reference voltages and output selectively two voltage signals according to the first and second signals;

the F-th column (where F being a positive integer from 2 to K) having $2^{(K-F)}$ circuit blocks, each of the $2^{(K-F)}$ ((K-F)-th power of 2) circuit blocks being adapted to receive as input the output voltage signals of two circuit blocks of the (F-1)-th column at its four input terminals and output selectively two voltage signals according to the (2F-1)-th and 2F-th signals; and the two output voltages of the circuit block group of the K-th column being output to the first and second terminals.

32. The circuit according to claim 31, wherein as for the four input terminals (to be referred to as "the first through fourth input terminals") and the two output terminals (to be referred to as "the first and second output terminals"), the circuit blocks having:

two switches respectively inserted between the first and third input terminals and the first output terminal and adapted to be controlled for on and off according to one of the two bit signals and two switches respectively inserted between the second and fourth input terminals and the second output terminal and adapted to be controlled for on and off according to the other of the two bit signals.

33. A display apparatus comprising:

a data driver including a digital/analog conversion circuit comprised of:

a selection circuit for receiving as input a plurality of m reference voltages (wherein m=$2^K$, and K is a positive integer number equal to or more than 2) reference voltages having mutually different respective voltage values, selecting same or different two reference voltages from the m reference voltages according to the 2K bit digital data signal input from a data input terminal, using it as selection signal, and supplying them respectively to first and second terminals; and an amplifier circuit for receiving as input the voltages supplied to the first and second terminals and outputting the voltage obtained by internally dividing the difference of the voltages of the first and second terminals to a predetermined internal ratio from an output terminal, wherein any one of square of m different voltages corresponding to the square of m different combinations of the m reference voltages is output from the output terminal; and the m is equal to $2^K$ (where K is a predetermined positive integer equal to or more than 2);

the selection circuit is adapted to select voltages from the first through $2^K$ reference voltages according to the total of 2K bit signals of the first through 2K-th signals of the selection signal and output the selected voltages to the first and second terminals;

the output circuit, further comprising:

groups of circuit blocks including a group of the first column circuit blocks through a group of the K-th column circuit blocks, each of the circuit blocks having four input terminals and two output terminals and adapted to receive voltage signals from the four input terminals and output the voltage signals selected according to a 2-bit signal to the two output terminals;

the first column having $2^{(K-1)}$ circuit blocks, each of the $2^{(K-1)}$ circuit blocks having two input ends, each being formed by commonly connecting two of the four input terminals of the circuit block and adapted to receive as input two of the first through $2^K$-th reference voltages and output selectively two voltage signals according to the first and second signals;

the F-th column (where F being a positive integer from 2 to K) having $2^{(K-F)}$ circuit blocks, each of the $2^{(K-F)}$ ((K-F)-th power of 2) circuit blocks being adapted to receive as input the output voltage signals of two circuit blocks of the (F-1)-th column at its four input terminals and output selectively two voltage signals according to the (2F-1)-th and 2F-th signals; and the two output voltages of the circuit block group of the K-th column being output to the first and second terminals; and a display panel,
the data lines of the display panel being driven according to the output signal of the data driver.

34. An output circuit having an output voltage range that is divided into a plurality of sections that do not overlap, comprising:
a selection circuit that selects a first and a second voltages from a plurality of reference voltages based on a selection signal, the plurality of reference voltages and the selection signal being input corresponding to each of the sections, and outputs the first and the second voltages; and
an amplifier circuit that outputs a voltage obtained by internally dividing the first and the second voltages to a predetermined internal ratio from an output terminal, the first and the second voltages being input, wherein
at least one section of the plurality of sections has square of m voltage levels which have mutually different voltage values including m reference voltages (wherein $m=2^K$, and K is a positive integer number equal to or more than 2), and
each of the square of m voltage levels corresponds to square of m combinations of the first and the second voltages where the first and the second voltages are selected from the m reference voltages input to the selection circuit, and is output from the output terminal by the amplifier circuit.

35. The output circuit according to claim 34, wherein
each of the plurality of sections has a plurality of linear voltage levels, and
voltage intervals of the plurality of linear voltage levels in each section is different in a first section and a second section among the plurality of sections.

36. A digital/analog conversion circuit having an output voltage range that is divided into a plurality of sections that do not overlap, comprising:
a selection circuit that selects a first and a second voltages from a plurality of reference voltages based on a digital data signal, the plurality of reference voltages and the digital data signal being input corresponding to each of the sections, and outputs the first and the second voltages; and
an amplifier circuit that outputs a voltage obtained by internally dividing the first and the second voltages to a predetermined internal ratio from an output terminal, the first and the second voltages being input, wherein
at least one section of the plurality of sections has square of m voltage levels which have mutually different voltage values including m reference voltages (wherein $m=2^K$, and K is a positive integer of 2 or higher), and
each of the square of m voltage levels corresponds to square of m combinations of the first and the second voltages where the first and the second voltages are selected from the m reference voltages input to the selection circuit, and is output from the output terminal by the amplifier circuit.

37. The digital/analog conversion circuit according to claim 36, wherein
each of the plurality of sections has a plurality of linear voltage levels, and
voltage intervals of the plurality of linear voltage levels in each section is different in a first section and a second section among the plurality of sections.

38. A digital/analog conversion circuit, comprising:
a circuit for generating (m×S) reference voltages (wherein $m=2^K$ and K is a positive integer number equal to or more than 2) and S being predetermined positive integers) having mutually different voltage values;
an output terminal;
at least a decoder block for receiving as input the (m×S) reference voltages and a digital data signal having a plurality of bits and outputting a voltage selected from the (m×S) reference voltages based on the values of first, second and third bit groups of a digital data signal including overlapping, the bit groups forming respective predetermined bit fields, to the first and second terminals; and
an amplifier circuit for receiving as input the voltage supplied to the first and second terminals from the decoder block and outputting the voltage obtained by internally dividing the voltage of the first and second terminals to a predetermined internal ratio from the output terminal;
the decoder block having circuit blocks arranged at three stages;
the first stage circuit blocks including S circuit blocks, each being adapted to receive as input m-th reference voltage out of the (m×S) input reference voltages and output selectively two voltages from the m reference voltages according to the value of the first bit, allowing duplication;
the second stage circuit including a circuit block adapted to receive as input either of the two voltages selected by each of the S first stage circuit blocks and output selectively from the S input voltages according to the value of the second bit group and a circuit block adapted to receive as input the other of the two voltages selected by each of the S first stage circuit blocks and output selectively one of the S input voltages according to the value of the second bit group; and
the third stage circuit blocks including a circuit block adapted to receive as input the voltages output selectively by the two second stage blocks and control the input two voltages so as to supply them to the first and second terminals or block the supply thereof;
a voltage of any of the ($m^2$×S) mutually different voltage levels being output from the output terminal according to the signal values of the first through third bit groups.

39. The circuit according to claim 38, wherein
the third stage circuit block is omitted and the voltages selectively output by the two second stage circuit blocks may be supplied to the first and second terminals when each and every bit of the third bit group is contained in the first bit group and/or the second bit group.

40. A digital/analog conversion circuit comprising:
first through third decoder blocks, each decoder block receiving as input the (m×S) reference voltages and a digital data signal having a plurality of bits and outputting a voltage selected from the (m×S) reference voltages based on the values of first, second and third bit groups of a digital data signal including overlapping, the bit groups forming respective predetermined bit fields, to the first and second terminals;
each decoder block having circuit blocks arranged at three stages;
the first stage circuit blocks including S circuit blocks, each being adapted to receive as input m-th reference voltage out of the (m×S) input reference voltages and output selectively two voltages from the m reference voltages according to the value of the first bit, allowing duplication;

the second stage circuit including a circuit block adapted to receive as input either of the two voltages selected by each of the S first stage circuit blocks and output selectively from the S input voltages according to the value of the second bit group and a circuit block adapted to receive as input the other of the two voltages selected by each of the S first stage circuit blocks and output selectively one of the S input voltages according to the value of the second bit group; and the third stage circuit blocks including a circuit block adapted to receive as input the voltages output selectively by the two second stage blocks and control the input two voltages so as to supply them to the first and second terminals or block the supply thereof;

the digital data signal being an 8-bit digital data signal (D7, D6, D5, D4, D3, D2, D1, D0), the first and second decoder blocks being adapted to receive as input sixteen reference voltages, the m and the S being respectively equal to 2 and 8, the values being common to the first and second decoder blocks, the first, second and third bit groups being respectively (D1, D0), (D4, D3, D2) and (D7, D6, D5) out of the 8-bit digital data signal (D7, D6, D5, D4, D3, D2, D1, D0), the third decoder block being adapted to receive as input forty eight reference voltages, the m and the S being respectively equal to 4 and 12, the first, second and third bit groups being respectively (D3, D2, D1, D0), (D7, D6, D5, D4) and (D7, D6, D 5) out of the 8-bit digital data signal (D7, D6, D5, D4, D3, D2, D1, D0), one of the two outputs of each of the first through third decoder blocks being commonly connected to the first terminal, the other of the two outputs of the first through third decoder blocks being commonly connected to the second terminal, the digital/analog conversion circuit being adapted to output a voltage of one of the 256 mutually different voltage levels from the output terminal according to the 8-bit digital data signal.

41. The circuit according to claim 40, wherein the third stage circuit block of the third decoder block is omitted and the outputs of the two second stage circuit blocks are connected respectively to the first and second terminals.

42. A digital/analog conversion circuit comprising:

a circuit for generating (m×S) reference voltages (wherein m=$2^K$, and K is a positive integer number equal to or more than 2) and S being predetermined positive integers) having mutually different voltage values;

an output terminal;

at least a decoder block for receiving as input the (m×S) reference voltages and a digital data signal having a plurality of bits and outputting a voltage selected from the (m×S) reference voltages based on the values of first, second and third bit groups of a digital data signal including overlapping, the bit groups forming respective predetermined bit fields, to the first and second terminals; and an amplifier circuit for receiving as input the voltage supplied to the first and second terminals from the decoder block and outputting the voltage obtained by internally dividing the voltage of the first and second terminals to a predetermined internal ratio from the output terminal;

the decoder block having circuit blocks arranged at three stages;

the first stage circuit blocks including m circuit blocks, each being adapted to receive as input S-th reference voltage out of the (m×S) input reference voltages and outputting selectively one voltage from the S reference voltages according to the value of the first bit;

the second stage circuit including a circuit block adapted to receive as input the m voltages selected by the m first stage circuit blocks and outputting selectively two input voltages from the m input voltages according to the value of the second bit group; and the third stage circuit blocks including a circuit block adapted to receive as input the two voltages output selectively by the second stage circuit block and control the input two voltages so as to supply them to the first and second terminals or block the supply thereof;

a voltage of any of the ($m^2$×S) mutually different voltage levels being output from the output terminal according to the signal values of the first through third bit groups.

43. The circuit according to claim 42, further comprising:

decoder blocks with the value of the m common to them all or different from each other, the third stage circuit blocks being omitted so as to supply the voltages selectively output by the second stage circuit blocks to the first and second terminals when each of the bits of the third bit group is contained in the first bit group and/or the second bit group so that the all the bits of the third bit group are contained in the first bit group and the second bit group in the decoder block where the value of the m is maximal.

44. The digital/analog conversion circuit according to claim 42, wherein the internal ratio is 1:2 or 2:1.

45. A display apparatus comprising:

a data driver including a digital/analog conversion circuit according to claim 42 and a display panel, the data lines of the display panel being driven according to the output signal of the data driver.

46. A digital/analog conversion circuit comprising:

first through third decoder blocks, each decoder block receiving as input the (m×S) reference voltages and a digital data signal having a plurality of bits and outputting a voltage selected from the (m×S) reference voltages based on the values of first, second and third bit groups of a digital data signal including overlapping, the bit groups forming respective predetermined bit fields, to the first and second terminals;

each decoder block having circuit blocks arranged at three stages;

the first stage circuit blocks including S circuit blocks, each being adapted to receive as input m-th reference voltage out of the (m×S) input reference voltages and output selectively two voltages from the m reference voltages according to the value of the first bit, allowing duplication;

the second stage circuit including a circuit block adapted to receive as input either of the two voltages selected by each of the S first stage circuit blocks and output selectively from the S input voltages according to the value of the second bit group and a circuit block adapted to receive as input the other of the two voltages selected by each of the S first stage circuit blocks and output selectively one of the S input voltages according to the value of the second bit group; and the third stage circuit blocks including a circuit block adapted to receive as input the voltages output selectively by the two second stage blocks and control the input two voltages so as to supply them to the first and second terminals or block the supply thereof;

the digital data signal being an 8-bit digital data signal (D7, D6, D5, D4, D3, D2, D1, D0), the first and second decoder blocks being adapted to receive as input sixteen reference voltages, the m and the S being respectively equal to 2 and 8, the values being common to the first and second decoder blocks, the first, second and third bit groups being respectively (D1, D0), (D4, D3, D2) and (D7, D6, D5) out of the 8-bit digital data signal (D7, D6, D5, D4, D3, D2, D1, D0), the third decoder block being adapted to receive as input forty eight reference voltages, the m and the S being respectively equal to 4 and 12, the first, second and third bit groups being respectively (D3, D2, D1, D0), (D7, D6, D5, D4) and (D7, D6, D5) out of the 8-bit digital data signal (D7, D6, D5, D4, D3, D2, D1, D0), one of the two outputs of each of the first through third decoder blocks being commonly connected to the first terminal, the other of the two outputs of the first through third decoder blocks being commonly connected to the second terminal, the digital/analog conversion circuit being adapted to output a voltage of one of the 256 mutually different voltage levels from the output terminal according to the 8-bit digital data signal.

47. The circuit according to claim 46, wherein
the third stage circuit block of the third decoder block is omitted and the voltages selectively output by the two second stage circuit blocks are connected respectively to the first and second terminals.

48. An output circuit comprising:
a plurality of terminals for receiving as input (m×S) reference voltages (wherein m=$2^K$, and K is a positive integer number equal to or more than 2) and S being predetermined positive integers) having mutually different voltage values;

an output terminal;

at least one decoder block for receiving as input the (m×S) reference voltages and a digital data signal of a plurality of bits and outputting to a first and second terminal the voltages selected from the (m×S) reference voltages according to values of first, second and third bit groups allocated from the digital data signal including overlapping, each forming a predetermined bit field;

an amplifier circuit for receiving as input the voltage supplied to the first and second terminals from the decoder block and outputting the voltage obtained by internally dividing the difference of the voltages of the first and second terminals to a predetermined internal ratio from the output terminal;

the decoder block having circuit blocks arranged at three stages;

the first stage circuit blocks including S circuit blocks, each being adapted to receive as input m-th reference voltage out of the (m×S) input reference voltages and output selectively two voltages from the m reference voltages according to the value of the first bit, allowing duplication;

the second stage circuit including a circuit block adapted to receive as input either of the two voltages selected by each of the S first stage circuit blocks and output selectively one of the S input voltages according to the value of the second bit group; and the third stage circuit blocks including a circuit block adapted to receive as input the voltages output selectively by the two second stage blocks and control the input two voltages so as to supply them to the first and second terminals or block the supply thereof;

a voltage of any of the (m²×S) mutually different voltage levels being output from the output terminal according to the signal values of the first through third bit groups.

49. The circuit according to claim 48, wherein
the third stage circuit block is omitted and the voltages selectively output by the two second stage circuit blocks may be supplied to the first and second terminals when each and every bit of the third bit group is contained in the first bit group and/or the second bit group.

50. An output circuit comprising:
a plurality of terminals for receiving as input (m×S) reference voltages (wherein m=$2^K$, and K is a positive integer number equal to or more than 2 and S being predetermined positive integers) having mutually different voltage values;

an output terminal;

at least one decoder block for receiving as input the (m×S) reference voltages and a digital data signal having a plurality of bits and outputting to a first and second terminal the voltages selected from the (m×S) reference voltages according to values of first, second and third bit groups allocated from the digital data signal including overlapping, the bit groups forming respective predetermined bit fields, to the first and second terminals; and an amplifier circuit for receiving as input the voltages supplies to the first and second terminals from the decoder block and outputting the voltage obtained by internally dividing the difference of the voltages of the first and second terminals to a predetermined internal ratio from the output terminal;

the decoder block having circuit blocks arranged at three stages;

the first stage circuit blocks including m circuit blocks, each being adapted to receive as input S-th reference voltage out of the (m×S) input reference voltages and output selectively a voltage from the S reference voltages according to the value of the first bit;

the second stage circuit blocks including a circuit block adapted to receive as input the m voltages selected by the m first stage circuit blocks and output selectively two voltages from the m input voltages according to the value of the second bit group;

the third stage circuit blocks including a circuit block adapted to receive as input the two voltages output selectively by the second stage block and control the input two voltages so as to supply them to the first and second terminals or block the supply thereof; and a voltage of any of the (m²×S) mutually different voltage levels being output from the output terminal according to the signal value of the first through third bit groups.

51. The circuit according to claim 50, further comprising:
decoder blocks with the value of the m common to them all or different from each other, the third stage circuit blocks being omitted so as to supply the voltages selectively output by the second stage circuit blocks to the first and second terminals when each of the bits of the third bit group is contained in the first bit group and/or the second bit group so that the all the bits of the third bit group are contained in the first bit group and the second bit group in the decoder block where the value of the m is maximal.

52. The circuit according to claim 50, wherein the internal ratio is 1:2 or 2:1.

53. A data driver for driving data lines according to an input data signal comprising:
- a tone voltage generating circuit for generating a plurality of reference voltages having mutually different voltage values; and
- an output circuit comprised of:
  - a plurality of terminals for receiving as input (m×S) reference voltages (wherein m=$2^K$, and K is a positive integer number equal to or more than 2 and S being predetermined positive integers) having mutually different voltage values;
  - an output terminal;
  - at least one decoder block for receiving as input the (m×S) reference voltages and a digital data signal having a plurality of bits and outputting to a first and second terminal the voltages selected from the (m×S) reference voltages according to values of first, second and third bit groups allocated from the digital data signal including overlapping, the bit groups forming respective predetermined bit fields, to the first and second terminals; and
  - an amplifier circuit for receiving as input the voltages supplies to the first and second terminals from the decoder block and outputting the voltage obtained by internally dividing the difference of the voltages of the first and second terminals to a predetermined internal ratio from the output terminal;
  - the decoder block having circuit blocks arranged at three stages;
  - the first stage circuit blocks including m circuit blocks, each being adapted to receive as input S-th reference voltage out of the (m×S) input reference voltages and output selectively a voltage from the S reference voltages according to the value of the first bit;
  - the second stage circuit blocks including a circuit block adapted to receive as input the m voltages selected by the m first stage circuit blocks and output selectively two voltages from the m input voltages according to the value of the second bit group;
  - the third stage circuit blocks including a circuit block adapted to receive as input the two voltages output selectively by the second stage block and control the input two voltages so as to supply them to the first and second terminals or block the supply thereof; and
  - a voltage of any of the ($m^2$×S) mutually different voltage levels being output from the output terminal according to the signal value of the first through third bit groups;
- the data signal being adapted to be used for the digital data signal to be input to the selection circuit.

54. A display apparatus comprising:
- a plurality of data lines extending in parallel with each other in a direction,
- a plurality of scanning lines extending in parallel with each other in a direction orthogonal relative to the direction,
- a plurality of pixel electrodes arranged respectively at the intersections of the plurality of data lines and the plurality of scanning lines to form of a matrix,
- a plurality of transistors arranged respectively at the plurality of pixel electrodes, each of the plurality of transistors having either its drain or its source connected to the corresponding pixel electrode, its source or its drain, whichever appropriate, connected to the corresponding data line and its gate connected to the corresponding scanning line,
- a gate driver for supplying a scanning signal to the plurality of scanning lines and
- a data driver for supplying tone signals corresponding to input data respectively to the plurality of data lines,
- the data driver being a data driver comprised of:
  - a tone voltage generating circuit for generating a plurality of reference voltages having mutually different voltage values; and
  - an output circuit comprised of:
    - a plurality of terminals for receiving as input (m×S) reference voltages (wherein m=$2^K$, and K is a positive integer number equal to or more than 2 and S being predetermined positive integers) having mutually different voltage values;
    - an output terminal;
    - at least one decoder block for receiving as input the (m×S) reference voltages and a digital data signal having a plurality of bits and outputting to a first and second terminal the voltages selected from the (m×S) reference voltages according to values of first, second and third bit groups allocated from the digital data signal including overlapping, the bit groups forming respective predetermined bit fields, to the first and second terminals; and
    - an amplifier circuit for receiving as input the voltages supplies to the first and second terminals from the decoder block and outputting the voltage obtained by internally dividing the difference of the voltages of the first and second terminals to a predetermined internal ratio from the output terminal;
    - the decoder block having circuit blocks arranged at three stages;
    - the first stage circuit blocks including m circuit blocks, each being adapted to receive as input S-th reference voltage out of the (m×S) input reference voltages and output selectively a voltage from the S reference voltages according to the value of the first bit;
    - the second stage circuit blocks including a circuit block adapted to receive as input the m voltages selected by the m first stage circuit blocks and output selectively two voltages from the m input voltages according to the value of the second bit group;
    - the third stage circuit blocks including a circuit block adapted to receive as input the two voltages output selectively by the second stage block and control the input two voltages so as to supply them to the first and second terminals or block the supply thereof;
    - a voltage of any of the ($m^2$×S) mutually different voltage levels being output from the output terminal according to the signal value of the first through third bit groups; and
  - the data signal being adapted to be used for the digital data signal to be input to the selection circuit.

55. A digital/analog conversion circuit comprising:
- a decoder circuit for receiving as input a plurality of (m) reference voltages having mutually different respective voltage values, selecting two same or different reference voltages from the m reference voltages, using the digital data signal input to it from a data input terminal as selection signal and sequentially outputting them; and an amplifier circuit for sequentially receiving as input the two voltages selected by the decoder circuit at a single terminal and outputting the voltage obtained by internally dividing the difference between the two voltages to a predetermined internal ratio from an output terminal, wherein the amplifier circuit includes a capacity element and a switch and the circuit is adapted to output the first and second voltages supplied sequentially from the single terminal by switching the connection of the capacity element and the switch on the basis of computations.

56. The circuit according to claim 55, wherein
voltages of square of m mutually different voltage levels are output from the output terminal corresponding to the square of m combinations of the m reference voltages.

57. The circuit according to claim 55, wherein
a plurality of voltages arranged at regular voltage intervals are output from the output terminal.

58. The circuit according to claim 55, further comprising:
a data input control circuit for controlling the circuit so as to output the odd-numbered bits or the even-numbered bits and subsequently output the even-numbered bits or the odd-numbered bits, whichever appropriate, out of the input digital data signal of a plurality of bits according to a control signal,
the output of the data input control circuit being supplied to the decoder circuit.

59. The circuit according to claim 58, wherein
the decoder circuit having a group of switches connected between the single terminal and at least one of the supply terminals of the reference voltages and controlled for on and off according to the output of the data input control circuit.

60. The circuit according to claim 55, wherein
the amplifier circuit includes:
a differential amplifier having the output terminal connected to the inverting input terminal for feedback;
a first switch connected between the single terminal and the non-inverting input terminal of the differential amplifier;
a second switch having one of the opposite ends thereof connected to the single terminal;
a third switch connected between the other end of the second switch and the non-inverting input terminal,
a first capacitor connected between the first switch and the connection point of the third switch and the non-inverting input terminal and the reference voltage terminal and
a second capacitor connected to the connection point of the second switch and the third switch and the reference voltage terminal.

61. The circuit according to claim 55, wherein
the amplifier circuit includes:
a plurality of differential pairs having the output pairs thereof commonly connected to a load circuit and adapted to be driven by corresponding respective electric current sources and
an amplification stage having the input end thereof connected to at least one of the common connection points of the load circuit and the output pairs of the plurality of differential pairs and the output end thereof connected to the output terminal, the circuit further comprising:
a switch having one of its opposite ends thereof to the single terminal and
a capacitor connected between the other end of the switch and the reference voltage terminal,
one of the input pair of each of a predetermined number of differential pairs of the plurality of differential pairs being connected to the single terminal, the other end of the input pair being commonly connected to the other end of the switch,
the other of the input pair of each of the plurality of differential pairs being commonly connected to the output terminal.

62. A display apparatus comprising:
a data driver including a digital/analog conversion circuit according to claim 55 and
a display panel,
the data lines of the display panel being driven according to the output signal of the data driver.

63. The circuit according to claim 55, wherein
the internal ratio is 1:2 or 2:1 and the sum of double of the voltage of either the first terminal or the second terminal and the voltage of the other terminal of the first and second terminals shows a relationship of being equal to three times of the output voltage and
the selection circuit receives as input first through m-th ($=2^K$, where K is a predetermined positive integer) reference voltages having mutually different respective voltage values,
the first through $2^K$ reference voltages showing respective levels of
$\{1+a\_1\times 4^{(K-1)}+a\_2\times 4^{(K-2)}+a\_3\times 4^{(K-3)}+ \ldots +a\_K\times 4^{(K-K)}\}$,
(where each of $a\_1, a\_2, a\_3, \ldots, a\_K$ equal to 0 or 3), out of the first through $4^K$-th levels arranged at regular intervals
so that voltages of $4^K$ different voltage levels from the first level to the $4^K$-th level are output according to the selection signal.

64. A data driver for driving data lines according to an input data signal comprising:
a digital/analog conversion circuit comprised of:
a decoder circuit for receiving as input a plurality of (m) reference voltages having mutually different respective voltage values, selecting two same or different reference voltages from the m reference voltages, using the digital data signal input to it from a data input terminal as selection signal and sequentially outputting them; and
an amplifier circuit for sequentially receiving as input the two voltages selected by the decoder circuit at a single terminal and outputting the voltage obtained by internally dividing the difference between the two voltages to a predetermined internal ratio from an output terminal, wherein the amplifier circuit includes a capacity element and a switch and
the circuit is adapted to output the first and second voltages supplied sequentially from the single terminal by switching the connection of the capacity element and the switch on the basis of computations.

65. A display apparatus comprising:
a plurality of data lines extending in parallel with each other in a direction,
a plurality of scanning lines extending in parallel with each other in a direction orthogonal relative to the direction, a plurality of pixel electrodes arranged respectively at the intersections of the plurality of data lines and the plurality of scanning lines to form of a matrix, a plurality of transistors arranged respectively at the plurality of pixel electrodes, each of the plurality of transistors having either its drain or its source connected to the corresponding pixel electrode, its source or its drain, whichever appropriate, connected to the corresponding data line and its gate connected to the corresponding scanning line, a gate driver for supplying a scanning signal to the plurality of scanning lines and a data driver for supplying tone signals corresponding to input data respectively to the plurality of data lines, the data driver being a data driver comprised of:
- a digital/analog conversion circuit comprised of:
  - a decoder circuit for receiving as input a plurality of (m) reference voltages having mutually different respective voltage values, selecting two same or different reference voltages from the m reference voltages, using the digital data signal input to it from a data input terminal as selection signal and sequentially outputting them; and
  - an amplifier circuit for sequentially receiving as input the two voltages selected by the decoder circuit at a single terminal and outputting the voltage obtained by internally dividing the difference between the two voltages to a predetermined internal ratio from an output terminal, wherein the amplifier circuit includes a capacity element and a switch and
  - the circuit is adapted to output the first and second voltages supplied sequentially from the single terminal by switching the connection of the capacity element and the switch on the basis of computations.

66. The apparatus according to claim 65, further comprising:
- a data conversion table for making each n-bit video data correspond to an m-bit (n<m) video data for each of RGB (red, green and blue) and
- a data conversion circuit for receiving as input the n-bit video data, converting it to an m-bit video data by referring to the data conversion table and outputting it to the data driver.

* * * * *